United States Patent [19]
Irie et al.

[11] Patent Number: 6,118,516
[45] Date of Patent: *Sep. 12, 2000

[54] PROJECTION EXPOSURE APPARATUS HAVING A FILTER ARRANGED IN ITS PROJECTION OPTICAL SYSTEM AND METHOD FOR PROTECTING CIRCUIT PATTERNS

[75] Inventors: Nobuyuki Irie; Nobutaka Magome, both of Kawasaki; Yasuaki Tanaka, Chigasaki; Naomasa Shiraishi, Kawasaki; Shigeru Hirukawa, Kashiwa, all of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/826,063

[22] Filed: Mar. 24, 1997

Related U.S. Application Data

[63] Continuation of application No. 08/397,506, Mar. 1, 1995, abandoned.

[30] Foreign Application Priority Data

| Mar. 2, 1994 | [JP] | Japan | 6-032224 |
| Apr. 22, 1994 | [JP] | Japan | 6-084476 |
| May 26, 1994 | [JP] | Japan | 6-112431 |
| Jun. 15, 1994 | [JP] | Japan | 6-132896 |

[51] Int. Cl.⁷ .................................................. G03B 27/42
[52] U.S. Cl. ........................................... 355/53; 356/401
[58] Field of Search ................... 355/53, 55, 59, 355/61, 43, 45; 356/400, 401

[56] References Cited

U.S. PATENT DOCUMENTS

| 4,629,313 | 12/1986 | Tanimoto . | |
| 4,704,027 | 11/1987 | Phillips | 355/43 |
| 4,739,373 | 4/1988 | Nishi et al. | 355/53 |
| 4,780,616 | 10/1988 | Nishi et al. . | |
| 4,794,426 | 12/1988 | Nishi | 355/43 |
| 4,865,455 | 9/1989 | Kohno et al. | 356/400 |
| 4,880,308 | 11/1989 | Shirasu | 356/401 |
| 4,897,553 | 1/1990 | Nishi | 356/401 X |
| 4,906,081 | 3/1990 | Yasuda | 350/439 |
| 5,048,967 | 9/1991 | Suzuki et al. | 356/401 |
| 5,117,255 | 5/1992 | Shiraishi et al. | 355/53 |
| 5,144,363 | 9/1992 | Wittekoek et al. | 355/53 |
| 5,184,196 | 2/1993 | Nakagawa et al. | 356/401 |
| 5,243,195 | 9/1993 | Nishi . | |
| 5,272,501 | 12/1993 | Nishi et al. | 355/53 |
| 5,323,207 | 5/1994 | Ina | 355/53 |
| 5,323,208 | 6/1994 | Fukuda et al. | 355/53 |
| 5,329,333 | 7/1994 | Noguchi et al. | 355/53 |
| 5,348,837 | 9/1994 | Fukuda et al. | 430/269 |
| 5,381,210 | 1/1995 | Hagiwara | 355/53 |
| 5,396,311 | 3/1995 | Fukushima et al. | 355/53 X |
| 5,418,598 | 5/1995 | Fukuda et al. | 355/66 |
| 5,552,856 | 9/1996 | Shiraishi et al. | 355/53 |

*Primary Examiner*—Fred L. Braun
*Attorney, Agent, or Firm*—Oliff & Berridge, PLC

[57] ABSTRACT

A projection exposure apparatus which can perform superior observation or projection of a selected mark when the mark is observed or projected through a projection optical system in which a pupil filter is set. The projection exposure apparatus which projects a pattern on a mask through a projection optical system onto a photosensitive substrate held on a substrate stage movable in a plane perpendicular to the optical axis of the projection optical system and which has a pupil filter (optical correction plate) placed on or near the pupil plane of the projection optical system, a reference mark formed on the substrate stage in a scale factor according to the shape of the pupil filter, illuminating means for illuminating the reference mark with illumination light, and light-receiving means for receiving the illumination light having emerged from the reference mark and thereafter having passed the projection optical system.

35 Claims, 27 Drawing Sheets

PROJECTION EXPOSURE APPARATUS HAVING A FILTER ARRANGED IN ITS PROJECTION OPTICAL SYSTEM AND METHOD FOR PROTECTING CIRCUIT PATTERNS

This is a continuation of application Ser. No. 08/397,506, filed Mar. 1, 1995, now abandoned.

BACKGROUND OF THE INVENTION

1. Field of the Invention

The present invention relates to a projection exposure apparatus used, for example, in fabricating semiconductor devices or liquid crystal display devices, etc. by a photolithography process, and a method for producing circuit patterns using such a projection exposure apparatus. More particularly, the invention is suitably applicable to the projection exposure apparatus provided with a function, for example, to perform measurement of reticle alignment, registration accuracy, or imaging characteristics of a projection optical system therethrough.

2. Related Background Art

The photolithography process for fabricating semiconductor devices or liquid crystal display devices, etc. uses the projection exposure apparatus for performing exposure of images of patterns on a photomask or reticle (hereinafter, "reticle" is used as an example) through the projection optical system onto a wafer (or glass plate, etc.) coated with a photoresist. In order to perform accurate positioning (reticle alignment) of the reticle relative to a wafer stage on which the wafer is mounted, prior to exposure, such projection exposure apparatus employ an alignment system for simultaneously observing an alignment mark formed on the reticle and a reference mark formed on the wafer stage through the projection optical system.

A reference mark FM1 consisting of four linear patterns shown in FIG. 1A is an example of the reference mark on the wafer stage, used for reticle alignment, and a cross alignment mark RM1 shown in FIG. 1B an example of the mark on the reticle, corresponding to it. The reference mark FM1 is used as reference for positions in mutually orthogonal X direction and Y direction. In this case, for example, when the reference mark is observed through the projection optical system from above the reticle by a two-dimensional image pickup device, the alignment mark RM1 and a reference mark image FM1P are observed as overlapping with each other in an observation field on the reticle, as shown in FIG. 2A. Then, for example reading out an image signal along a scanning line on the image pickup device, corresponding to a scanning line SL parallel to the X direction in FIG. 2A, the signal shown in FIG. 2B is obtained and from this signal, an amount of positional deviation in the X direction, of the alignment mark RM1 is obtained relative to the reference mark image FM1P. Similarly, an amount of positional deviation in the Y direction is also obtained. The reticle alignment is performed by driving the amount of each positional deviation of the alignment mark RM1 thus obtained into a predetermined value.

Meanwhile, attempt has been made to improve imaging performance of the projection optical system in exposure of predetermined patterns by setting an optical filter (hereinafter referred to as a "pupil filter") with predetermined characteristics near the pupil plane of the projection optical system.

SUMMARY OF THE INVENTION

An object of the present invention is to provide projection exposure apparatus which can perform superior observation or projection of a selected mark when the mark is observed or projected through a projection optical system in which a pupil filter is set.

A first projection exposure apparatus according to the present invention is a projection exposure apparatus, for example as shown in FIG. 3, which projects a pattern on a mask through a projection optical system 3 onto a photosensitive substrate 5 held on a substrate stage 13 movable in a plane perpendicular to the optical axis of the projection optical system 3 and which has a pupil filter (optical correction plate) 4 placed on or near the pupil plane of the projection optical system, a reference mark 22 formed on the substrate stage 13 in a scale factor according to the shape of the pupil filter, illuminating means 23–25, 26A, 27, 3 for illuminating the reference mark 22 with illumination light, and light-receiving means 27, 26A, 26B, 29X, 29Y for receiving the illumination light having emerged from the reference mark 22 and thereafter having passed the projection optical system 3.

Next, a second projection exposure apparatus according to the present invention is a projection exposure apparatus, for example as shown in FIG. 4, which projects a pattern on a mask 46 through a projection optical system 3 onto a photosensitive substrate 5 held on a substrate stage 13 movable in a plane perpendicular to the optical axis of the projection optical system 3 and which has a pupil filter 4 placed on or near the pupil plane of the projection optical system 3, illuminating means 10–12 for illuminating a reference mark $M_{ij}$ formed on the mask in a scale factor according to the shape of the pupil filter 4 with illumination light, and light-receiving means 48, 49 for receiving the illumination light having emerged from the reference mark $M_{ij}$ and thereafter having passed the projection optical system 3.

In these cases, where the reference mark 22 or $M_{ij}$ is a mark for indicating a position in a predetermined measurement direction, to be desired is to make uniform a distribution of an integral value along a non-measurement direction perpendicular to the predetermined measurement direction, of bright portions (reflective portions in the case of the reflection type or optically transparent portions in the case of the transmission type) in the reference mark.

A third projection exposure apparatus according to the present invention is a projection exposure apparatus, for example as shown in FIG. 19, which is provided with a projection optical system 3 for projecting a pattern on a mask 1 onto a photosensitive substrate 5 under predetermined imaging characteristics, and a mark detecting system for detecting a reference mark 22 placed on the object plane side or on the image plane side of the projection optical system and which has an optical correction plate 4 placed on a Fourier transform plane FP formed in an imaging optical path of the projection optical system 3, or on a plane in the vicinity thereof, wherein the mark detecting system has an illumination system 123–126 for projecting illumination light onto the reference mark 22 so that at least the zeroth-order light out of light having emerged from the reference mark 22 and entering the projection optical system 3 passes a specific region having a constant transmission property on the optical correction plate 4, and a photoelectric sensor 29 for receiving the illumination light passing the specific region on the optical correction plate 4.

In this case, an example of the optical correction plate 4 is formed in such a manner that the transmission property of a circular center region is different from that of an annular region outside the circular region and that the zeroth-order light is let to pass the circular region or the annular region.

An example of the illumination system suitable for this case is one which projects the illumination light as inclined to the reference mark 22a so that the zeroth-order light passes the annular region, for example as shown in FIG. 20B.

Further, another example of the illumination system is one having a transform optical system 126 for establishing a relation of the Fourier transform between the reference mark 22 and a predetermined plane 125, which limits the illumination light passing the predetermined plane 125 within the annular region or within at least one local region decentered from the optical axis of the transform optical system 126.

In addition, for example as shown in FIG. 21, the illumination optical system 10–12, 147 for illuminating the mask 142 may be arranged also to serve as an illumination system for the mark detecting system.

A fourth projection exposure apparatus according to the present invention is a projection exposure apparatus, for example as shown in FIG. 29 and FIG. 30, which has a projection optical system PL for image-projecting a pattern image of a mask R on which a pattern for transfer is formed, onto a photosensitive substrate, an optical filter placed substantially on the pupil plane FTP of the projection optical system and making different at least one of optical characteristics consisting of an amplitude, a phase, and a polarization state of a light beam passing through a first region PF0 including the optical axis AX of the projection optical system PL from that of a light beam passing through a second region (a region except for PF0) including a part of a peripheral region of the pupil plane FTP other than the first region PF0, and position detecting means 217–220 for optically detecting through the projection optical system PL a position in a predetermined measurement direction (Y direction), of a mark for positioning formed on the substrate W wherein a light beam ALB1 for mark detection incident from the position detecting means 217–220 through the projection optical system PL to the substrate W is arranged to pass, on the pupil plane FTP of the projection optical system PL, a position apart from the first region PF0 in a direction (X direction) perpendicular to the predetermined measurement direction of the positioning mark.

In this case, an example of the light beam for mark detection is a light beam projected so as to form a light spot extending in the direction perpendicular to the predetermined measurement direction on the substrate. Further, another example of the light beam for mark detection is a pair of two coherent light beams.

Further, wide-band light having a wavelength band of about 10 to 200 nm may be used as the light beam for mark detection.

A fifth projection exposure apparatus according to the present invention comprises illuminating means 301–314 for illuminating a mask (reticle) R on which fine patterns (contact hole patterns and line-and-space mark patterns) are formed, with illumination light for exposure, a projection optical system PL for image-projecting images of the patterns onto a photosensitive substrate (wafer) W while receiving light emergent from the mask patterns, and a spatial filter PF, PF1 provided on an optical Fourier transform plane FTP to the mask, in the projection optical system, or on a plane in the vicinity thereof, which is for changing at least one of optical characteristics consisting of a transmittance, a phase difference of transmitted light, and a coherence state of the transmitted light in a concentric and stepwise manner about the optical axis AX of the projection optical system. A light-shielding member 308 is provided on an optical Fourier transform plane (for example, an exit-side plane of fly's eye lens 307) to the mask, in the illumination optical system 302–314, or on a plane in the vicinity thereof, which is substantially conjugate with the spatial filter PF, PF1, said light-shielding member 308 being provided for optically shielding a substantially ring region (annular light-shielding portion 381) located substantially in an imaging relation with a border region (for example, a peripheral edge of light-shielding portion LB) of the stepwise change of optical characteristics in the spatial filter.

Further, the present invention relates to a method for producing circuit patterns on the photosensitive substrate by uniformly irradiating a mask (reticle R) for production of circuit patterns, in which discrete patterns (contact hole patterns) and periodic patterns (line-and-space mark patterns) are mixed, with an illumination beam from an illumination optical system 302–314, and forming images of the patterns on the photosensitive substrate (wafer) W through the projection optical system PL. In this method, a distribution of the illumination beam is adjusted so that in a state where the spatial filter PF, PF1, which stepwise changes the optical characteristics in the radial direction, of the imaging beam passing through the pupil plane (nearly the Fourier transform plane FTP) in the projection optical system, or the intensity distribution, is placed on the pupil plane FTP or on the plane in the vicinity thereof, the distribution of the illumination beam passing through the plane substantially conjugate with the spatial filter in the illumination optical system becomes substantially minimum in the region corresponding to the border portion (for example, the peripheral edge of light-shielding portion LB) of the stepwise change on the spatial filter, and the thus adjusted illumination beam is projected onto the mask, whereby the resolution of the periodic patterns is improved as well as expanding the depth of focus related to projection images of the discrete patterns.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The embodiments of the projection exposure apparatus according to the present invention will be described.

Figure 5A:
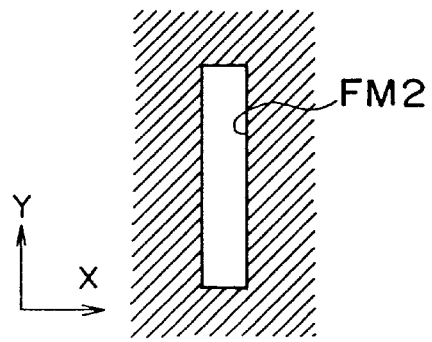
FIG. 5A is a plan view to show an ISS mark of a stage emission type used in normal reticle rotation measurement.
Figure 5B:
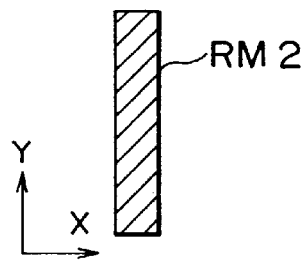
FIG. 5B is a plan view to show an alignment mark corresponding to the ISS mark shown in FIG. 5A.

In the projection exposure apparatus, not only a two-dimensional position of the reticle, but also an inclination of the reticle (reticle rotation) relative to the coordinate system on the wafer stage needs to be kept within a predetermined permissible range, and, therefore, measurement of reticle rotation is carried out by an ISS (Imaging Slit Sensor) system of the so-called stage emission type in the following manner. In this case, an ISS mark FM2 consisting of a slit opening pattern is formed along the Y direction on the wafer stage, as shown in FIG. 5A, and an alignment mark RM2 of a linear pattern is formed on the reticle, corresponding thereto, as shown in FIG. 5B.

Figure 6A:
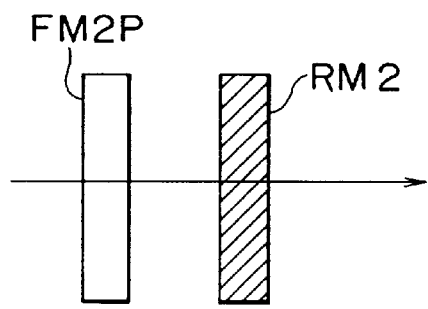
FIG. 6A is an explanatory drawing to illustrate the principle of position detection where the marks shown in FIGS. 5A and 5B are used.
Figure 6B:
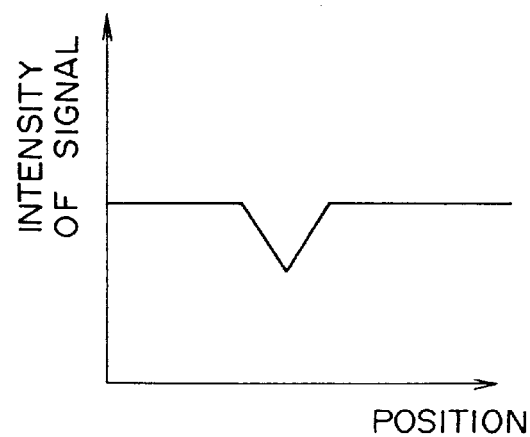
FIG. 6B is a drawing to show the intensity of output signal in the case of FIG. 6A.

When the wafer stage is moved in the X direction while illuminating the ISS mark FM2 from the bottom, a bright ISS mark image FM2P moves across the alignment mark RM2 in the X direction on the reticle, as shown in FIG. 6A. Receiving a light beam passing through the reticle and photoelectrically converting it, a signal changing depending upon a position of the wafer stage in the X direction is obtained as shown in FIG. 6B, and a position of the alignment mark RM2 is measured from a position where the signal becomes minimum. Further, for example obtaining a position in the X direction, of a second alignment mark formed apart in the Y direction on the reticle, an angle of inclination of the reticle can be measured relative to the Y axis on the wafer stage from a difference between the positions of the two alignment marks.

Figure 7A:
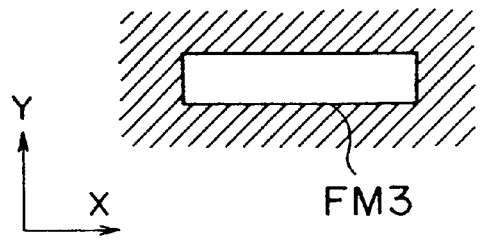
FIGS. 7A and 7B are plan views to show another example of the normal ISS mark.
Figure 7B:
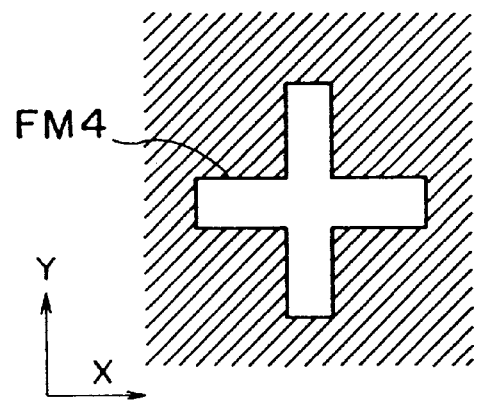

Similarly, an ISS mark FM3 consisting of a slit opening pattern along the X axis as shown in FIG. 7A is used as a wafer-stage-side reference mark, whereby reticle rotation is measured relative to the X axis on the wafer stage. Also, using an ISS mark FM4 consisting of a cross opening pattern as shown in FIG. 7B, as a reference mark, reticle rotation can be measured relative to the X axis and the Y axis.

Further, the general photolithography process sometimes employs different projection exposure apparatus for performing exposures in different layers on the wafer. In such cases, in order to keep registration errors between the different layers within a permissible range, distortions of projection optical systems set in the respective projection exposure apparatus need to be kept each within a predetermined permissible range. Thus, a distortion of a projection optical system is measured for example in such a manner that double exposures of a pattern of a test reticle are actually effected on the wafer through the projection optical system and a positional deviation at each point in the thus obtained images is measured by the so-called laser-step-alignment method (hereinafter referred to as "LSA method").

In another example, for example as disclosed in Japanese Laid-open Patent Application No. 59-94032, evaluation marks on a test reticle are actually projected onto the wafer through the projection optical system, a light-receiving slit on the wafer stage side is scanned relative to images of the marks thus projected, and positions of the mark images are measured, whereby the distortion of the projection optical system is measured.

Figure 8:
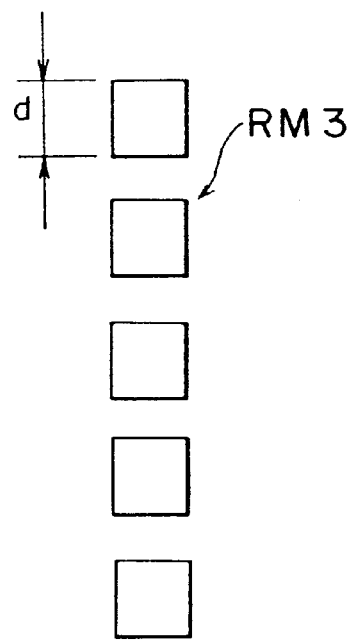
FIG. 8 is a plan view to show a mark used in distortion measurement of the normal double exposure method.

An example of the test reticle is a reticle as shown in FIG. 8, in which evaluation marks RM3 each including an array of square dot patterns with each side in the width d (where d is for example 20 μm) are arranged vertically and horizontally at predetermined intervals. The patterns on the entire surface of the test reticle are projected as a primary scale onto the wafer in a first exposure and then images of selected evaluation marks on the test reticle are projected as a secondary scale to respective points on the wafer with stepping drive of the wafer stage in a second exposure. In the LSA method, the two marks thus exposed at each point on the wafer are then scanned with a slit light spot to detect diffracted light from each mark, thereby detecting an amount of positional deviation between the two marks at each point. Further, the registration accuracy of the two patterns exposed in different layers on the wafer is also measured by such a double exposure method.

As described above, position detection or projection of various marks is made through the projection optical system in the ordinary projection exposure apparatus.

With respect to this, attempt has been made to improve the imaging performance of the projection optical system in exposure of predetermined patterns by setting a pupil filter with predetermined transmittance distribution characteristics and phase distribution characteristics near the pupil plane (Fourier transform plane) of the projection optical system as described previously. It is found that for example in order to improve the resolution and the depth of focus in exposure of isolated patterns such as contact hole patterns, it is effective to set a light-shielding type pupil filter for optically shielding a circular region near the optical axis, near the pupil plane of the projection optical system, as disclosed for example in U.S. Ser. No. 076,429.

Figure 9A:
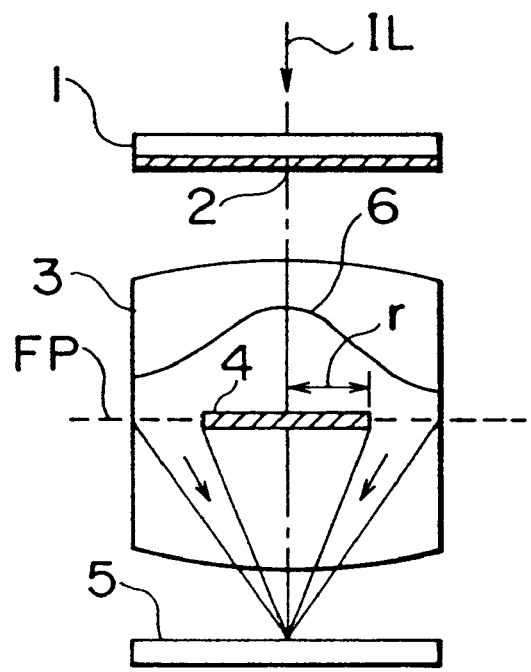
FIG. 9A is an explanatory drawing to show an imaging condition by a projection optical system in which a normal pupil filter is set.

FIG. 9A is an explanatory drawing to illustrate the principle of operation of the light-shielding type pupil filter. In this FIG. 9A, an image of a fine contact hole pattern 2 on the reticle 1 is projected through the projection optical system 3 onto the wafer 5. In this case, a pupil filter 4 is set on the pupil plane FP of the projection optical system 3 so that it shields a circular region in a radius r around the optical axis. In the pupil filter 4 a circular light-shielding film is formed for example on a glass substrate, and FIG. 9A shows only the light-shielding portion. When the radius of the pupil of the projection optical system 3 is $a$, the radius r is for example 0.8 $a$. In this case, when the reticle 1 is irradiated with exposure light IL, an intensity distribution on the pupil plane FP of the projection optical system 3, of diffracted light emerging from the contact hole pattern 2 is a distribution having relatively large values in the region outside the pupil, as shown by a distribution curve 6. Thus, if an image of the contact hole pattern 2 is formed simply using the light passing through the entire pupil, the resolution of the thus obtained image becomes degraded.

Figure 9B:
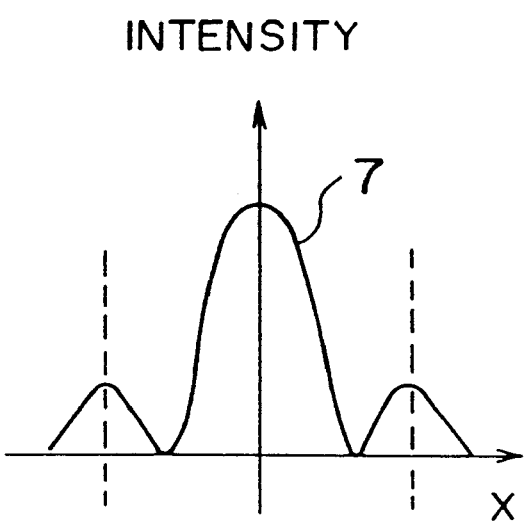
FIG. 9B is a drawing to show an intensity distribution of a projected image by the projection optical system shown in FIG. 9A.

In contrast, when the pupil filter 4 is set on the pupil plane FP as shown in FIG. 9A, a distance from the peak of the image to a first zero becomes shorter by the apodization effect as shown by a curve 7 in FIG. 9B, which is an enlarged drawing in the X direction, of the intensity distribution of the image obtained on the wafer 5. Namely, the resolution is improved and the depth of focus is also increased at the same time.

Figure 1A:
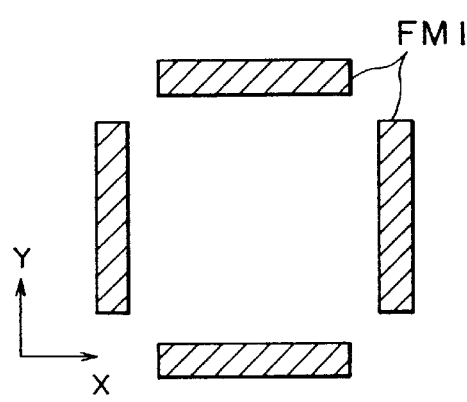
FIG. 1A is a plan view to show a reference mark used in the conventional reticle alignment.
Figure 1B:
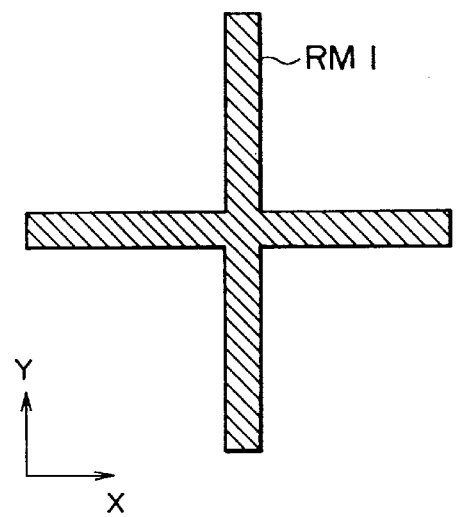
FIG. 1B is a plan view to show an alignment mark used in the conventional reticle alignment.
Figure 2A:
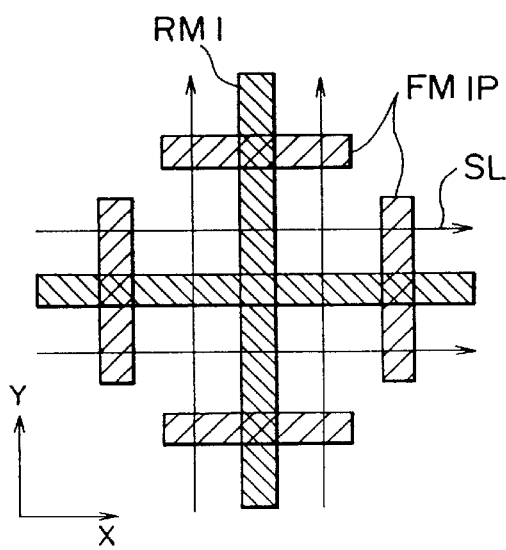
FIG. 2A is an explanatory drawing to illustrate the principle of position detection where the marks shown in FIGS. 1A and 1B are used.
Figure 2B:
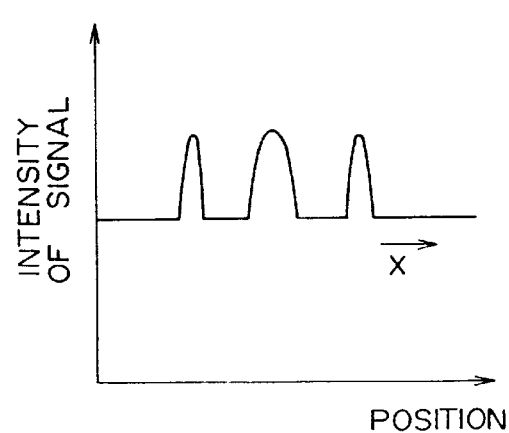
FIG. 2B is a drawing to show the intensity of output signal in the case of FIG. 2A.

Thus, the imaging characteristics of the projection optical system 3 for contact hole patterns can be enhanced by setting the light-shielding type pupil filter 4 on the pupil plane FP of the projection optical system 3. However, if the reticle alignment is performed while detecting the reference mark FM1 shown in FIG. 1A through the projection optical system 3 including the pupil filter 4 therein as described, the pupil filter 4 interrupts a lot of light from the reference mark FM1 to decrease a quantity of light, thus resulting in failing to perform the reticle alignment with high accuracy. Similarly, when the light from the ISS mark FM2 shown in FIG. 5A is intended to be guided to the reticle side through the projection optical system 3 including the pupil filter 4 therein, the pupil filter 4 interrupts a lot of the light from the ISS mark FM2, thus failing to obtain the reticle rotation with high accuracy.

Also, when an image of the alignment mark RM3 of the dot pattern array as shown in FIG. 8 is intended to be projected onto the wafer through the projection optical system 3 including the pupil filter 4 therein, the pupil filter 4 interrupts a lot of light from the alignment mark RM3, failing to form an easily measured image of the alignment mark RM3 on the wafer. Because of it, it is difficult to measure distortion characteristics of the projection optical system 3 including the pupil filter 4 therein and to measure registration errors of the projection exposure apparatus provided with the projection optical system 3 as well.

Figure 10A:
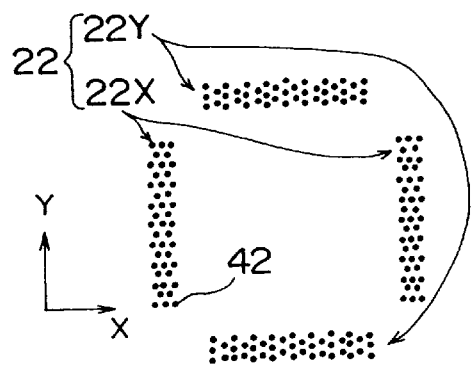
FIG. 10A is a plan view to show a reference mark 22 in FIG. 3.

In the projection exposure apparatus of the present invention, for example if the pupil filter 4 is a center shielding type pupil filter for shielding the light near the optical axis, the reference mark 22 on the substrate stage 13 is formed of an aggregate of fine dot patterns as shown in FIG. 10A. This arrangement makes the majority of diffracted light emerging from the reference mark 22 pass through a region apart from the optical axis on the pupil plane of the projection optical system 3, so that the light-receiving means can receive a sufficient quantity of light from the reference mark 22. Accordingly, the reference mark 22 can be accurately detected even if the pupil filter 4 is set.

Figure 11:
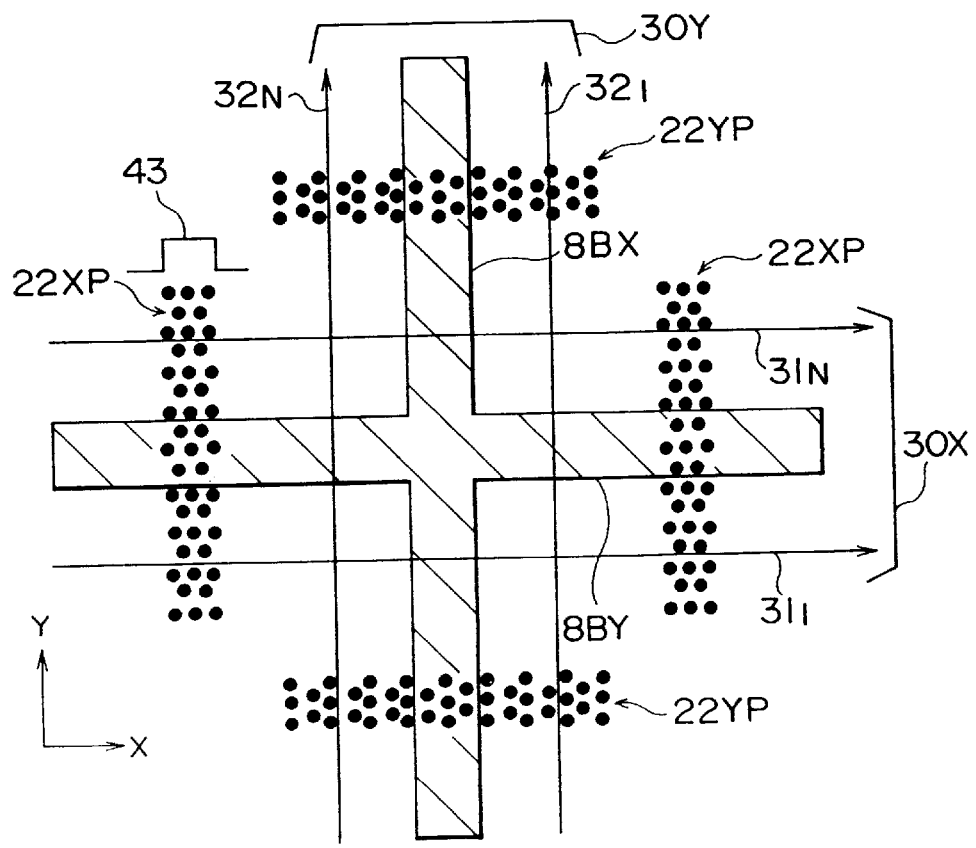
FIG. 11 is a plan view to show an image observed by an alignment microscope in FIG. 3.

In the case where the reference mark 22 is thus constructed for example of dot patterns, taking the measurement direction of the reference mark 22 as the X direction as shown in FIG. 10A, a distribution is set so as to make an integral value in a non-measurement direction, of bright portions in an X-axis mark 22X in the reference mark 22 uniform as shown by a distribution curve 43 in FIG. 11. In detecting a position of the mark 22X, an image of the mark 22X is repetitively scanned many times for example in the X direction, and the scanning results are averaged. This permits the X-directional position of the mark 22X to be detected with high reproducibility and high accuracy.

Figure 12A:
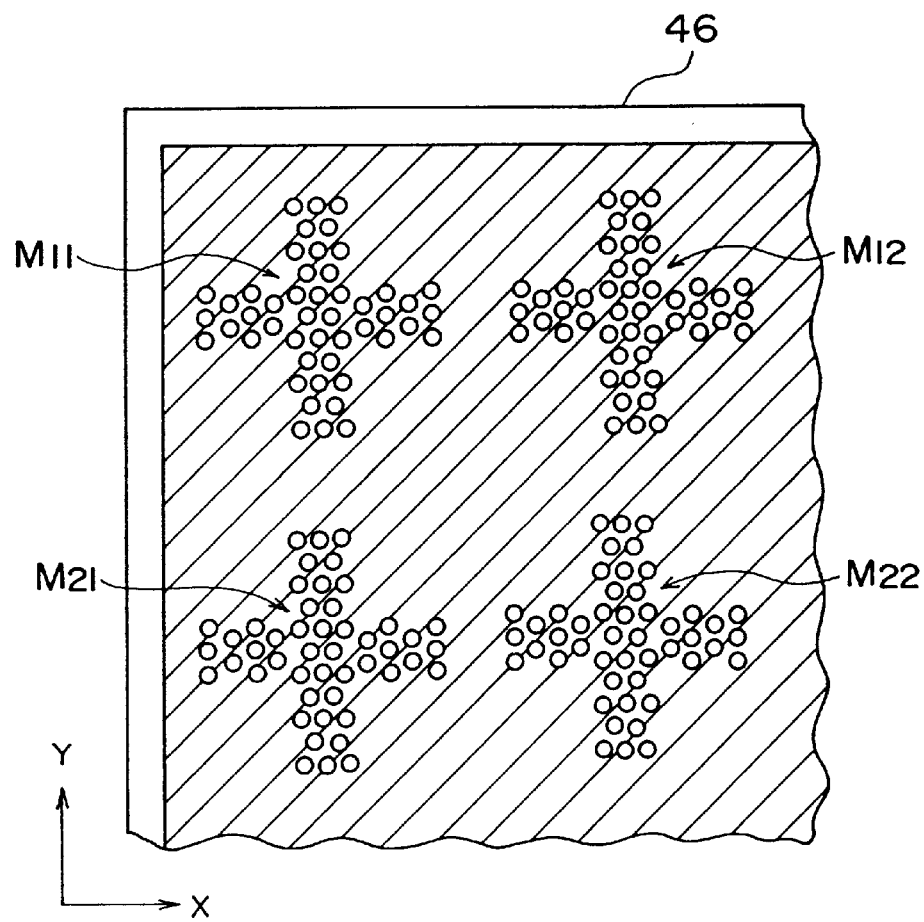
FIG. 12A is a plan view to show a part of an evaluation mark in FIG. 4.

In the next place, according to the projection exposure apparatus of the present invention, for example in the case where the pupil filter 4 is a center shielding type pupil filter for interrupting the light near the optical axis, the reference mark $m_{ij}$ on the mask 46 is formed of an aggregate of fine dot patterns as shown in FIG. 12A. This arrangement makes a lot of diffracted light emerging from the reference mark $M_{ij}$ pass through a region apart from the optical axis on the pupil plane of the projection optical system, whereby the light-receiving means can receive a sufficient quantity of light from the reference mark. Accordingly, the reference mark $M_{ij}$ can be accurately detected even if the pupil filter 4 is set.

Also in the case where the reference mark $M_{ij}$ is thus constructed for example of dot patterns, taking the measurement direction of the reference mark $M_{ij}$ as the X direction as shown in FIG. 12A, a distribution is set so as to make uniform an integral value in the non-measurement direction, of bright portions in an X-axis mark in the reference mark, whereby an X-directional position of the mark can be detected with high reproducibility and high accuracy.

Embodiment 1

Embodiment 1 of the projection exposure apparatus according to the present invention is described referring to FIGS. 3, 10A, 10B, and 11. The present embodiment is an application in which the present invention is applied to reticle alignment through the projection optical system.

Figure 3:
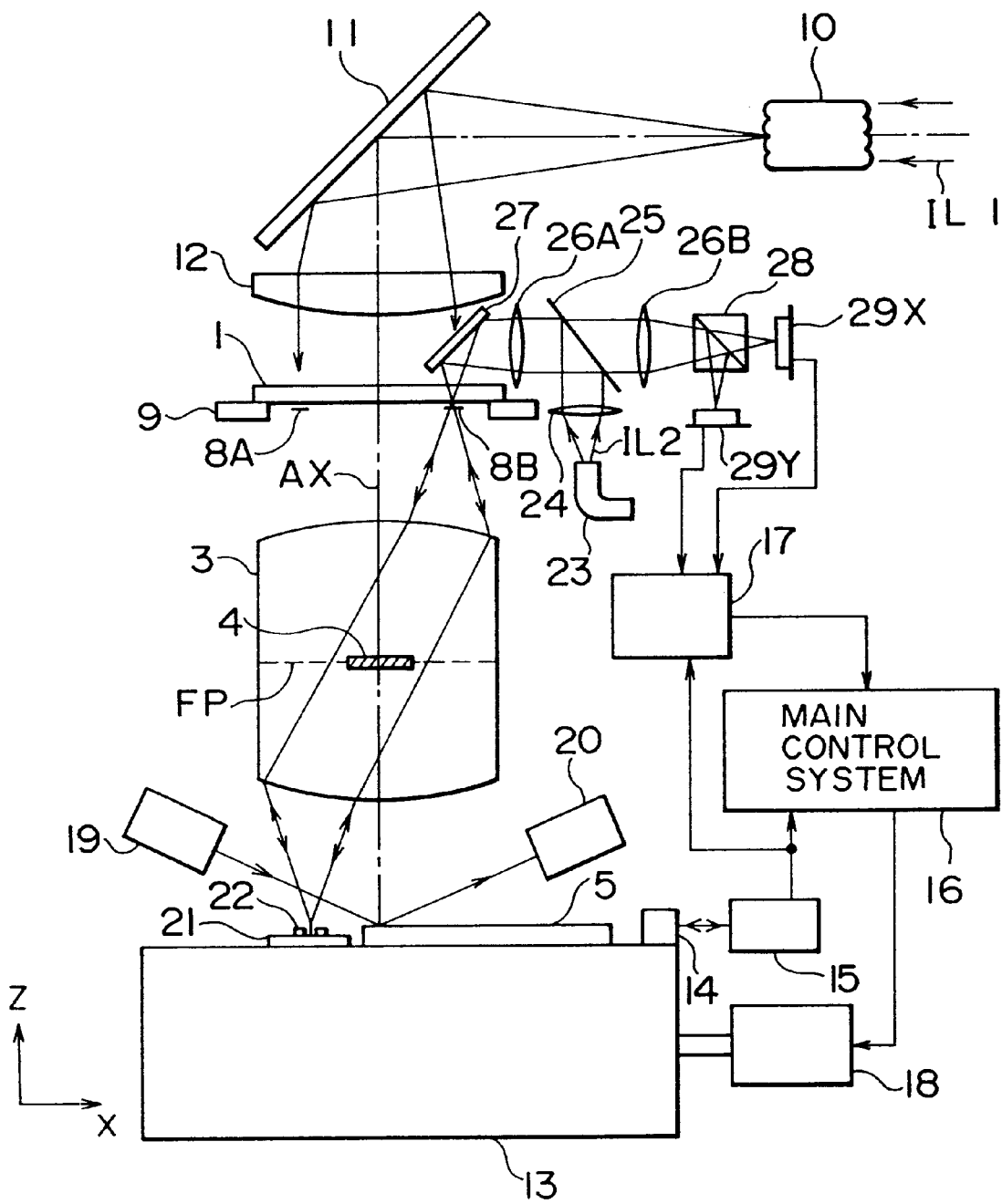
FIG. 3 is a structural drawing to show Embodiment 1 of the projection exposure apparatus according to the present invention.
Figure 10B:
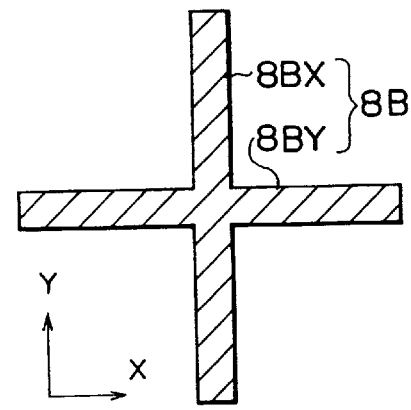
FIG. 10B is a plan view to show an alignment mark 8B in FIG. 3.

FIG. 3 shows the projection exposure apparatus of the present embodiment. In FIG. 3, the reticle 1 is a photomask for contact hole patterns, in which original patterns of contact hole patterns are formed in a predetermined array in a pattern area and on which two alignment marks 8A and 8B are formed near the pattern area in the X direction. Each alignment mark 8B (or 8A) is a cross mark made of a reflective film (light-shielding film) as shown in FIG. 10B, and surrounding portions are transparent portions.

In exposure of the patterns on the reticle 1, exposure light IL1 (the i-line of mercury lamp or excimer laser light, etc.) from a light source for exposure, not shown, is let to enter a fly's eye lens 10, and the exposure light from a lot of secondary light sources formed on the exit plane of the fly's eye lens 10 illuminates the pattern area of the reticle 1 via a mirror 11 and a condenser lens 12. Under the exposure light, images through the projection optical system 3, of the patterns in the pattern area of reticle 1 are projected onto each shot area in the wafer 5 held on the wafer stage 13.

The light shielding type pupil filter (optical correction plate) 4, which interrupts light in a circular region in a predetermined radius about the optical axis AX of the projection optical system 3, is set on the Fourier transform plane (pupil plane) FP to the pattern-formed surface of the reticle 1, in the projection optical system 3. This permits the images of contact hole patterns to be projected to effect exposure on the wafer 5 with high resolution and deep depth of focus.

Here, taking the Z axis in parallel with the optical axis AX of the projection optical system 3 and the X axis and Y axis as an orthogonal coordinate system on the two-dimensional plane perpendicular to the Z axis, the wafer stage 13 is composed mainly of an XY stage for positioning the wafer 5 in the XY plane perpendicular to the Z axis and a Z stage for adjusting the position of the wafer 5 in the Z-axial direction.

A moving mirror 14 is fixed to an end of the wafer stage 13. With the moving mirror 14 and a laser interferometer 15 set outside, X coordinate and Y coordinate of the wafer stage 13 are always measured, and measured coordinates are supplied to a main control system 16 and a processing unit 17. The main control system 16 controls moving coordinates of the wafer stage 13 through a wafer stage drive unit 18, based on the thus measured coordinates.

Beside the projection optical system 3, there is provided an autofocus sensor consisting of a projection optical system 19 for projecting a slit pattern image toward a predetermined measurement point in an exposure field of the projection optical system 3 obliquely to the optical axis AX, and a light-receiving system 20 for receiving reflected light from the measurement point to re-focus the slit pattern image and to produce a focus signal according to an amount of deviation of the re-focused position from the reference position to supply it to the main control system 16. In this case, calibration is made so as to make the focus signal become 0 in the state where the measurement point is coincident with the image plane (best focus plane) of the projection optical system 3. Therefore, an amount of positional deviation for example from the best focus plane of the exposure surface of wafer 5 can be detected from a value of the focus signal.

Further, a reference mark plate 21 made of a glass substrate is fixed near the wafer 5 on the wafer stage 13, and a reference mark 22 is formed on the surface of the reference mark plate 21. Upon reticle alignment the surface of the reference mark plate 21 is set at the same height as the image plane of the projection optical system 3, using the autofocus sensor. FIG. 10A is an enlarged drawing of the reference mark 22. As shown in this FIG. 10A, the reference mark 22 is composed of two X-axial reference marks 22X formed apart from each other in the X direction, and two Y-axial reference marks 22Y formed apart from each other in the Y direction. Also, the X-axial reference marks 22X are fine dot patterns 42 of reflective film distributed in two rectangular regions extending in the Y direction, and the Y-axial reference marks 22Y are fine dot patterns 42 of reflective film distributed in two rectangular regions extending in the X direction. The regions other than the dot patterns 42 are non-reflective. In other words, the reference mark 22 in the present embodiment is formed so that the dot patterns 42 are distributed in a predetermined array in the rectangular regions of the conventional reference mark FM1 shown in FIG. 1A.

The size of the dot patterns 42 is approximately equal to that of the projected images onto the wafer 5, of the contact hole patterns in the pattern area of reticle 1, and the shape thereof may be any of circle, rectangle, etc. If the dot patterns 42 are circular, an example of the diameter is about 0.3 μm, and the arrangement pitch is for example about 0.75 μm in the X direction and in the Y direction.

The distribution of the dot patterns is selected, as shown in FIG. 10A, so that the distribution for X-axis reference marks 22X becomes uniform when the dot patterns 42 are integrated in the Y direction (non-measurement direction) and that the distribution for Y-axis reference marks 22Y also becomes uniform when the dot patterns 42 are integrated in the X direction (non-measurement direction). Namely, in the X-axis reference marks 22X, the dot patterns 42 are arranged along a lot of straight lines parallel to the X axis of the measurement direction, and the lot of straight lines are located at random to each other on the Y axis. In the Y-axis reference marks 22Y, the dot patterns are arranged along a lot of straight lines parallel to the Y axis of the measurement direction, and the lot of straight lines are located at random to each other on the X axis.

Next, in the present embodiment, as described in U.S. Pat. No. 5,243,195 for example, an alignment microscope is provided for observing a positional relation between the alignment mark 8B and the reference mark 22 from above the reticle 1. In performing the reticle alignment using the alignment microscope, illumination light IL2 of the same wavelength as that of the exposure light IL1 is guided from the light source for exposure (not shown) through an optical fiber 23. The illumination light IL2 outgoing from the optical fiber 23 is nearly collimated by a collimator lens 24, then is reflected by a beam splitter 25, and travels through an objective lens 26A and via a mirror 27 for bending the optical path to illuminate the vicinity of the alignment mark 8B of the reticle 1.

In this case, supposing the reference mark 22 on the wafer stage 13 is set at a position substantially conjugate with the alignment mark 8B, the illumination light IL2 passing around the alignment mark 8B illuminates the reference mark 22 on the reference mark plate 21 through the projection optical system 3. In the present embodiment, because the pupil filter 4 is set on the pupil plane FP of the projection optical system 3, the numerical aperture (angle of divergence) of the illumination light IL2 for illuminating the alignment mark 8B needs to be large enough to reach even the region around the pupil filter (light-shielding portion) 4. When the numerical aperture of the illumination light IL2 is NA and the wavelength is λ, the arrangement pitch of the dot patterns 42 is set to be (1.0 to 1.4)×λ/NA.

Reflected light, scattered light, and diffracted light from the reference mark 22 returns to the reticle 1 while passing through the surroundings of the pupil filter (light-shielding portion) 4 in the projection optical system 3. In this case, an angle of diffraction of the diffracted light is large, because the reference mark 22 is the aggregate of fine dot patterns. Therefore, because a lot of diffracted light from the reference mark 22 returns to the reticle 1 while passing through the surroundings of the pupil filter 4, the image of the reference mark 22 can be advantageously observed as a bright image with high SN ratio. Thus, the light from the reference mark 22 having passed through the reticle 1, and linearly-reflected, scattered, or diffracted light on the alignment mark 8B of reticle 1 returns to the objective lens 26A via the mirror 27. The light returning to the objective lens 26A then travels via the beam splitter 25, imaging lens 26B, and beam splitter 28 to form a superimposed image of the image of alignment mark 8B and the image of reference mark 22 on an image pickup surface of an X-axis image pickup device 29X consisting of a two-dimensional CCD and on an image pickup surface of a Y-axis image pickup device 29Y.

FIG. 11 shows an observation field near the alignment mark 8B by the alignment microscope in FIG. 3. In FIG. 11, images 22XP of the X-axis reference marks in the reference mark 22 are formed on either side of the X-axis mark 8BX extending in the Y direction in the alignment mark 8B, and images 22YP of the Y-axis reference marks on either side of the Y-axis mark 8BY extending in the X direction. Then the image pickup device 29X in FIG. 3 picks up an image of the rectangular region 30X extending in the X direction, and the image pickup device 29Y picks up an image of the rectangular region 30Y extending in the Y direction. Further, the image pickup device 29X reads image pickup signals from two-dimensional pixels along scanning lines conjugate with scanning lines $31_1$–$31_N$ (where N is an integer of not less than 2) parallel to the X axis, while the image pickup device 29Y reads image pickup signals from two-dimensional pixels along scanning lines conjugate with scanning lines $32_1$–$32_N$ parallel to the Y axis. Thus read image pickup signals are supplied to the processing unit 17 in FIG. 3, and the processing unit 17 calculates amounts of positional deviation in the X direction and in the Y direction, of the alignment mark 8B relative to the image of reference mark 22 from the supplied image pickup signals.

On this occasion, the processing unit 17 calculates an amount of positional deviation of the X-axis mark 8BX relative to the images 22XP of the X-axis reference marks, for example based on a signal obtained by averaging the image pickup signals on the scanning lines corresponding to the scanning lines $31_1$–$31_N$ in FIG. 11. However, excluded are signals in regions where the signal level becomes high in the almost all region among those scanning lines, that is, signals from the region in the image 8BY of the Y-axis reference mark. In the present embodiment, the distribution obtained by integrating the bright portions in the each image 22XP of X-axis reference mark in the Y direction (non-measurement direction) becomes a distribution having sharp edges at the both ends in the X direction and a middle portion of a uniform level, as shown by a distribution curve 43. Accordingly, reproducibility is good for measurement results of positions of images 22XP of the X-axis reference marks, and the amount of positional deviation in the X direction, of the alignment mark 8B relative to the image of reference mark 22 is measured with high accuracy and high reproducibility. Similarly, the amount of positional deviation in the Y direction, of the alignment mark 8B can also be measured with high reproducibility.

The processing unit 17 supplies to the main control system 16 a value obtained by adding a current coordinate value of the wafer stage 13 as an offset to the amount of positional deviation thus calculated.

By this, the amount of positional deviation of alignment mark 8B is measured relative to the reference mark 22 where the wafer stage 13 is set at the predetermined reference position. Similarly, an amount of positional deviation of the alignment mark 8A on the reticle 1 in FIG. 3 relative to the reference mark 22 (or another reference mark) is measured by the alignment microscope (not shown) placed above the alignment mark 8A. The reticle alignment is completed by positioning the reticle 1 so that the amounts of positional deviation of those alignment marks 8A and 8B are kept each within a predetermined permissible range.

In the present embodiment as described above, because the aggregate of fine dot patterns is used as the reference mark 22 on the wafer stage 13, the angle of diffraction of the diffracted light from the reference mark 22 is large. Accordingly, even though the light shielding type pupil filter 4 is placed on the pupil plane of the projection optical system 3, the reference mark 22 can accurately be observed through the projection optical system 3 by the alignment microscope above the reticle 1. Because of this, the reticle alignment can be performed with high accuracy.

Although the above-described embodiment employs such an arrangement that the processing unit 17 averages the image pickup signals in correspondence for example to the region 30X, another arrangement may be employed to obtain an average image of the images 22XP of the X-axis reference marks by subjecting image data corresponding to the region 30X to two-dimensional low-pass filtering treatment by image processing. In this case, the position of alignment mark can be detected with respect to the reference of the position of the average image.

Figure 13:
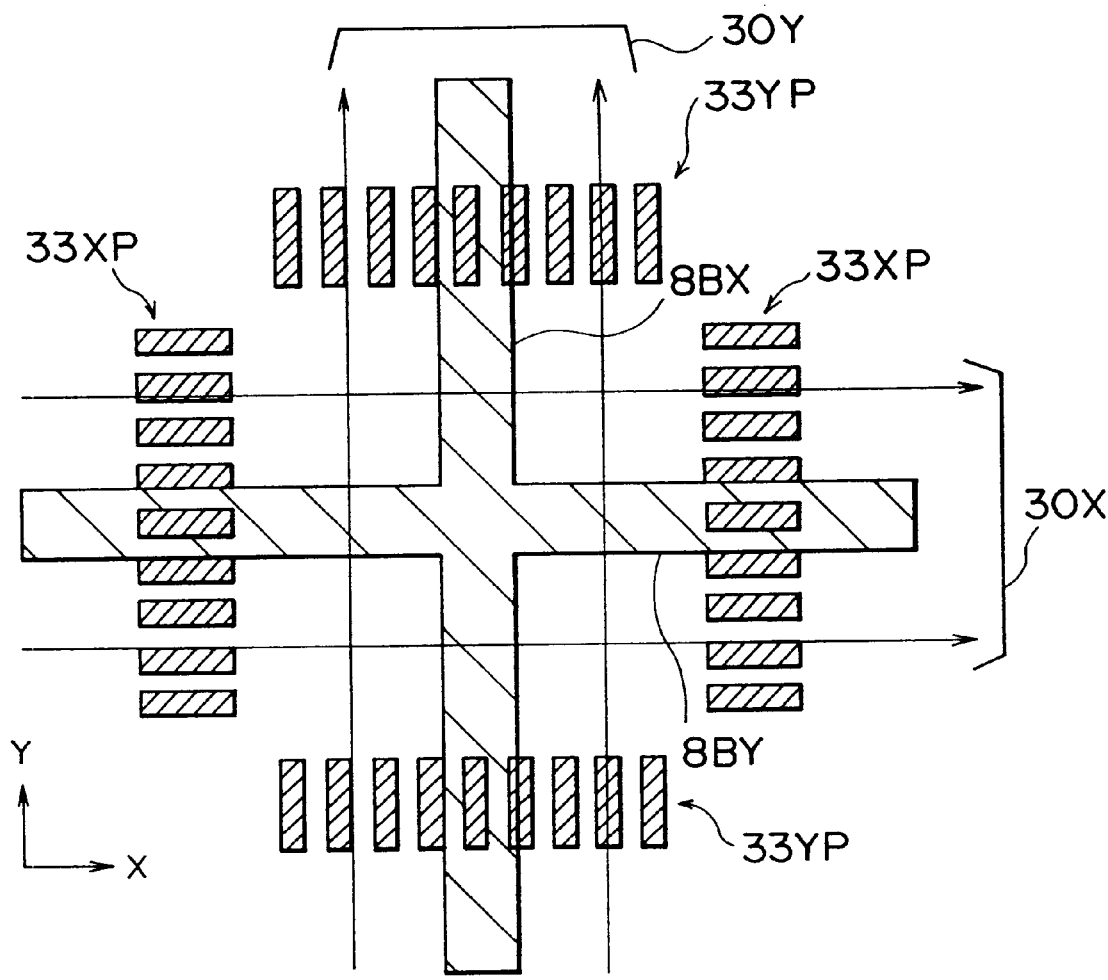
FIG. 13 is a drawing to show an image observed by the alignment microscope where the reference mark 22 is replaced by another reference mark in Embodiment 1.

Although the above-described embodiment uses the aggregate of dot patterns as the reference mark 22, line-and-space patterns of a small arrangement pitch, as shown in FIG. 13, may be used as the reference mark 22. FIG. 13 shows an observation field on reticle as observed in this case by the alignment microscope. In this FIG. 13, an image 33XP of the each X-axis reference mark is line-and-space patterns arranged at small pitch in the Y direction, and an image 33YP of the each Y-axis reference mark is line-and-space patterns arranged at small pitch in the X direction. Therefore, the reference mark formed on the wafer stage 13 in FIG. 3 is a mark in the size obtained by multiplying the images 33XP and 33YP by a projection magnification $\beta$ of the projection optical system 3.

Even when the reference mark as shown in FIG. 13 is used, the position of the reference mark can accurately be detected, because a lot of diffracted light from the reference mark returns to the reticle 1 as passing through the region outside the pupil filter 4. Also in the case of FIG. 13, the position of the reference mark can be detected with high accuracy and high reproducibility by averaging the image pickup signals obtained as scanning the image pickup surface for example in correspondence with scanning lines in the region 30X.

Embodiment 2

Figure 14:
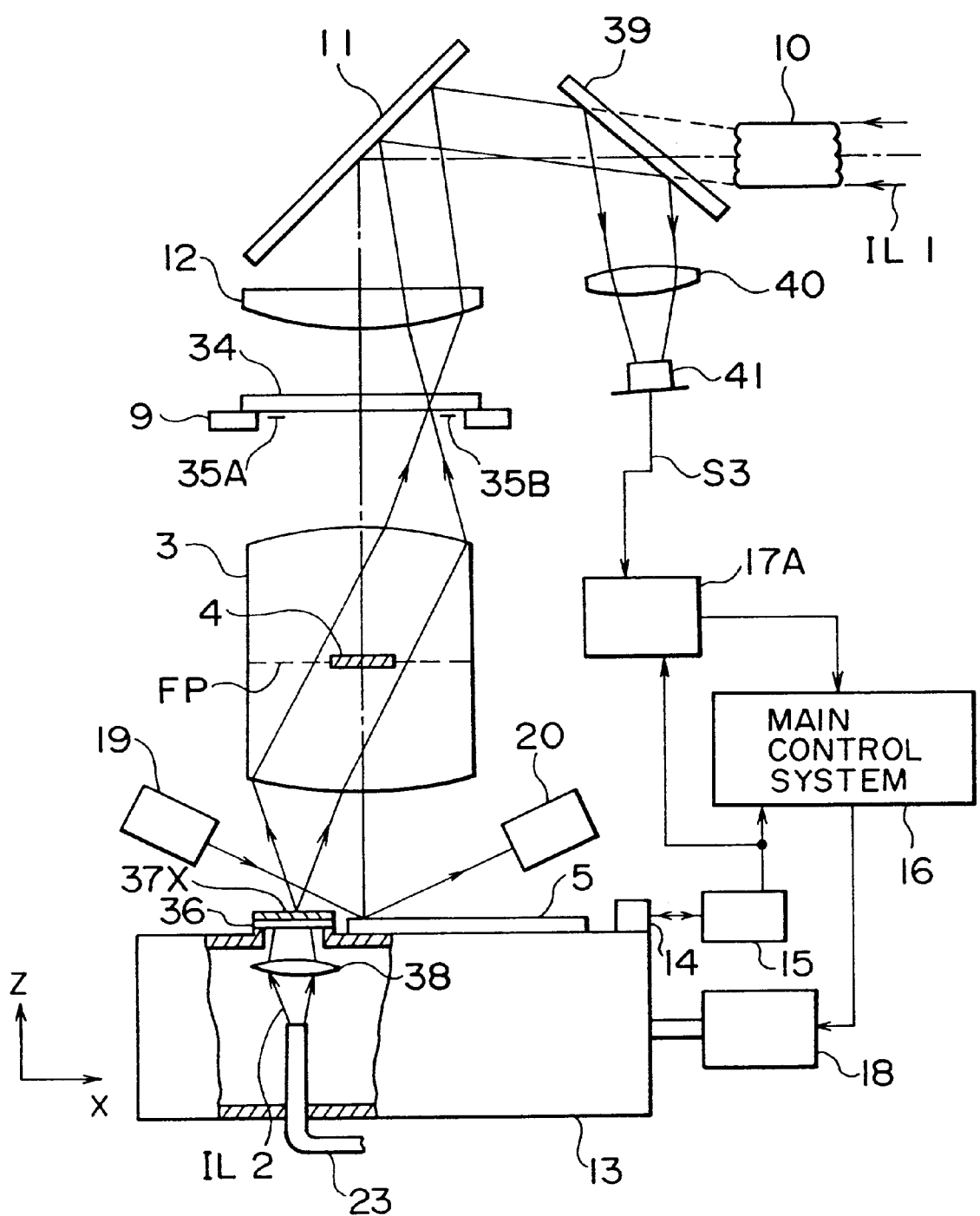
FIG. 14 is a structural drawing to show the projection exposure apparatus in Embodiment 2 of the present invention.

Next, Embodiment 2 of the present invention is described referring to FIGS. 14, 15A, 15B, 16A, 16B, 17A, and 17B. The present embodiment is an example in which the present invention is applied to measurement of reticle rotation. In FIG. 14, portions corresponding to those in FIG. 3 are denoted by same reference numerals and detailed description thereof will be omitted.

FIG. 14 shows the projection exposure apparatus of the present embodiment. In FIG. 14, linear alignment marks 35A and 35B extending in the Y direction are formed outside the pattern region (the region where original patterns of contact hole patterns are formed) in the reticle 34 held on the reticle holder 9. An ISS mark 37X for X axis is formed in a light-shielding film (chromium film etc.) on the reference mark plate 36 made of a glass substrate and set in the vicinity of the wafer 5 on the wafer stage 13.

Figure 15A:
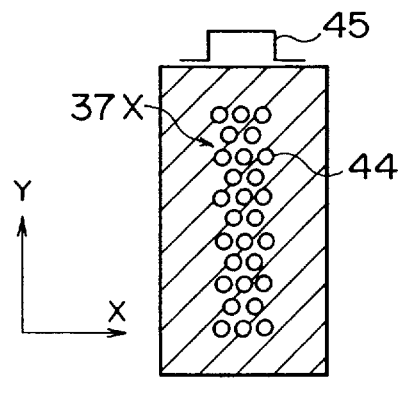
FIG. 15A is a plan view to show an ISS mark 37X in FIG. 14.

FIG. 15A is an enlarged view of the ISS mark 37X. In this FIG. 15A, the ISS mark 37X is constructed in such a manner that optically transparent dot patterns 44 of fine openings are distributed in a predetermined array in a rectangular region extending in the Y direction. In other words, the ISS mark 37X of the present embodiment is what the dot patterns 44 are distributed in the opening of the normal ISS mark FM2 of FIG. 5A, and the size of the dot patterns 44 is approximately equal to that of the contact hole patterns projected through the projection optical system 3 with pupil filter 4 onto the wafer 5.

Further, the measurement direction of the ISS mark 37X is the X direction, and a distribution obtained by integrating the dot patterns 44 in the Y direction as the non-measurement direction is one as shown by a distribution curve 45 in FIG. 15A, having a sharp rise at the both ends in the X direction and a uniform intermediate portion. Namely, the dot patterns 44 are arranged along a number of straight lines parallel to the X axis, and positions of the lot of straight lines on the Y axis are at random to each other.

Figure 15B:
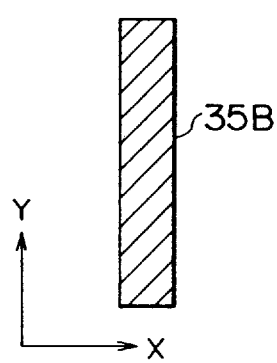
FIG. 15B is a plan view to show an alignment mark 35B in FIG. 14.

Further, FIG. 15B shows the shape of another alignment mark 35B on the reticle 34. As shown in this FIG. 15B, the alignment mark 35B is a pattern in which a light-shielding film is linearly formed. In this case, the X-directional width of a contour of an image obtained by projecting the ISS mark 37X backward through the projection optical system 3 to the reticle 34 is set as approximately equal to the X-directional width of the alignment mark 35B.

Returning to FIG. 14, in the present embodiment, as described in U.S. Pat. No. 4,780,616 for example, the illumination light IL2 with the same wavelength as that of the exposure light IL1 is guided into the wafer stage 13 from the light source for exposure through the optical fiber 23. Then, the illumination light IL2 outgoing from the optical fiber 23 illuminates the ISS mark 37X from the bottom side of the reference mark plate 36 through a converging lens 38. In the case where the ISS mark 37X is within the image field of the projection optical system 3, the diffracted light from the ISS mark 37X passes through the periphery of the pupil filter 4 in the projection optical system 3 to form an image of the ISS mark 37X on the pattern-formed surface of reticle 34. In this case, because the ISS mark 37X is the aggregate of dot patterns and the angle of diffraction of the diffracted light is large, a lot of the diffracted light from the ISS mark 37X passes through the region outside the pupil filter 4, whereby a good image of the ISS mark 37X is formed on the reticle 34.

After passing through the reticle 34, the diffracted light from the ISS mark 37X travels through the condenser lens 12 and via the mirror 11 to reach the beam splitter 39, and the light separated by the beam splitter 39 is converged on a light-receiving surface of a photoelectric conversion device 41 by a converging lens 40. A detected signal S3, which is obtained by photoelectrically converting the light received by the photoelectric conversion device 41, is supplied to the processing unit 17A. Also supplied to the processing unit 17A are X coordinate and Y coordinate of the wafer stage 13 measured by the laser interferometer 15. The processing unit 17A detects an X coordinate when the image of the ISS mark 37X coincides with the alignment mark 35B as detailed later, and supplies it to the main control system 16. Similarly, the processing unit 17A detects a Y coordinate when the image of Y-axis ISS mark coincides with the Y-axis alignment mark, and supplies it to the main control system 16. The other structure is the same as in FIG. 3.

Figure 16A:
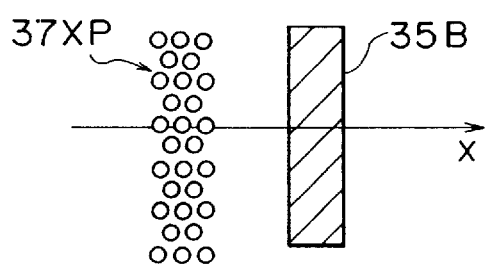
FIG. 16A is an explanatory drawing where position detection of the alignment mark 35B is carried out by the stage emission method in the projection exposure apparatus of FIG. 14.
Figure 16B:
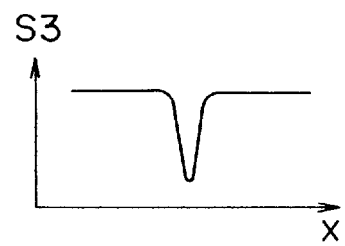
FIG. 16B is a drawing to show the intensity of output signal in the case of FIG. 16A.

In measuring the reticle rotation in the present embodiment, the wafer stage 13 is driven in the X direction while illuminating the ISS mark 37X with the illumination light IL2 so as to scan the alignment mark 35B in the X direction with the image of ISS mark 37X. By this, a bright image 37XP of the ISS mark 37X moves across the alignment mark 35B made of a light-shielding film in the X direction, as shown in FIG. 16A, on the pattern-formed surface of reticle 34. Accordingly, because the detection signal S3 output from the photoelectric conversion device 41 in FIG. 14 becomes minimum when the image 37XP of the ISS mark coincides with the alignment mark 35B as shown in FIG. 16B, an X coordinate at that moment can be detected.

Similarly, in FIG. 14, for example detecting a position of another X-axis alignment mark apart from the alignment mark 35B in the Y direction (in the direction perpendicular to the plane of FIG. 14) using the ISS mark 37X, a rotational angle of the reticle 34 to the Y axis on the wafer stage 13 is obtained from a difference between X coordinates of the two alignment marks. Similarly, scanning in the Y direction the alignment mark extending in the X direction with the Y-axis ISS mark extending in the X direction, a rotational angle of reticle 34 to the X axis can be obtained.

Figure 17A:
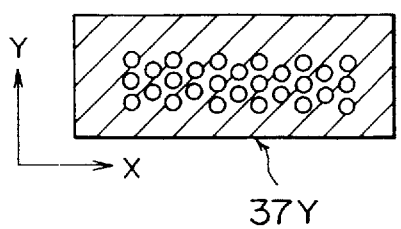
FIG. 17A is a plan view to show an ISS mark 37Y for Y axis.
Figure 17B:
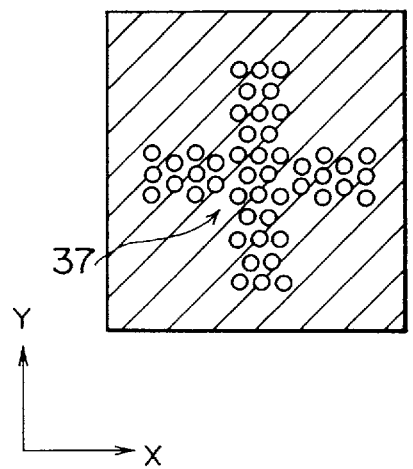
FIG. 17B is a plan view to show an ISS mark 37 of a cross shape.

An example of the Y-axis ISS mark extending in the X direction is one as shown in FIG. 17A in which dot patterns of fine openings are distributed in a rectangular region extending in the X direction. Another ISS mark 37 in which dot patterns of fine openings are distributed in a cross region, as shown in FIG. 17B, may be used as a combination mark of the X-axis ISS mark with the Y-axis ISS mark.

Embodiment 3

Figure 4:
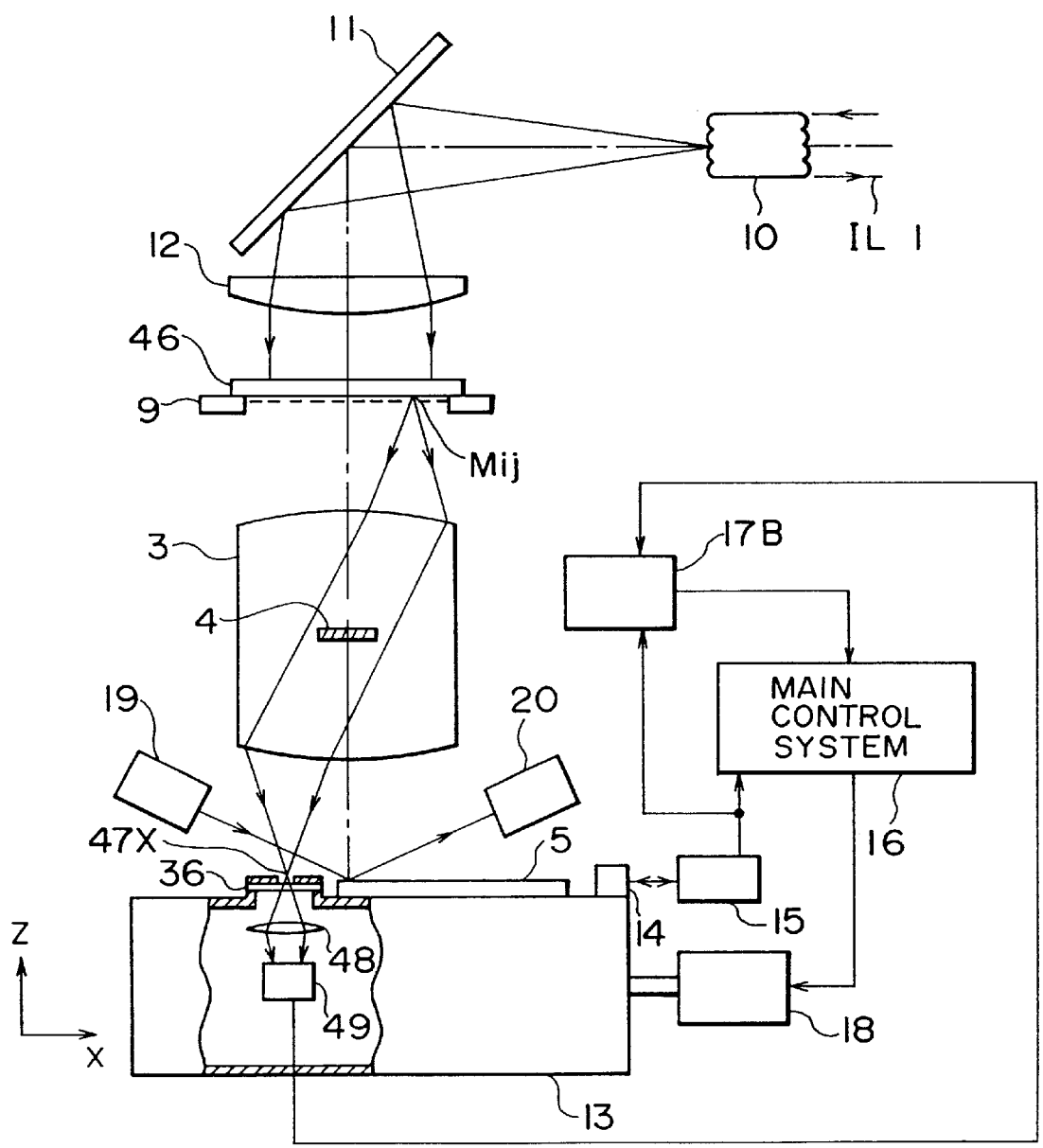
FIG. 4 is a structural drawing to show the projection exposure apparatus in Embodiment 3 of the present invention.
Figure 12B:
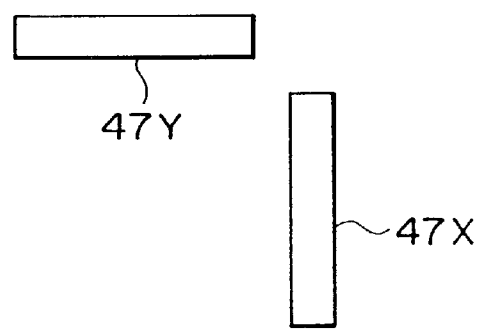
FIG. 12B is a plan view to show opening patterns formed on a reference mark plate 36 in FIG. 4.

Next, Embodiment 3 of the present invention is described referring to FIGS. 4, 12A, and 12B. The present embodiment is an example in which the present invention is applied to distortion measurement of the projection optical system. In FIG. 4, portions corresponding to those in FIG. 3 are denoted by same reference numerals and detailed description thereof will be omitted.

FIG. 4 shows the projection exposure apparatus of the present embodiment. In this FIG. 4, a test reticle 46 in which evaluation marks $M_{ij}$ (where i=1, 2, . . . ; j=1, 2, . . . ) are regularly formed is held on the reticle holder 9. FIG. 12A is an enlarged drawing of a part of the evaluation marks $M_{ij}$. As shown in this FIG. 12A, the evaluation marks $M_{ij}$ are arranged at predetermined pitch in the X direction and in the Y direction and each evaluation mark $M_{ij}$ is composed of dot patterns of fine openings distributed in a cross region in a light-shielding film. The size of each dot pattern is approximately equal to that of the contact hole patterns projected through the projection optical system 3 with pupil filter 4 in FIG. 4. A distribution of dot patterns in a rectangular region (a mark portion for X axis) extending in the Y direction in each evaluation mark $M_{ij}$ is a distribution in which an integral value in the Y direction is uniform, and a distribution of dot patterns in a rectangular region (a mark portion for Y axis) extending in the X direction is a distribution in which an integral value in the X direction is uniform.

Returning to FIG. 4, opening patterns 47X and 47Y (FIG. 12B) are formed on the reference mark plate 36 on the wafer stage 13. As shown in the enlarged drawing of FIG. 12B, the opening pattern 47X is an opening pattern of a slit extending in the Y direction, while the opening pattern 47Y is an opening pattern of a slit extending in the Y direction. Further, the width of a contour of a projected image onto the wafer stage 13, of the evaluation mark $M_{ij}$ on the test reticle 46 is set to be approximately equal to the width of the opening patterns 47X and 47Y.

In FIG. 4, in the same manner as U.S. Pat. 4,629,313 for example, a converging lens 48 and a photoelectric conversion device 49 are placed in order below the reference mark plate 36, so that light passing through the opening patterns on the reference mark plate 36 is converged on the light-receiving surface of the photoelectric conversion device 49 by the converging lens 48. Detection signals output from the photoelectric conversion device 49 are supplied to the processing unit 17B. Also supplied to the processing unit 17B are X coordinate and Y coordinate of the wafer stage 13 measured by the laser interferometer 15. The processing unit 17B obtains a distortion of the projection optical system 3, based on the thus supplied information. The other structure is the same as in FIG. 3.

When the distortion is measured with the pupil filter 4 set in the projection optical system 3 in the present embodiment, the exposure light IL1 is projected onto the test reticle 9 through the condenser lens 12 with the test reticle 46 set on the reticle holder 9. By this, an image of the evaluation mark $M_{ij}$ on the test reticle 46 is projected in the image field of the projection optical system 3. With stepping drive of the wafer stage 13 in this state, the image of each evaluation mark $M_{ij}$ is scanned in the X direction with the opening pattern 47X in the reference mark plate 36 and the image of each evaluation mark $M_{ij}$ in the Y direction with the opening pattern 47Y. On this occasion, the detection signal of the photoelectric conversion device 49 becomes maximum at a position where the opening pattern 47X coincides with the image of each evaluation mark $M_{ij}$ in the X direction, and the detection signal of the photoelectric conversion device 49 also becomes maximum at a position where the opening pattern 47Y coincides with the image of each evaluation mark $M_{ij}$ in the Y direction, whereby the processing unit 17B can detect the X coordinate and Y coordinate of the projected image of each evaluation mark $M_{ij}$. Comparing this detection result with data without distortion, distortion characteristics of the projection optical system 3 are measured.

In this case, even though the pupil filter 4 is placed on the pupil plane of the projection optical system 3 in the present embodiment, an angle of diffraction of diffracted light from each evaluation mark $M_{ij}$ with exposure light IL1 is large enough because the each evaluation mark $M_{ij}$ on the test reticle 46 is the aggregate of dot patterns. Accordingly, a lot of the diffracted light from the each evaluation mark M passes through the region around the pupil filter 4 on the pupil plane in the projection optical system 3 to accurately form the image of the each evaluation mark $M_{ij}$ on the wafer stage 13, whereby a position of the image of the each evaluation mark $M_{ij}$ can be detected with high accuracy. As a result, the distortion characteristics can be advantageously measured with high accuracy in the state where the pupil filter 4 is set in the projection optical system 3.

Embodiment 4

Figure 18A:
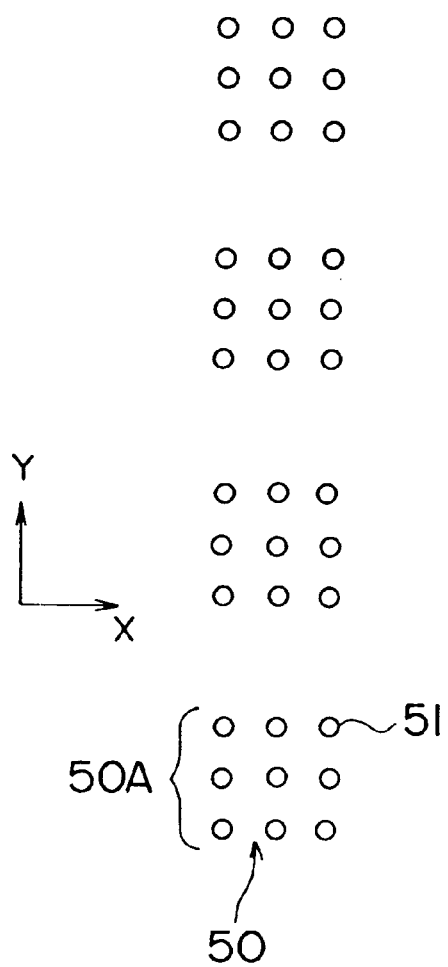
FIG. 18A is a plan view to show an evaluation mark 50 used in Embodiment 4 of the present invention.
Figure 18B:
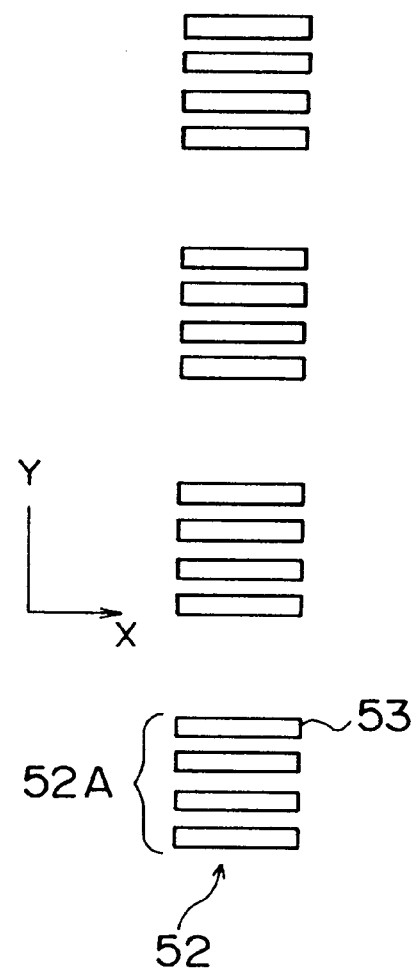
FIG. 18B is a plan view to show a modification of the evaluation mark used in Embodiment 4.

Next, Embodiment 4 of the present invention is described referring to FIGS. 18A and 18B. In the present embodiment, for example using the projection optical system of FIG. 4, the distortion characteristics of the projection optical system 3 are measured by double exposures with the pupil filter 4 being set. For this, the each evaluation mark $M_{ij}$ on the test reticle 46 in FIG. 4 is first replaced by an X-axis evaluation mark 50 consisting of an aggregate of dot patterns 51 of fine openings, as shown in FIG. 18A, and a Y-axis evaluation mark obtained by rotating the evaluation mark 50 by 90°.

The X-axis evaluation mark 50 is an array of partial patterns 50A arranged at predetermined pitch in the Y direction, and each partial pattern 50A is an array of dot patterns 51 regularly arranged in a substantially square region. In other words, the evaluation mark 50 is equivalent to a distribution of fine dot patterns 51 in each square pattern of the normal evaluation mark RM3 shown in FIG. 8, and the size of dot patterns 51 is approximately equal to that of the original patterns of contact hole patterns which the projection optical system 3 with pupil filter 4 can project to effect exposure.

In the present embodiment, first, all patterns on the test reticle, in which the evaluation marks each consisting of the X-axis evaluation mark 50 and Y-axis evaluation mark are regularly arranged, are projected through the projection optical system 3 with pupil filter 4 onto the wafer 5 in the projection exposure apparatus of FIG. 4 to effect exposure thereon. After that, images of selected evaluation marks out of those are projected onto the wafer 5 with stepping drive of the wafer stage 13 to effect exposure thereon, and after development, an amount of positional deviation is measured between two marks (resist patterns) formed by the double exposures. On this occasion, for example using an alignment system of the off-axis method not through the projection optical system, and the LSA (laser step alignment) method, a slit light spot scans the two marks and diffracted light emerging in a predetermined direction is detected to detect positions of the two marks. The way for processing the thus obtained measurement data is the same as in the ordinary method.

Also, in the present embodiment, because the evaluation mark 50 on the test reticle is the aggregate of fine dot patterns, the angle of diffraction of the diffracted light emerging therefrom is large enough. Therefore, even though the projection optical system 3 including the pupil filter 4 therein is used, exposure of an accurate image of the evaluation mark 50 is effected on the wafer. Accordingly, the distortion characteristics of the projection optical system 3 can be accurately evaluated. In addition, there is an advantage that the conventional measurement device can be used as the measurement device of the off-axis method as it is.

The X-axis evaluation mark 50 of FIG. 18A may be replaced by an X-axis evaluation mark 52 consisting of line-and-space patterns at small arrangement pitch as shown in FIG. 18B. This X-axis evaluation mark 52 is an array of partial patterns 52A arranged at predetermined pitch in the Y direction, and each partial pattern 52A is an array of line-and-space patterns 53 arranged at fine pitch in the Y direction in a substantially square region. In other words, the evaluation mark 52 is equivalent to a distribution of line-and-space patterns 53 arranged at fine pitch each in a square pattern of the ordinary evaluation mark RM3 shown in FIG. 8, and the pitch of the line-and-space patterns 53 is approximately equal to the arrangement pitch of the original patterns of contact hole patterns which the projection optical system 3 with pupil filter 4 can project for exposure. Even when the evaluation mark 52 as shown in FIG. 18B is used, the angle of diffraction of the diffracted light emerging therefrom is large enough, so that a lot of the diffracted light emerging passes through the region outside the pupil filter 4 in the projection optical system 3. Accordingly, exposure of an image of the evaluation mark 52 is accurately effected on the wafer, and, therefore, the distortion measurement of the projection optical system can be made with high accuracy.

This embodiment is an example in which the scale factor of the mark for distortion measurement of the projection optical system is changed from those in the ordinary cases, but an alignment mark for next step may be formed for example as an aggregate of fine dot patterns in the pattern area of reticle for ordinary contact hole pattern exposure. In this case, because exposure of the alignment mark is also accurately effected on the wafer in parallel with exposure of the contact hole patterns, the registration accuracy can be enhanced by using the alignment mark in exposure of a next circuit pattern in an upper layer.

Also, the above-described embodiments employed the reference mark 22, ISS mark 37X, evaluation mark $M_{ij}$, evaluation mark 50, evaluation mark 52, etc., but it is needless to mention that inverted marks obtained by inverting bright and dark portions (or transparent and non-transparent portions) of those marks can also be used. Further, the reference mark may be a diffraction grating mark that is a detection object in the so-called double beam interference method for emitting two beams of diffracted light coherent to each other in a same direction, and in that case, the detection also becomes easier even with the pupil filter set by increasing the scale factor while applying the present invention to such a diffraction grating mark.

Further, in addition to the applications in the above-described embodiments, base line measurement can also be made to obtain a difference (base line) between the detection center of alignment system in various TTL (through-the-lens) methods and an actual exposure position, using the reference mark formed on the reference mark plate (for example 21) on the wafer stage 13. Using the mark improved in the scale factor, as in the above-described embodiments, as the mark in this case, the base line measurement can be done with high accuracy even with the pupil filter set near the pupil plane of the projection optical system.

Though the pupil filters used in each embodiment of the present invention shield the imaging beam distributed in a circular area whose center coincides with the axis of the projection optical system PL, pupil filters which decrease the imaging beam distributed in the circular area can also be used. In this case, these pupil filters can be obtain by making the circular shielding part have predetermined transmissivity.

Next, as pupil filters for improving the imaging characteristics of fine isolated patterns such as the contact hole patterns, there are not only the light shielding type pupil filters as described above, but also pupil filters of the so-called SFINCS method in which coherence for example between transmitted light in the central portion and transmitted light in the peripheral portion is lowered near the pupil plane of the projection optical system, as suggested in U.S. Ser. No. 128,685, pupil filters of the so-called Super FLEX method in which a phase of transmitted light in the central portion of the pupil plane of the projection optical system is inverted with respect to that of transmitted light in the peripheral portion for example, as presented in Extended Abstracts 29a-ZC-8, 9 (The Spring Meeting, 1991); The Japan Society of Applied Physics and Related Societies, etc. The Super FLEX method is also disclosed in U.S. Pat. No. 5,144,362, EP. No. 485,062A, etc. When one of such pupil filters is set near the pupil plane of the projection optical system, the pupil filter could also hinder good imaging in observing a mark through the projection optical system or in projecting a measurement mark through the projection optical system.

Then, also in such cases, if the scale factor of the mark of observation object or projection object is changed, light from the mark can pass a region with high transmittance and nearly constant phase distribution (or amplitude distribution or coherent state) in the pupil filter near the pupil plane of the projection optical system, whereby observation or projection of the mark can be well conducted. In other words, the scale factor can be determined in such a manner that the light from the mark passes within a region with constant optical function (property) in the pupil filter.

Further, as a pupil filter improved in resolution and depth of focus for exposure of relatively dense periodic patterns such as the line-and-space patterns, there is suggested a pupil filter in which a transmittance in a circular region about the optical axis is different from that in an annular region around the circular region, for example as described in Extended Abstracts 12a-ZF-7 (The Autumn Meeting, 1991); The Japan Society of Applied Physics and Extended Abstracts 30p-NA-5 (The Spring Meeting, 1992); The Japan Society of Applied Physics and Related Societies. When such a pupil filter is used, good imaging could be hindered by the pupil filter in observing the mark through the projection optical system or in exposure of the measurement mark through the projection optical system.

Also in such cases, increasing the scale factor of the mark of observation object or projection object, the light from the mark can pass through a region having a high transmittance within the pupil filter near the pupil plane of the projection optical system, whereby observation or projection of the mark can be well made. Normally, the pupil filter for periodic patterns has a smaller transmittance in the center circular region than that of the peripheral annular region. Accordingly, the scale factor of mark can be determined in this case so that the light from the mark passes the peripheral annular region. If the scale factor of the mark is determined so that the light from mark passes especially in the peripheral region (the region with constant optical property in the pupil filter) out of the effective pupil plane of the projection optical system 3 for example in FIG. 3, the effective diameter of the pupil plane, or the numerical aperture of the projection optical system 3 needs to be taken into account. This is because part of the light from the mark becomes away from the projection optical system 3 as the scale factor (pitch etc.) of mark becomes smaller.

Embodiments 5 to 7 of the present invention are next described.

Figure 19:
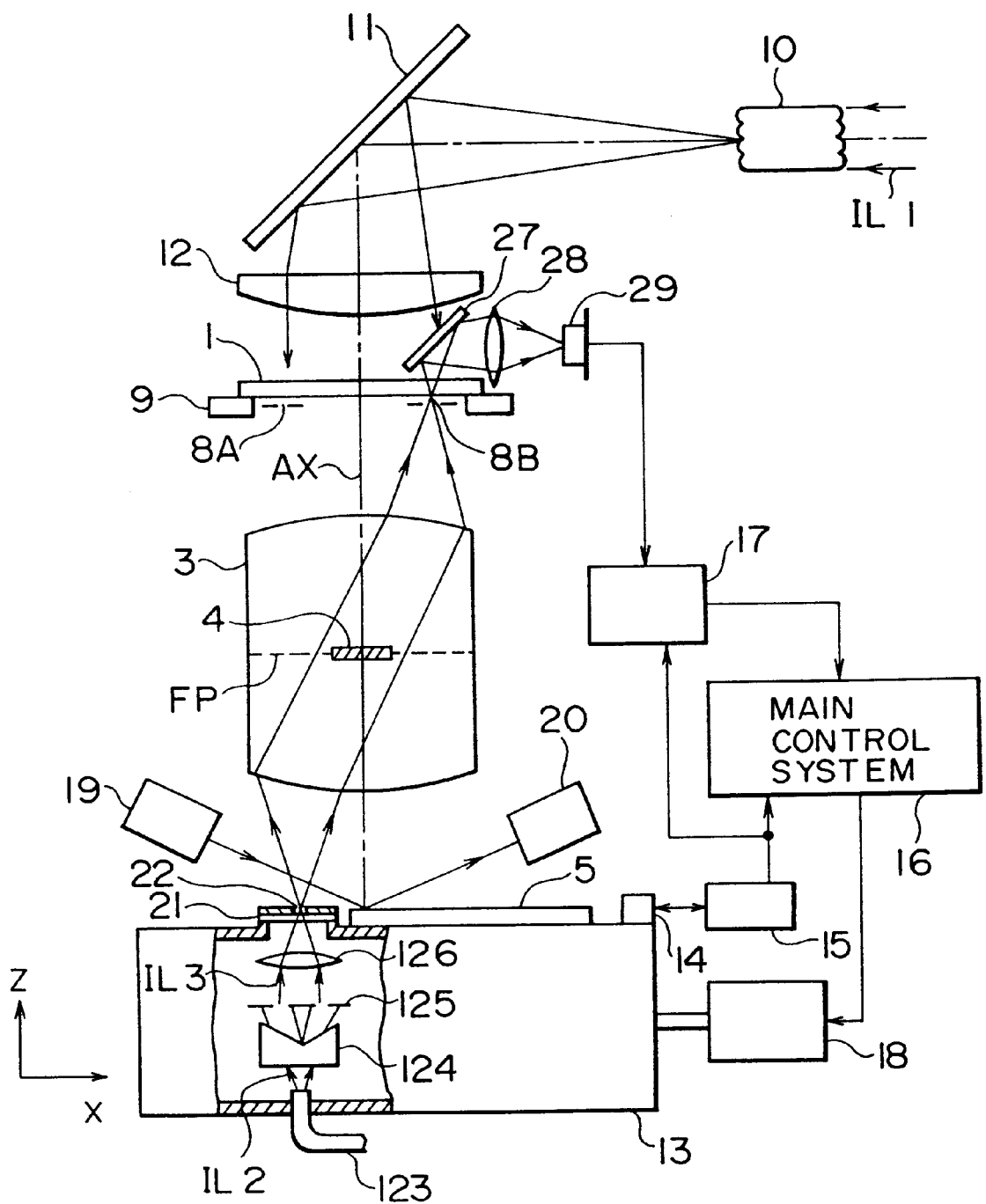
FIG. 19 is a structural drawing to show Embodiment 5 of the projection exposure apparatus according to the present invention.

In the projection exposure apparatus of the present invention, for example as shown in FIG. 19, in the case where the optical correction plate 4 is a light shielding type pupil filter for shielding a predetermined range of region about the optical axis of the projection optical system 3, an illumination system 123–126 in the mark detection system illuminates the reference mark 22 with illumination light so that the zeroth-order light passing the reference mark 22 passes through an annular region (transparent region) outside the light-shielding portion in the pupil filter. By this, the light emerging from the reference mark 22 is received by a photoelectric detector 29 in sufficient quantity of light even after transmission through the projection optical system 3, whereby the reference mark 22 can be accurately detected.

Where the optical correction plate 4 has for example a circular region with high transmittance and an annular region with low transmittance around the circular region, the illumination system 123–126 in the mark detection system illuminates the reference mark 22 so that the zeroth-order light passing the reference mark 22 passes the circular region with high transmittance. By this, the light emerging from the reference mark 22 is received by the photoelectric detector 29 in sufficient quantity of light even after transmission through the projection optical system 3. Conversely, where the transmittance of the surrounding annular region is high, the reference mark 22 is illuminated so that the zeroth order light passing the reference mark 22 passes through the annular region with high transmittance, whereby the reference mark 22 can be accurately detected.

There are roughly two ways for making the zeroth-order light from the reference mark 22 with the illumination light from the illumination system of the mark detection system pass for example the annular region on the Fourier transform plane of the projection optical system 3. First, as shown in FIG. 20B, the utilization factor is high when the illumination light is obliquely projected to the reference mark 22a. On the other hand, in the case where after once illuminating a light-shielding plate 125 having an annular opening, light transmitted by the light-shielding plate 125 is projected onto the reference mark 22 through a transform optical system 126, the whole of the annular region can be utilized so as to improve the imaging characteristics.

Figure 21:
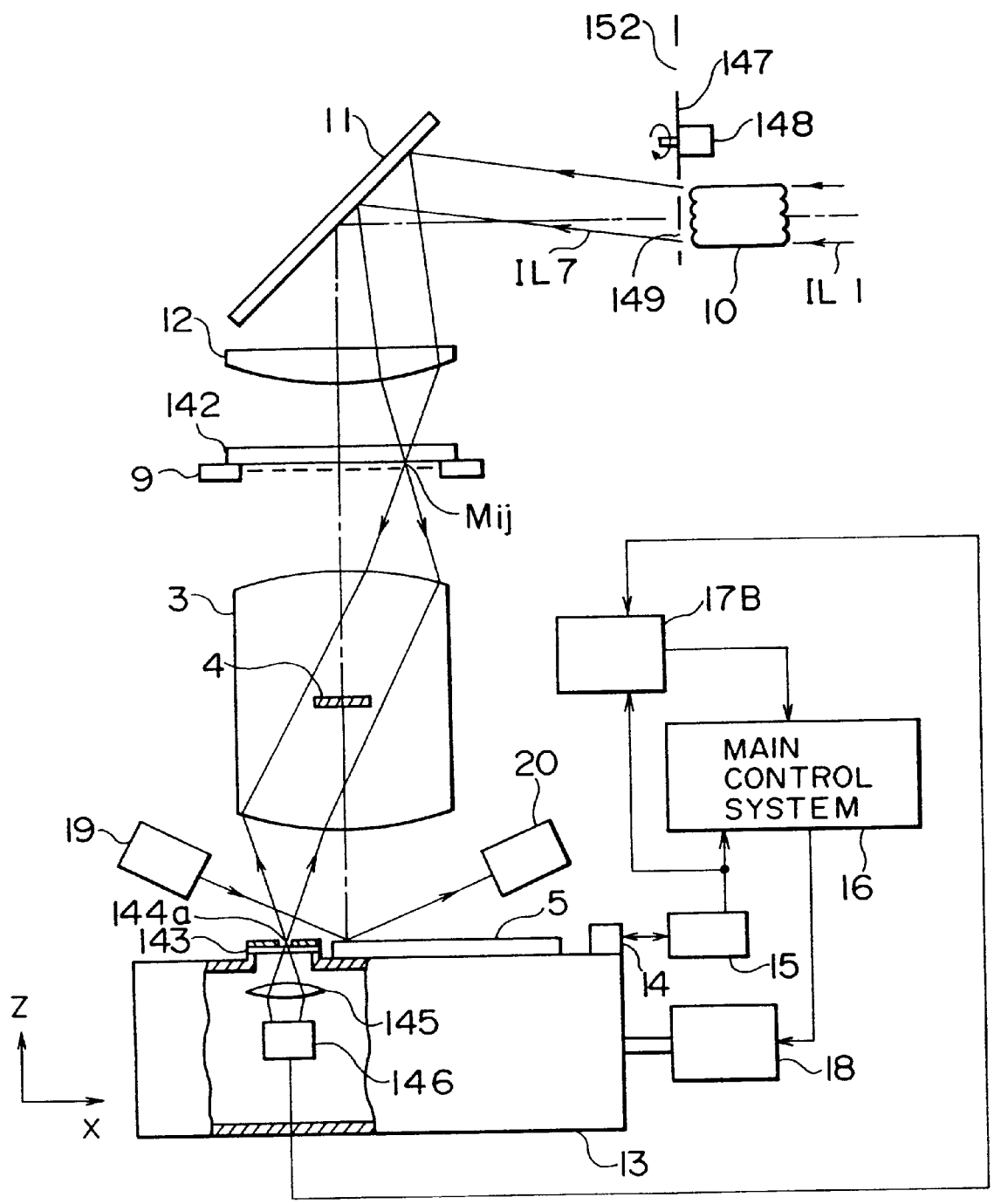
FIG. 21 is a structural drawing to show the projection exposure apparatus in Embodiment 7 of the present invention.

If the reference mark $M_{ij}$ as detection object or projection object is provided on the mask 142, for example as shown in FIG. 21, there are cases that the illumination optical system 10–12, 147 for illuminating the mask 142 can also serve as the illumination system of the mark detection system. This permits the entire optical system to be simplified.

Embodiment 5

Figure 22:
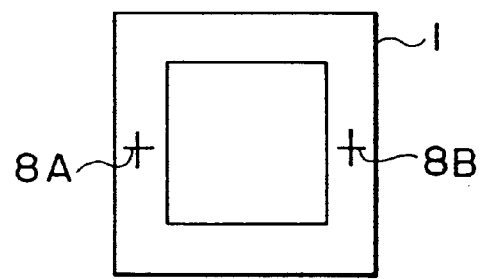
FIG. 22 is a plan view to show alignment marks 8A and 8B on a reticle 1 in FIG. 19.
Figure 23:
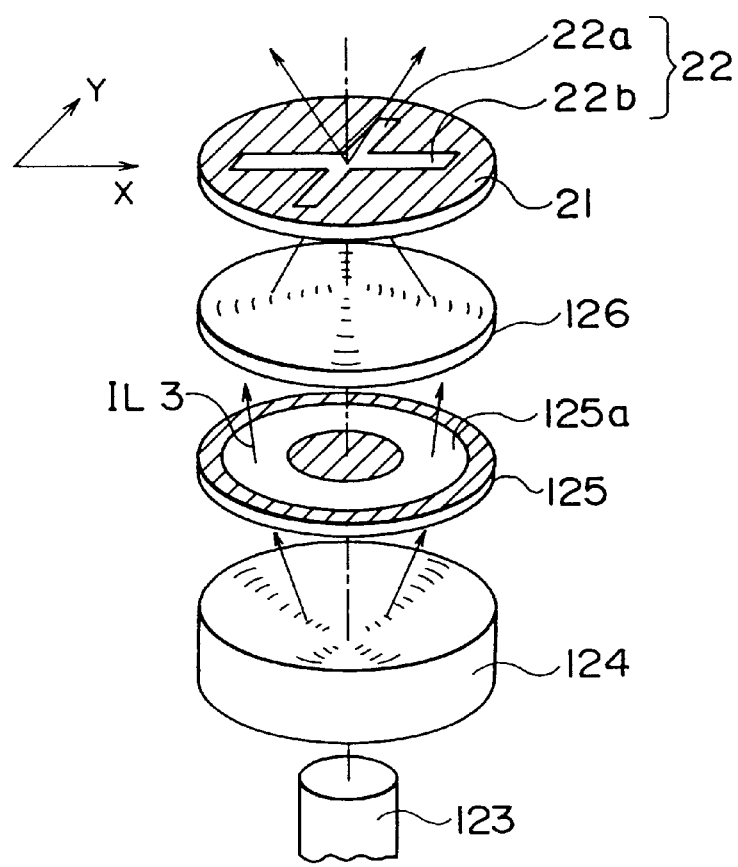
FIG. 23 is a perspective view to show structure of the stage emission type illumination system in FIG. 19.

Embodiment 5 of the projection exposure apparatus according to the present invention is next described referring to FIGS. 19, 22, and 23. The present embodiment is an example in which the present invention is applied to cases for detecting a position or a rotational angle of reticle through the projection optical system by the ISS method, in order to perform reticle alignment.

Alignment marks 8A and 8B are cross light-shielding patterns formed in a glass substrate portion (transparent portion) as shown in FIG. 22.

Although not shown, an aperture stop is set on the pupil plane FP and this aperture stop defines the outer radius of an imaging light beam passing through the pupil plane FP.

The ISS mark 22 is a cross opening pattern, as shown in FIG. 23, consisting of an X-axis slit mark 22a extending in the Y direction and formed in a light-shielding film, and a cross opening pattern consisting of a Y-axis slit mark 22b extending in the X direction, and the size of the reference mark 22 is approximately equal to that of a projected image of the alignment mark 8A or 8B by the projection optical system 3.

In FIG. 19, the present embodiment includes a stage emission type illumination system for illuminating the ISS mark 22 and alignment mark 8B (or 8A) from the bottom side of the reference mark plate 21. When a position or rotational angle of reticle is detected using the illumination system, the illumination light IL2 of the same wavelength as that of the exposure light IL1 is guided from the light source for exposure (not shown) through an optical fiber 123. The illumination light IL2 outgoing from the optical fiber 123 enters a light-shielding plate 125 in the form of a light beam of a nearly annular distribution through a cone prism 124.

FIG. 23 shows the stage emission type illumination system in FIG. 19. In FIG. 23, the light-shielding plate 125 has an annular opening 125a formed about the optical axis of the illumination system (which is an axis parallel to the optical axis AX of the projection optical system 3 in FIG. 19). The illumination light IL3 outgoing from the annular opening 125a is projected onto the bottom part of the ISS mark 22 on the reference mark plate 21 through a converging lens 126. On this occasion, the illumination light outgoing from the optical fiber 123 efficiently illuminates the annular opening 125a of the light-shielding plate 125 under the action of the cone prism 124, and the surface in which the annular opening 125a is formed is in the relation of Fourier transform with the surface in which the ISS mark 22 is formed, with respect to the converging lens 126. Accordingly, the distribution of the zeroth-order light outgoing from the ISS mark 22 includes oblique rays in a cone shape about the optical axis of the illumination system.

Further, returning to FIG. 19, when the ISS mark 22 is coincident with the image plane of the projection optical system 3, the formation surface of the ISS mark 22 is in the relation of Fourier transform with the pupil plane FP of the projection optical system 3, so that the pupil plane FP (set plane of the pupil filter 4) is conjugate with the set plane of the light-shielding plate 125. In the present embodiment, the inner radius of the annular opening 125a of the light-shielding plate 125 is thus set to be equal to the radius of a conjugate image of the pupil filter 4 on the light-shielding plate 125 of the light-shielding portion, and the outer radius of the annular opening 125a is set to be equal to the radius of the aperture stop (not shown) on the pupil plane FP. In other words, a conjugate image of the annular opening 125a on the pupil plane FP of the projection optical system 3 is superimposed on the region where the imaging light beam can pass on the pupil plane FP (which is the transparent portion in the pupil filter 4). Therefore, all the illumination light (the zeroth-order light) passing without change through the ISS mark 22 passes through the region between the light-shielding portion and the aperture stop in the pupil filter 4 on the pupil plane FP of the projection optical system 3 then to travel toward the reticle 1.

In FIG. 19, the zeroth-order light passing without change through the ISS mark 22 and a lot of diffracted light emerging from the ISS mark 22 passes through the region outside the light-shielding portion of the pupil filter 4 on the pupil plane FP of the projection optical system 3, and thereafter forms an image of the ISS mark 22 on the pattern-formed surface of reticle 1 through the projection optical system 3. The illumination light thus emerging from the ISS mark 22 and then passing the reticle 1 is reflected by a mirror 27 for bending the optical path, and thereafter is converged through a converging lens 28 on the light-receiving surface of the photoelectric conversion device 29. Supplied to the processing unit 17 is a detection signal obtained by photoelectric conversion of the light received by the photoelectric conversion device 29. The processing unit 17 calculates X coordinate or Y coordinate for example when the image of ISS mark 22 coincides with the alignment mark 8B, from the X coordinate or Y coordinate of the wafer stage 13 when the supplied detection signal is minimum, and then supplies it to the main control system 16 (the details thereof will be described hereinafter).

Next described is an example of operation of reticle alignment in the present embodiment. In FIG. 19, in the state where the exposure light IL1 is interrupted, the reticle 1 is first roughly positioned and secured on the reticle holder 9. After that, in the state where the illumination light IL2 is outgoing from the optical fiber 123, the wafer stage 13 is actuated to move the ISS mark 22 on the reference mark plate 21 in the +X direction to a position conjugate with the alignment mark 8B of reticle 1. The illumination light (the zeroth-order light and the diffracted light etc.) passing through the ISS mark 22 passes through the surroundings of the light-shielding portion of the pupil filter 4 in the projection optical system 3 to form an image of the ISS mark 22 on the +X-directional side of the alignment mark 8B of reticle 1.

Moving the wafer stage 13 in the −X direction (in the first measurement direction) in this state, the illumination light emerging from the ISS mark 22 and passing through the projection optical system 3 and reticle 1 is received by the photoelectric conversion device 29, and the processing unit 17 monitors its detection signals. When with movement of the wafer stage 13 the X-axis slit mark 22a of the ISS mark 22 (FIG. 23) comes to coincide with the light-shielding portion extending in the Y direction in the alignment mark 8B, the X-axis slit mark 22a becomes shielded by the alignment mark 8B, thereby making the quantity of light received by the photoelectric conversion device 29 small. The processing unit 17 holds the X coordinate of the wafer stage 13 at this moment as an X coordinate of the alignment mark 8B and supplies it to the main control system 16.

Similarly, moving the wafer stage 13 in the Y direction, a Y coordinate of the wafer stage 13 is obtained when the Y-axis slit mark 22b of the ISS mark 22 coincides with the light-shielding portion extending in the X direction in the alignment mark 8B. Another light-receiving system (not shown) is also set above the alignment mark 8B of reticle 1 in FIG. 19, and using this light-receiving system, X coordinate and Y coordinate of the wafer stage 13 are measured when the image of ISS mark 22 coincides with the alignment mark 8A. A rotational angle of the reticle 1 is also measured from the coordinates of these two points. The alignment of reticle 1 is performed by driving the thus measured coordinates of alignment marks 8A and 8B into predetermined reference coordinates.

In this case, the zeroth-order light passing the ISS mark 22 intersects at a predetermined angle with the optical axis of the stage emission type illumination system in the present embodiment. Since the optical axis of the stage emission type illumination system is parallel to the optical axis AX of the projection optical system 3, the zeroth-order light from the ISS mark 22 intersects at the predetermined angle also with the optical axis AX of the projection optical system 3. The predetermined angle is approximately equal to an angle of diffraction matching with the light-shielding portion of pupil filter 4 suitable for contact hole patterns of the size to be projected by the projection optical system 3. Namely, the zeroth-order light from the ISS mark 22 passes through the peripheral portion around the light-shielding portion of the pupil filter 4 (the transparent portion of pupil filter 4) on the pupil plane FP of the projection optical system 3, and is not interrupted by the light-shielding portion of the pupil filter 4. By this, the zeroth-order light that is large in light quantity among the light from the ISS mark 22 passes through the projection optical system 3, so that an image of the ISS mark 22 formed on the pattern-formed surface of reticle 1 becomes sufficiently bright. Accordingly, when the photoelectric conversion device 29 receives the light emerging from the ISS mark 22 and thereafter passing through the projection optical system 3 and reticle 1, a change in light quantity becomes great between when the ISS mark 22 is shielded by the alignment mark 8B on the reticle 1 and when not shielded, whereby coordinates at the moment when the ISS mark 22 coincides with the alignment mark 8B can be measured at high SN ratio and high accuracy.

In the present embodiment the illumination light IL2 outgoing from the optical fiber 123 is projected as concentrated in the annular opening 125a in the light-shielding plate 125 through the axially symmetric cone prism 124. Accordingly, there is another advantage that the utility factor of the illumination light IL2 guided through the optical fiber 123 is high.

In Embodiment 5 the size of the annular opening 125a in the light-shielding plate 125 is the same as that of the region conjugate with the transparent region around the light-shielding portion of pupil filter 4 on the pupil plane FP of the projection optical system 3, but the inner radius of the annular opening 125a may be made smaller to some extent than the radius of a conjugate image of the light-shielding portion in the pupil filter 4 or larger to some extent than it. Further, the outer radius of the annular opening 125a may be made larger to some extent than the radius of a conjugate image of the aperture stop on the pupil plane FP or smaller to some extent than it. In this case, if the size of the annular opening 125a is arranged to be wider than the region conjugate with the transparent portion in the periphery of the pupil filter 4 on the pupil plane FP of the projection optical system 3, higher-order diffracted light emerging from the ISS mark 22 comes to pass through the region around the light-shielding portion in the pupil filter 4, thus enhancing the resolution of the image of ISS mark 22.

The light-shielding plate 125 makes the illumination light oblique in Embodiment 5, but another arrangement may be employed, for example such that the exit end of optical fiber 123 is made in an annular shape and is set on the front focal point of the converging lens 126. This arrangement can obviate the cone prism 124 and light-shielding plate 125, thus simplifying the structure.

Figure 20A:
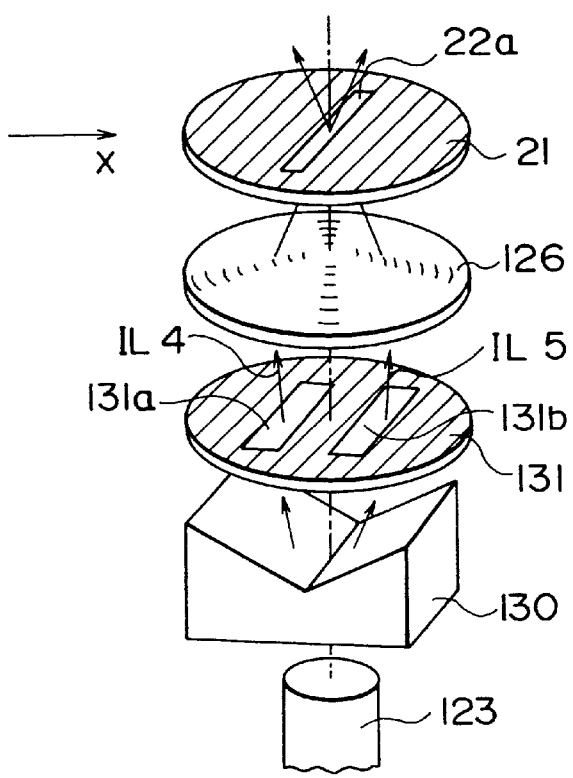
FIG. 20A is a perspective view to show a first modification of the stage emission type illumination system in FIG. 23.
Figure 20B:
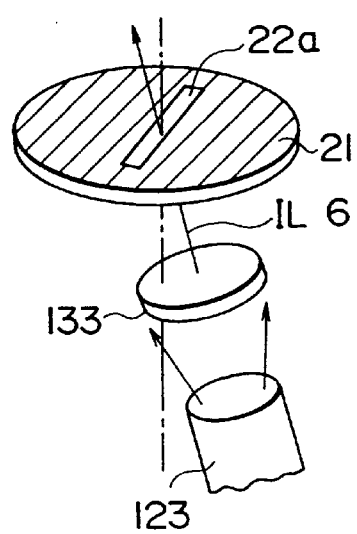
FIG. 20B is a perspective view to show a second modification of the stage emission type illumination system in FIG. 23.

The ISS mark is the two-dimensional mark of cross in the above embodiment, but it may be a one-dimensional mark of slit opening as shown in FIGS. 20A and 20B. In this case, the stage emission type illumination system should also be modified in structure according to it.

First, in the modification of FIG. 20A, an X-axis slit mark 22a is formed as extending in the Y direction on the reference mark plate 21. Below the reference mark plate 21 there are a converging lens 126, a light-shielding plate 131, a bisectional cone prism 130, and an optical fiber 123 arranged in order. Two openings 131a and 131b are formed in symmetry in the X direction with respect to the optical axis of the illumination system on the light-shielding plate 131. Also in this case, the formation plane of the X-axis slit mark 22a is in the relation of Fourier transform with the opening-formed surface of the light-shielding plate 131 with respect to the converging lens 126. Also, when the illumination system in FIG. 20A replaces the illumination system of the reference mark plate 21 in FIG. 19, the two openings 131a and 131b are located in a region conjugate on the light-shielding plate 131 with the transparent region inside the aperture stop (not shown) and outside the light-shielding portion in the pupil filter 4 on the pupil plane FP of the projection optical system 3.

Then the illumination light outgoing from the optical fiber 123 is split into two in two directions by the bisectional cone prism 130, to illuminate the openings 131a and 131b in the light-shielding plate 131 as concentrated thereon, so that illumination light IL4 and IL5 passing through the openings 131a and 131b, respectively, is projected so as to intersect with each other on the X-axis slit mark 22a through the converging lens 126. The zeroth-order light and selected diffracted light emerging from the X-axis slit mark 22a is let to pass the region outside the light-shielding portion of the pupil filter 4 in the projection optical system 3 of FIG. 19 to reach the reticle 1, and the light further transmitted by the reticle 1 is received by the photoelectric conversion device 29. Then, moving the wafer stage 13 in the X direction, an X coordinate is detected when the X-axis slit mark 22a coincides with the alignment mark 8B.

Also in this case, the light from the openings 131a and 131b illuminates the X-axis slit mark 22a at a predetermined angle relative to the optical axis of the stage emission type illumination system. Accordingly, the zeroth-order light of the light passing through the X-axis slit mark 22a forms an image of the mark 22a on the pattern-formed surface of reticle 1 in sufficient light quantity without being interrupted by the light-shielding portion in the pupil filter 4 on the pupil plane FP of the projection optical system 3. Accordingly, a position or a rotational angle of reticle can be measured with good accuracy.

Next, in the modification of FIG. 20B, the X-axis slit mark 22a is also formed on the reference mark plate 21. Further, a converging lens 133 and an optical fiber 123 are arranged in an oblique posture below the reference mark plate 21, and the exit plane of the optical fiber 123 is approximately in the relation of Fourier transform with the X-axis slit mark 22a with respect to the converging lens 133. Namely, the optical axis of the illumination system consisting of the optical fiber 123 and converging lens 133 is inclined by a predetermined angle in the X direction (in the XZ plane) relative to the normal line (the axis parallel to the optical axis AX of projection optical system 3) to the reference mark plate 21. The predetermined angle in this case is determined so that the zeroth-order light from the X-axis slit mark 22a, and either the +first-order light or the −first-order light from the X-axis slit mark 22a is incident approximately in symmetry with respect to the optical axis AX of the projection optical system 3 in FIG. 19 and so that those two light beams pass through the transparent portion in the pupil filter 4 on the pupil plane FP of projection optical system 3.

In this example, the illumination light outgoing from the optical fiber 123 is obliquely projected as illumination light IL6 through the converging lens 133 onto the X-axis slit mark 22a. The zeroth-order light and either the +first-order diffracted light or the −first-order diffracted light emerging from the X-axis slit mark 22a passes through the transparent portion in the pupil filter 4 in the projection optical system 3 of FIG. 19 to reach the reticle 1, and the light further transmitted by the reticle 1 is received by the photoelectric conversion device 29. Then, moving the wafer stage 13 in the X direction, an X coordinate is detected when the X-axis slit mark 22a coincides with the alignment mark 8B. Also in this case, the zeroth-order light and either the +first-order diffracted light or the −first-order diffracted light emerging from the X-axis slit mark 22a forms an image of the mark 22a on the pattern-formed surface of reticle 1 in sufficient light quantity without being interrupted by the light-shielding portion in the pupil filter 4 on the pupil plane FP of projection optical system 3. Accordingly, a position or a rotational angle of reticle can be measured with good accuracy.

Embodiment 6

Figure 24:
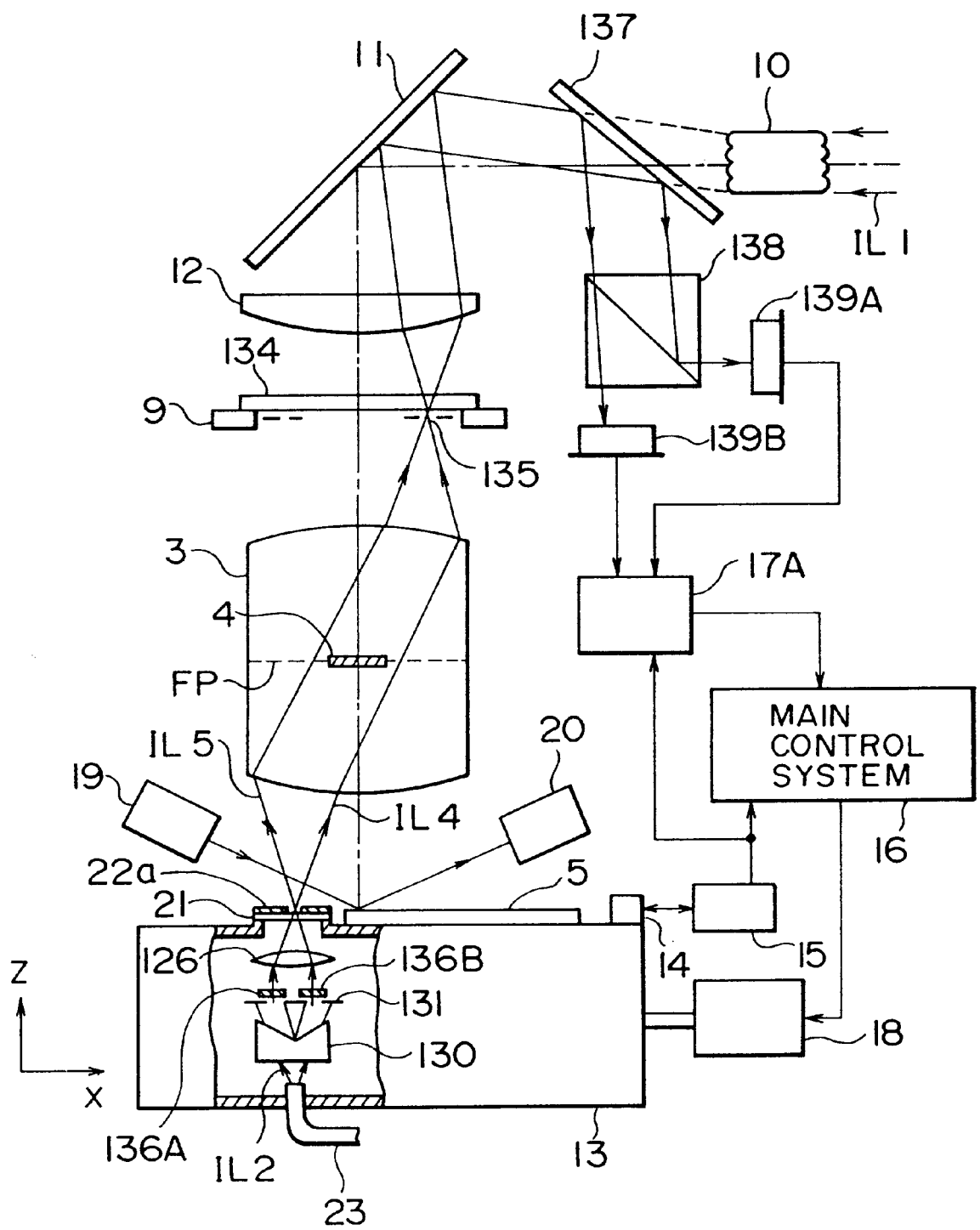
FIG. 24 is a structural drawing to show the projection exposure apparatus in Embodiment 6 of the present invention.
Figure 25:
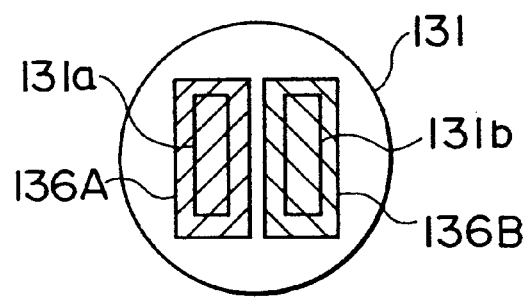
FIG. 25 is a plan view to show a positional relation between a light-shielding plate 131 and polarizing plates 136A, 136B in FIG. 24.
Figure 26:
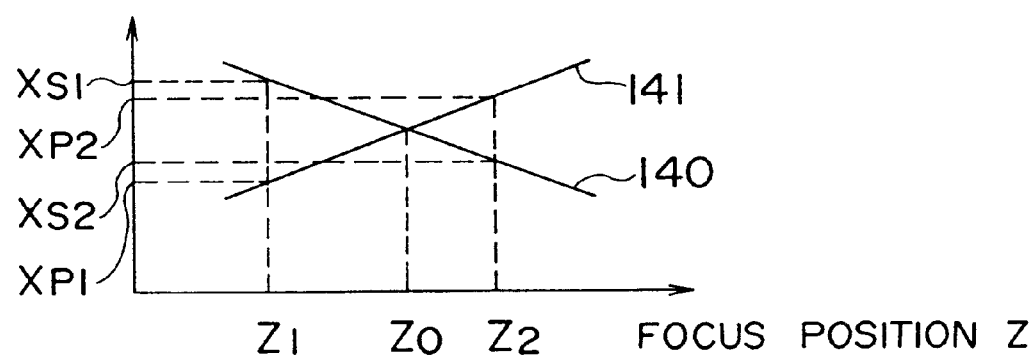
FIG. 26 is an explanatory drawing where a best focus position of the projection optical system 3 is measured in the projection exposure apparatus of FIG. 24.

Next, Embodiment 6 of the present invention is described referring to FIGS. 24 to 26. The present embodiment is an example in which the present invention is applied to cases for measuring the image plane position (best focus position) of projection optical system, using the ISS system. In FIG. 24, portions corresponding to those in FIGS. 19, 20A, and 20B are denoted by same reference numerals and detailed description thereof will be omitted. Also, the present embodiment is an example in which the present invention is applied to the focusing apparatus as disclosed in Japanese Laid-open Patent Application No. 1-262624.

FIG. 24 shows the projection exposure apparatus of the present embodiment. In this FIG. 24, an alignment mark 135 consisting of a linear opening pattern extending in the Y direction is formed in the light-shielding film outside the pattern area (the region where the original patterns of contact hole patterns are formed) on the reticle 134 held on the reticle holder 9. The X-axis slit mark 22a is formed on the reference mark plate 21 on the wafer stage 13.

An illumination system similar to that in FIG. 20A is set below the X-axis slit mark 22a, but it is different in that in this FIG. 24 polarizing plates 136A and 136B are placed on the light-shielding plate 131. In this case, the illumination light IL2 in a random polarization state outgoing from the optical fiber 123 passes through the bisectional cone prism 130 to illuminate the two openings 131a and 131b (FIG. 25) in the light-shielding plate 131 as concentrated thereon. The polarizing plates 136A and 136B having mutually perpendicular directions of polarization are set as shown in FIG. 25 so as to cover those openings 131a and 131b. The present embodiment employs a polarization beam splitter 138 as detailed later. A linearly polarized state of the illumination light passing through the polarizing plate 136A is s polarization with respect to the polarization beam splitter 138, while a linearly polarized state of the illumination light passing through the polarizing plate 136B is p polarization with respect to the polarization beam splitter 138.

Returning to FIG. 24, the illumination light IL4 passing through the polarizing plate 136A and the illumination light IL5 passing through the polarizing plate 136B is converged to intersect with each other on the X-axis slit mark 22a through the converging lens 126, and the zeroth-order light and selected diffracted light of the illumination light IL4 and IL5 emerging from the X-axis slit mark 22a passes outside the light-shielding portion in the pupil filter 4 in the projection optical system 3 to form a conjugate image of the X-axis slit mark 22a on the reticle 134. The illumination light emerging from the X-axis slit mark 22a and thereafter passing through the projection optical system 3 and reticle 134 passes through the condenser lens 12 and via the mirror 11 to reach the beam splitter 137, and the illumination light reflected by the beam splitter 137 enters the polarization beam splitter 138. The illumination light IL4 of s polarization is reflected by the polarization beam splitter 138 to enter a light-receiving surface of a first photoelectric conversion device 139A and the illumination light IL5 of p polarization passes through the polarization beam splitter 138 to enter a light-receiving surface of a second photoelectric conversion device 139B.

Detection signals of the photoelectric conversion devices 139A and 139B are supplied to the processing unit 17A. Also supplied to the processing unit 17A are X coordinate and Y coordinate of the wafer stage 13 measured by the laser interferometer 15. The processing unit 17A obtains the best focus position of projection optical system 3, based on the thus supplied detection signals and coordinates, and supplies the information on best focus position to the main control system 16.

Next described is an example of operation in obtaining the best focus position of projection optical system 3 in the present embodiment. This kind of operation is performed when calibration is made for an autofocus sensor consisting for example of a projection optical system 19 and a light-receiving system 20. First, supposing a current Z coordinate of the Z stage in the wafer stage 13 is $Z_1$, the wafer stage 13 is driven in the state where the height of Z stage is fixed, thereby setting the X-axis slit mark 22a on the reference mark plate 21 at a position shifted in the +X direction in the region where a conjugate image of the alignment mark 135 on the reticle 134 is projected. After that, in the state where the illumination light IL2 is projected from the optical fiber 123, the wafer stage 13 is driven to scan the X-axis slit mark 22a in the −X direction to monitor the detection signals from the photoelectric conversion devices 139A and 139B.

In this case, after having passed through one opening 131a in the light-shielding plate 131 and when the conjugate image of X-axis slit mark 22a by the illumination light (including the zeroth-order light and diffracted light) IL4 of s polarization emerging from the X-axis slit mark 22a coincides with the alignment mark 135, the detection signal of the photoelectric conversion device 139A becomes minimum. The X coordinate $X_{S1}$ at that moment is stored. In parallel with it, after having passed the other opening 131b in the light-shielding plate 131 and when the conjugate image of X-axis slit mark 22a by the illumination light (including the zeroth-order light and diffracted light) IL5 of p polarization emerging from the X-axis slit mark 22a coincides with the alignment mark 135, the detection signal of photoelectric conversion device 139B becomes minimum. Thus, the X coordinate $X_{P1}$ at that moment is stored.

A center beam of the illumination light IL4 of s polarization emerging from the X-axis slit mark 22a intersects at a predetermined angle (say, angle $\theta_1$) with the normal line to the reference mark plate 21, while a center beam of the illumination light IL5 of p polarization emerging from the X-axis slit mark 22a intersects at an angle $-\theta_1$ with the normal line to the reference mark plate 21. Therefore, supposing the Z coordinate $Z_1$ is shifted by $\Delta Z_1$ from the best focus position $Z_0$, the measured X coordinates $X_{S1}$ and $X_{P1}$ deviate by $\Delta Z_1 \cdot \tan\theta_1$ and $-\Delta Z_1 \cdot \tan\theta_1$, respectively, from the original position $X_0$, as shown in FIG. 26.

Next, the Z coordinate of the Z stage in the wafer stage 13 is moved to $Z_2$, the wafer stage 13 is similarly moved in the X direction, and the detection signals of the photoelectric conversion devices 139A and 139B are monitored, whereby an X coordinate $X_{S2}$ is obtained when the conjugate image of the X-axis slit mark 22a by the illumination light IL4 coincides with the alignment mark 135 and an X coordinate $X_{P2}$ is also obtained when the conjugate image of the X-axis slit mark 22a by the illumination light IL5 coincides with the alignment mark 135. Supposing the Z coordinate $Z_2$ is located for example on the opposite side to the Z coordinate $Z_1$ with respect to the best focus position $Z_0$, the X coordinate $X_{S2}$ and the X coordinate $X_{P2}$ are located as shown in FIG. 26.

Then, in FIG. 26, the best focus position of projection optical system 3 is given by an intersecting point, the Z coordinate $Z_0$, between a straight line 140 passing $(Z_1, X_{S1})$ and $(Z_2, X_{S2})$ out of (the Z coordinates, the X coordinates) and a straight line 141 passing $(Z_1, X_{P1})$ and $(Z_2, X_{P2})$ out of them. This way of obtaining the best focus position is disclosed in Japanese Laid-open Patent Application No. 1-262624.

In this case, the present embodiment is so arranged that the openings 131a and 131b are provided on the light-shielding plate 131 and that the zeroth-order light from the X-axis slit mark 22a by the beams passing the openings 131a and 131b passes the region outside the light-shielding portion in the pupil filter 4 on the pupil plate FP of projection optical system 3. Accordingly, even if the pupil filter 4 is set, a bright conjugate image of the X-axis slit mark 22a (including a defocused state thereof) is formed on the reticle 134, whereby the best focus position of the projection optical system 3 with the pupil filter 4 set therein can be measured with high accuracy.

Embodiment 7

Next, Embodiment 7 of the present invention is described referring to FIGS. 21, 27, 28A, and 28B. The present embodiment is an example in which the present invention is applied to cases for measuring the distortion of projection optical system. In FIG. 21, portions corresponding to those in FIG. 19 are denoted by same reference numerals and detailed description thereof will be omitted.

Figures 28A, 28B:
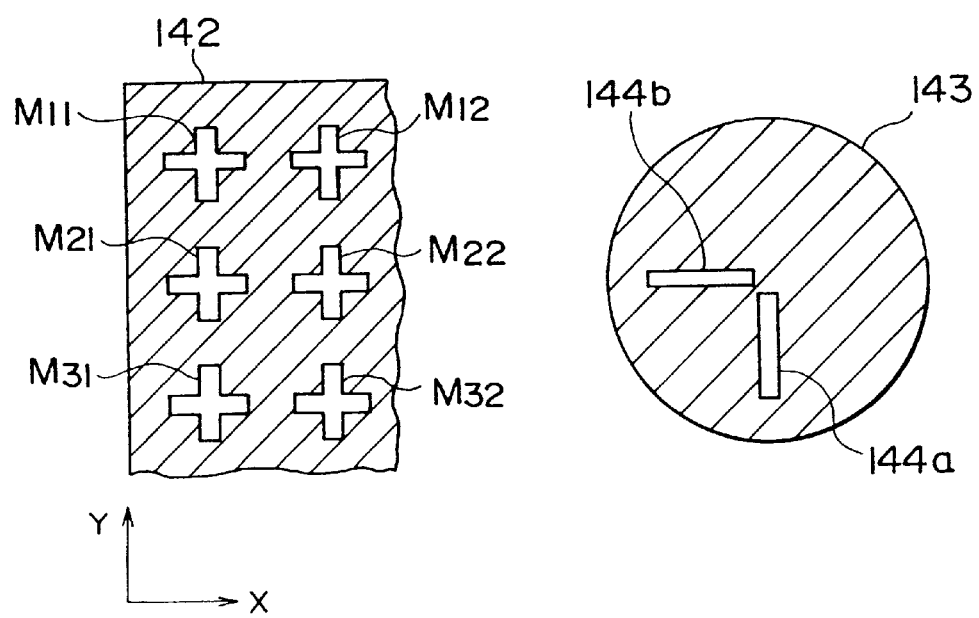
FIG. 28A is a plan view to show a part of the evaluation mark in FIG. 21.
FIG. 28B is a drawing to show opening patterns formed on the reference mark plate 43 in FIG. 21.

FIG. 21 shows the projection exposure apparatus of the present embodiment. In FIG. 21, a test reticle 142 in which evaluation marks $M_{ij}$ (where i=1, 2, . . . ; j=1, 2, . . . ) are regularly formed is held on the reticle holder 9. FIG. 28A shows an enlarged view of part of evaluation marks $M_{ij}$. As shown in this FIG. 28A, the evaluation marks $M_{ij}$ are arranged at predetermined pitch in the X direction and in the Y direction, and each evaluation mark $M_{ij}$ is a cross opening pattern formed in a light-shielding film.

Returning to FIG. 21, opening patterns 144a and 144b (FIG. 28B) are formed on the reference mark plate 143 on the wafer stage 13. As shown in the enlarged drawing of FIG. 28B, the opening pattern 144a is a slit opening pattern extending in the Y direction and the opening pattern 144b is a slit opening pattern extending in the X direction. The width of a contour of a projected image of each evaluation mark $M_{ij}$ on the test reticle 142 onto the wafer stage 13 is set to be approximately equal to the width of the opening patterns 144a and 144b.

In FIG. 21, a converging lens 145 and a photoelectric conversion device 146 are placed in order below the reference mark plate 143, so that light having passed the opening patterns on the reference mark plate 143 is converged on a light-receiving surface of the photoelectric conversion device 146 by the converging lens 145. Detection signals output from the photoelectric conversion device 146 are supplied to the processing unit 17B. Also supplied to the processing unit 17B are X coordinate and Y coordinate of the wafer stage 13 measured by the laser interferometer 15. The processing unit 17B obtains a distortion of the projection optical system 3, based on the thus supplied information.

A turret plate 147 is set on the exit plane of the fly's eye lens 10 so as to be rotatable by a drive motor 148. The setting plane of the turret plate 147 is in the relation of Fourier transform with the pattern-formed surface of the test reticle 142, and the setting plane of the turret plate 147 is conjugate with the pupil plane of projection optical system 3 (the setting plane of the pupil filter 4).

Figure 27:
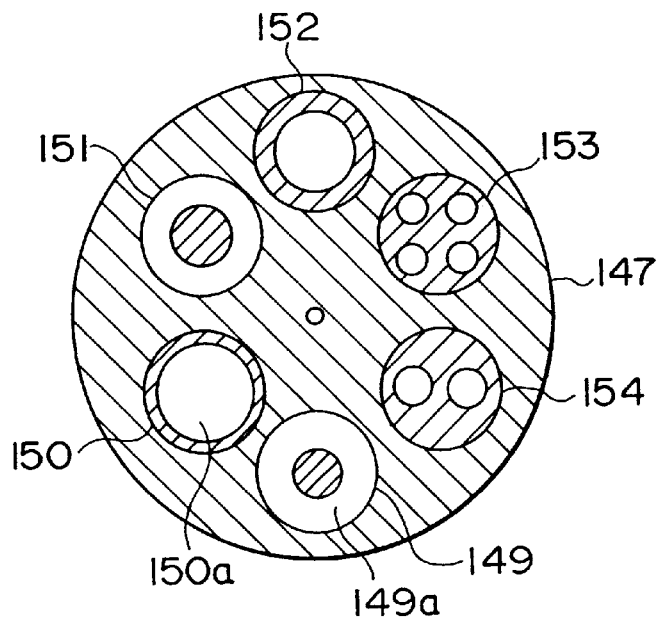
FIG. 27 is a drawing to show patterns of illumination system aperture stops 149–154 formed on a turret plate 147 in FIG. 21.

FIG. 27 shows patterns in the turret plate 147. In this FIG. 27, the turret plate 147 includes a plurality of aperture stops formed at approximately equal angular intervals: an illumination-system aperture stop 149 having an annular aperture 149a; an illumination-system aperture stop 150 having a normal circular aperture 150a; an illumination-system aperture stop 151 having an annular aperture the width of an annular portion of which is narrower than that of the annular aperture 149a; an illumination-system aperture stop 152 having a circular aperture the diameter of which is smaller than that of the circular aperture 150a; an illumination-system aperture stop 153 for the so-called modified light source method having four circular apertures; and an illumination-system aperture stop 154 having two circular apertures. In this case, the annular aperture 149a in the illumination-system aperture stop 149 has the same size as a conjugate image on the turret plate 147, of the transparent portion in the pupil filter 4 on the pupil plane of the projection optical system 3 of FIG. 21.

When the distortion of projection optical system 3 is measured in the present embodiment, the illumination-system aperture stop 149 is set on the exit plane of fly's eye lens 10 in FIG. 21 and the entire surface of test reticle 142 is illuminated with exposure light IL7 passing through the annular aperture in the illumination-system aperture stop 149. By this, images of all evaluation marks $M_{ij}$ on the test reticle 142 are projected onto the wafer stage 13. In this state, driving the wafer stage 13 to scan the reference mark plate 143 in the X direction or in the Y direction, a quantity of received light by the photoelectric conversion device 146 reaches a peak either when the opening pattern 144a coincides with an image of an X-axis mark portion (a slit portion extending in the Y direction) of each evaluation mark $M_{ij}$ or when the opening pattern 144b coincides with an image of a Y-axis mark portion of each evaluation mark $M_{ij}$. Therefore, the processing unit 17B can obtain the X coordinate and Y coordinate of the image of evaluation mark $M_{ij}$. The thus obtained coordinates are compared with designed coordinates without distortion of projection optical system 3, whereby the distortion of projection optical system 3 can be measured.

Since the present embodiment is so arranged that on this occasion the illumination optical system for illuminating the reticle for exposure also serves as an illumination system for illuminating the test reticle 142, the structure of optical system is simple. Since the test reticle 142 is illuminated through the illumination-system aperture stop 149 having the annular aperture, the zeroth-order light and selected diffracted light from the evaluation mark $M_{ij}$ on the test reticle 142 passes through the region (transparent portion) outside the light-shielding portion in the pupil filter 4 on the pupil plane of projection optical system 3 to reach the reference mark plate 143. Accordingly, because the photoelectric conversion device 146 can receive the zeroth-order light with a large light quantity, coordinates of the image of each evaluation mark $M_{ij}$ can be accurately measured, and the distortion of projection optical system 3 with the pupil filter 4 set therein can be accurately measured.

The above-described embodiments employed the ISS mark 22, alignment mark 8B, evaluation marks $M_{ij}$, opening pattern 144a, etc., but it is needless to mention that inverted marks or patterns obtained by inverting bright and dark portions (or transparent and non-transparent portions) of those marks or patterns can also be used.

Further, in addition to the usage in the above-described embodiments, the base line measurement can be done for obtaining a difference (base line) between the detection center of an alignment system of various TTL (through-the-lens) methods and an actual exposure position, using the mark formed on the reference mark plate (for example 21) on the wafer stage 13. Also in this case, by inclining the illumination light for illuminating the mark with respect to the optical axis of the projection optical system 3, the base line measurement can be done with high accuracy even if the pupil filter is set near the pupil plane of projection optical system.

Even in the cases to use the various pupil filters as described above, observation or projection of the mark can be well conducted by adjusting an angle of inclination of the illumination light for illuminating the mark of observation object or projection object and letting the zeroth-order light from the mark pass a region having a high transmittance and an approximately constant phase distribution in the pupil filter near the pupil plane of the projection optical system.

Further, observation or projection of the mark can be performed well by adjusting an angle of inclination of the illumination light for illuminating the mark of observation object or projection object and letting the zeroth-order light from the mark pass a region having a high transmittance in the pupil filter near the pupil plane of the projection optical system.

Incidentally, generally in the projection exposure apparatus, positioning (alignment) between the reticle and the wafer needs to be performed at high accuracy prior to exposure. An example of sensor for this alignment is an optical alignment sensor (position detecting means) of the TTL method. In this method, the projection optical system itself is also used as an alignment optical system for detecting a positioning mark formed on the wafer, as arranged in such a manner that a light beam for mark detection is sent through the projection optical system onto the wafer and reflected light (scattered and diffracted light) from the wafer is again let to pass the projection optical system to be detected, thereby obtaining a position of the positioning mark on the wafer. Since there is no difference of relative position between the projection optical system and the alignment optical system in such a TTL method, the alignment sensor is excellent in stability. In the TTL method, the alignment is carried out after a relative relation is preliminarily measured (base line measurement) between a reference position of measurement of the alignment sensor for wafer and a position of an image of the reticle pattern (particularly, the positioning mark on the reticle). In connection with it, the TTR (through-the-reticle) method is also effective, which is a further development of the TTL method and which directly detects both a positioning mark on the reticle (reticle mark) and a positioning mark on the wafer (wafer mark) at the same time by a single sensor also through the reticle.

However, if the pupil filter were set near the pupil plane of projection optical system in using the position detecting means of the TTL method or TTR method, negative effects would appear: the pupil filter would interrupt part or all of mark detection beam; different regions would have an optical path difference, etc. As a result, the beam for mark detection would not be focused in sufficient light quantity on the wafer, the position of wafer mark would not be detected, or the accuracy of position detection would be lowered.

According to the present invention, all beams for detecting the positioning mark, passing through the projection optical system PL, pass only a second region in periphery in the optical filter PF placed near the pupil plane FTP of projection optical system to reach the substrate W. By this, the mark detection beams are accurately converged on the substrate W without being negatively affected by the optical filter PF, whereby there is no possibility of lowering the position detection accuracy of positioning mark, etc.

Incidentally, that the mark detection beams pass the second region in periphery in the pupil plane FTP of projection optical system is nothing but that an angle of incidence of the mark detection beams onto the substrate W deviates from an angle perpendicular to the substrate W. Namely, there is a possibility that a detected mark position deviates because of slight defocus of substrate W upon detection of position. However, because the mark detection beams in the present invention pass a position shifted in the direction perpendicular to the measurement direction of positioning mark on the pupil plane FTP of projection optical system PL, the angle of incidence onto the substrate W is also inclined only in the direction perpendicular to the direction to be detected, and, therefore, there is no possibility of deviation of the mark position in the detection direction due to defocus, thus not degrading the position detection accuracy.

Next, in the case of use of light beams as the mark detection beams, the position detection is carried out by the so-called laser step alignment method (LSA method) in which the position detection is performed while scanning the wafer mark with spot light. In the case of use of two coherent laser beams, the position detection can be effectively made by the double beam interference method (LIA method) for scanning the wafer mark with two coherent laser beams in two directions. Further, the present invention also suggests use of broad-band light having a wide wavelength band as the mark detection beam. Since the wide-band light has an effect to reduce influence of thin-film interference of photoresist, the position detection can be done with high accuracy with the broad-band light for example by the image pickup method.

Embodiment 8

Figure 29:
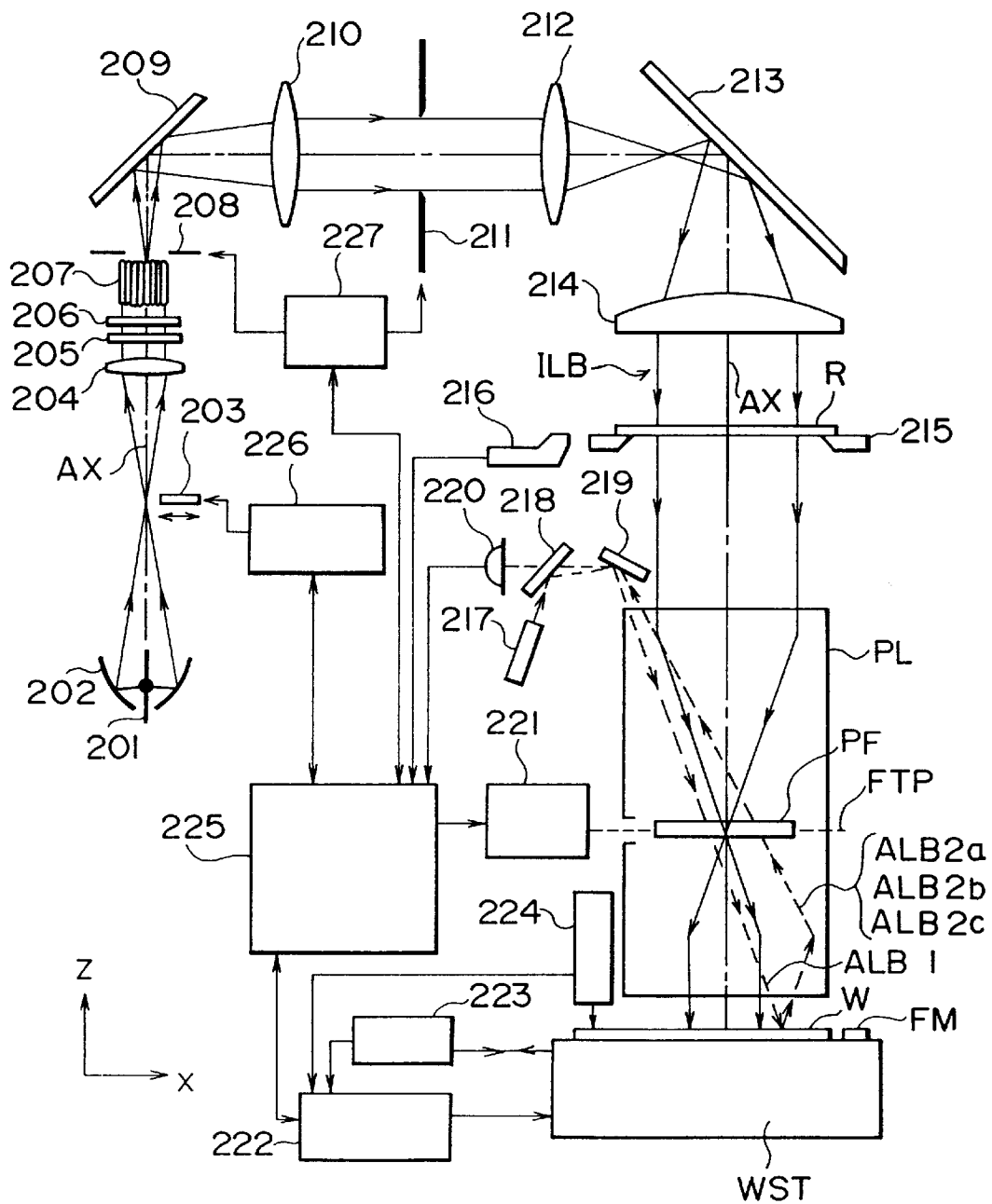
FIG. 29 is a structural drawing to show Embodiment 8 of the projection exposure apparatus according to the present invention.
Figure 30:
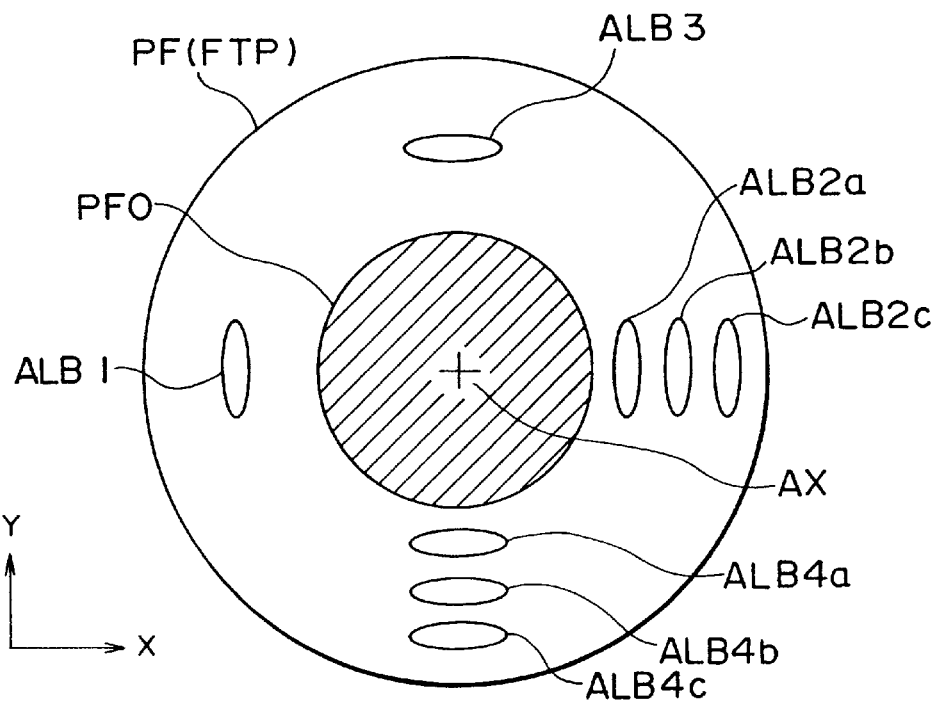
FIG. 30 is a drawing to show a distribution of mark detection beams on the pupil plane FTP (pupil filter PF) in FIG. 29.
Figure 31:
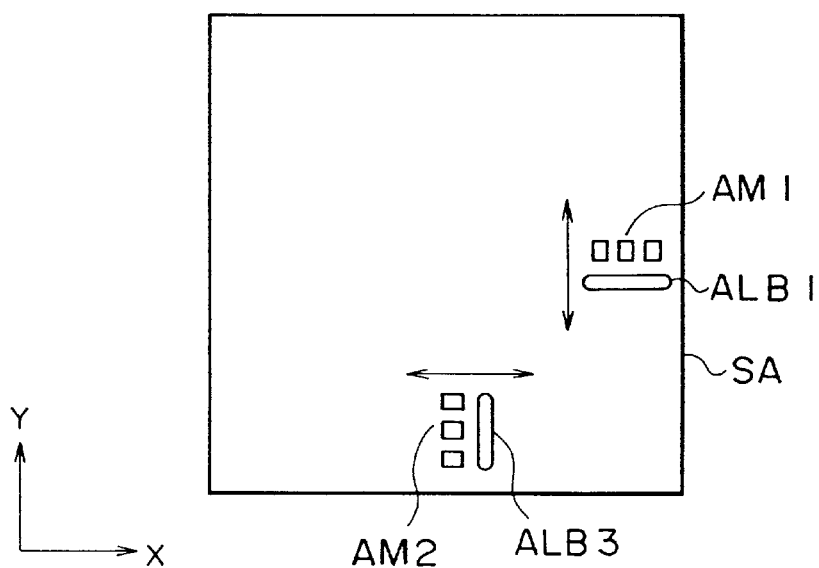
FIG. 31 is a plan view to show a state of wafer marks and mark detection beams on a shot area on wafer W in FIG. 29.

Embodiment 8 of the projection exposure apparatus of the present invention is next described referring to FIGS. 29 to 31. The present embodiment is an example in which the present invention is applied to the projection exposure apparatus for projecting a pattern to be transferred, which is written on the bottom surface of reticle, through the projection optical system onto an exposed surface such as a wafer.

FIG. 29 shows the projection exposure apparatus of the present embodiment. In this FIG. 29, illumination light emitted from a light source 1 such as a mercury lamp travels via an ellipsoidal mirror 202, an input lens 204, and a short-wavelength cut filter 205 to enter an interference filter 206, where for example only the i-line (wavelength 0.365 $\mu$m) is selected. The thus selected illumination light (exposure light) is incident into a fly's eye lens 207. Here, the light source used in the present embodiment is by no means limited to the emission line lamp such as the mercury lamp, but may be a laser light source such as an excimer laser source, etc.

The exit plane (the surface on the reticle side) of the fly's eye lens 207 is a Fourier transform plane in the illumination optical system to the reticle pattern, on which an aperture stop (hereinafter referred to as "σ stop") 208 is provided.

After leaving the fly's eye lens 207 and passing through the σ stop 208, the illumination light travels via a mirror 209, a first relay lens 210, a reticle blind (field stop) 211, a second relay lens 212, a mirror 213, and a condenser lens 214 to illuminate the reticle R on the reticle stage 215. Here, the reticle blind 211 is conjugate with the pattern surface of reticle R, so that the illumination range onto the reticle R can be changed by the reticle blind 211.

Light beams transmitted by the reticle R and light beams diffracted by the reticle R are converged on the wafer W by the projection optical system PL, so that an image of a pattern on the reticle R is projected onto the wafer W. In this case, the Z axis is taken in parallel with the optical axis AX of projection optical system PL, and the X axis and Y axis are taken as an orthogonal coordinate system on a plane perpendicular to the Z axis.

In the present embodiment the pupil filter PF is set on the pupil plane in the projection optical system PL, that is, on the optical Fourier transform plane FTP to the reticle R. This pupil filter PF may be one selected from the center shielded filters the center portion of which is shielded, the so-called Super FLEX type filters having a phase difference between the center portion and the peripheral portion thereof, the so-called SFINCS type filters for decreasing the coherence, etc. Further, because there are exposure steps not necessitating the pupil filter among exposure steps in ten and a few layers necessary in fabricating for example semiconductor integrated circuits, it is desirable that a pupil filter changeover mechanism 221 be provided so that the pupil filter PF can be set outside the optical path of projection optical system PL when unnecessary.

The wafer W is held on the wafer stage WST, and a reference mark FM plate is set on the wafer stage WST so that the surface of the plate is kept substantially at the same height (position in the Z direction) as the exposure surface (for example the top surface) of wafer W. The base line measurement as described previously is carried out using the reference mark on the reference mark FM plate, the sequence of which is well known and omitted to explain herein. After completion of the above base line measurement, a position of a positioning mark (wafer mark) on the wafer W is detected using an optical system 217–220 for detecting the positioning mark, and the projection optical system PL. Employed herein as the positioning mark detection optical system is one arranged in either the laser step-alignment method (LSA method) or the image pickup method, and the TTL type. Namely, the laser light from He—Ne laser light source 217 is guided via a half mirror 218 and a mirror 219 to the projection optical system PL, and the laser light passing the projection optical system PL is converged on the wafer W. Reflected light of the laser light is guided again via the projection optical system PL, mirror 219, and half mirror 218 to enter a photodetector 220. The position of wafer mark is detected based on a detection signal of the photodetector 220.

The photodetector 220 detects the intensity of the reflected light (or diffracted light) from the wafer W depending upon the position in the exposure field of projection optical system PL, and the mark position can be obtained from the detection result thereof. The detection method may be one selected from a variety of methods used in the well-known detection apparatus. Namely, the photodetector 220 may be simply a light quantity detector such as a photodiode, or an image pickup device such as CCD. If the photodetector 220 is a light quantity detector, a positional relation between the wafer W and the position detecting beam is relatively changed by moving the wafer W or vibrating or rotating the mirror 219 in detecting the mark position, whereby the mark position is attained from the relation between the detected light quantity and the above relative position. This is the LSA method. If the photodetector 220 is an image pickup device, the mark position is obtained from a light quantity change of detected image, using image processing. Further, the detection method may be a dark field detecting method in which a spatial filter for shielding specific components in the reflected light is set in front of the photodetector 220 and the position detection is carried out while interrupting for example the regularly reflected light.

In Embodiment 8 angles of the He—Ne laser light source 217 and half mirror 218 are adjusted so that a mark detection beam ALB1 onto the wafer W passes a position apart from the optical axis AX on the pupil plane FTP of projection optical system PL. As a result, the mark detection beam ALB1 is obliquely incident onto the wafer W, and the reflected light (including scattered light and diffracted light) ALB2a–ALB2c (FIG. 30) is also obliquely outgoing from the wafer W. Thus, the reflected light ALB2a–ALB2c also passes a position apart from the optical axis AX (on the opposite side to the beam ALB1 with respect to the optical axis AX) on the pupil plane FTP. The mark detection optical system 217–220 in FIG. 29 is an optical system for detecting a position in the direction (Y direction) perpendicular to the plane of FIG. 29. Accordingly, a direction of the displacements of the mark detection beam ALB1 and the reflected light ALB2a–ALB2c from the optical axis AX on the pupil plane is the X direction (direction perpendicular to the measurement direction) in FIG. 29. Of course, because actual projection exposure apparatus need to perform the detection of mark position in two directions, another optical system similar to the mark detection optical system 217–220 in FIG. 29 is further provided at a position rotated 90° about the optical axis AX. The another mark detection optical system detects a position of wafer mark in the X direction. Therefore, a deviation of the mark detection beam from the optical axis AX on the pupil plane appears in the direction (Y direction) perpendicular to the plane of FIG. 29. Instead of the arrangement to destroy the telecentricity by inclining the mirror and light source, another arrangement may be constructed in such a manner that a plane conjugate with the pupil plane of projection optical system is formed by an objective optical system and that light from the light source passing the conjugate plane is decentered.

Next described referring to FIGS. 30 and 31 are a distribution of the mark detection beams and diffracted light on the pupil plane FTP (pupil filter PF), and a mark layout on the wafer and a scanning method of detection beams.

FIG. 30 is a drawing to show a distribution of mark detection beams (ALB1, ALB2, etc) on the pupil plane FTP (pupil filter PF) in FIG. 29, and FIG. 31 a drawing to show a state of position detection marks and detection light beams near a predetermined shot area SA on the wafer W of FIG. 29. The pupil filter PF in FIG. 30 is a light-shielding type pupil filter in which a circular region PF0 near the optical axis is a light-shielding portion, which is particularly effective to transfer of isolated patterns such as contact holes. The laser beams ALB1, ALB3 for detecting positions in mutually orthogonal directions pass positions apart from the optical axis on the pupil plane FTP, as shown in FIG. 29. Marks detected by the respective beams are arranged on the wafer W as shown in FIG. 31. Each mark AM1, AM2 is a diffraction grating mark, and a position of each mark is detected based on a change in intensity of diffracted light appearing when the mark is relatively scanned by each laser beam ALB1, ALB3. Directions for detecting the respective marks are represented by arrows in the drawing, and the shape of each laser beam ALB1, ALB3 on the wafer is determined to match with the detection directions in such a manner it is short in the detection direction but long in the direction perpendicular thereto. In contrast, the shape of each laser beam ALB1, ALB3 on the pupil plane is different from that on the wafer in that the relation of the length and width is inverted. As shown, the position detection beams ALB1, ALB3 pass the positions apart from the optical axis each in a direction perpendicular to the position detection directions. Diffracted light ALB2a–ALB2c and ALB4a–ALB4c of the respective beams from the wafer mark AM1 and wafer mark AM2 passes positions apart from the optical axis each on the opposite side to the mark detection beam ALB1, ALB3 as sent with respect to the optical axis AX on the pupil plane FTP. These beams pass the pupil plane FTP with none of them being interrupted by the light-shielding portion PF0 on the pupil filter PF. Accordingly, the mark detection beams are free of negative effects by the pupil filter PF. Therefore, the position detection can be made with high accuracy by the TTL method according to the present embodiment even though the projection optical system includes the pupil filter PF.

In the present embodiment angles of incidence of the positioning mark detection beams onto the wafer W deviate from the direction perpendicular to the wafer W, but the directions of the deviation are the directions perpendicular to the directions to perform the detection of wafer marks, corresponding to the directions of deviation of beams in the pupil plane FTP of projection optical system PL. For example, because the beam ALB1 is shifted in the X direction on the pupil plane FTP, the beam ALB1 is inclined along the X direction perpendicular to the measurement direction (Y direction) of the wafer mark AM1 on the wafer W. Therefore, even though a wafer mark to be detected is located at a defocused position, no error is caused for a detected position of the wafer mark.

Embodiment 9

Figure 32:
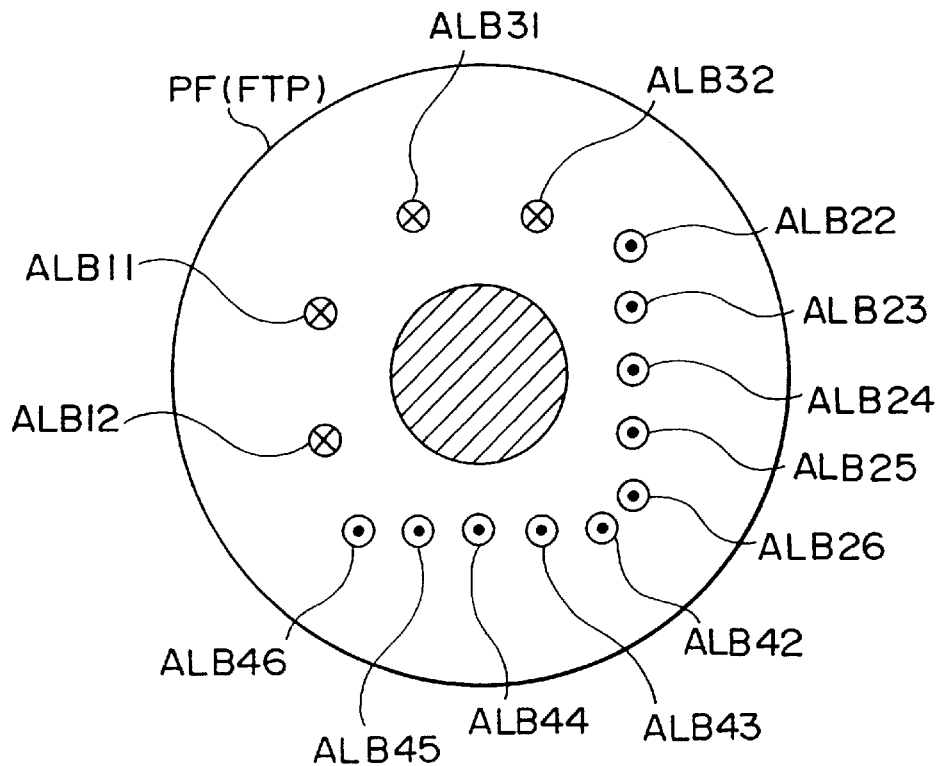
FIG. 32 is a drawing to show a distribution of mark detection beams on the pupil filter PF where an optical system to support the so-called double beam interference method (LIA method) is used in Embodiment 9 of the present invention.
Figure 33:
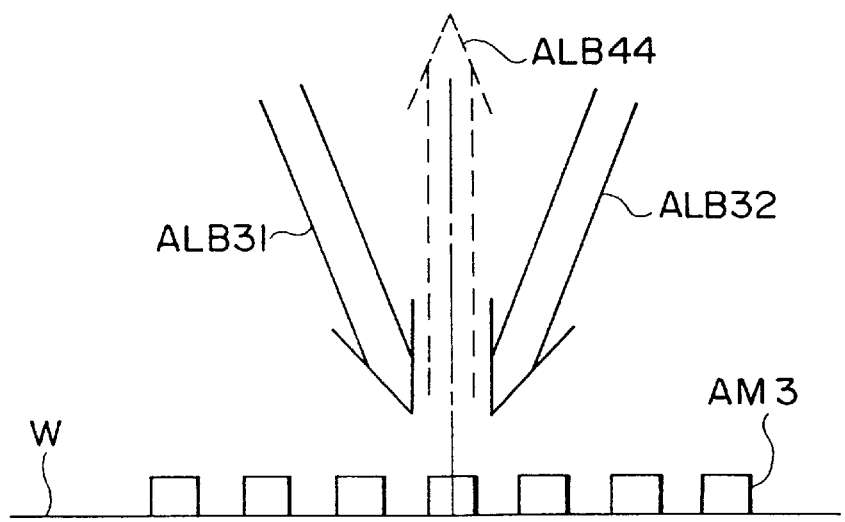
FIG. 33 is an explanatory drawing to show a wafer mark of diffraction grating on wafer W and a relation between incident light and diffracted light of the wafer detection beams, corresponding to FIG. 32.

Next described referring to FIGS. 32 and 33 is Embodiment 9 using a different optical system from those in the previous embodiments as a position detecting optical system used in the projection exposure apparatus of the present invention.

FIG. 32 is a drawing to show a distribution of beams for mark detection (ALB31, ALB32, etc.) on the pupil filter PF, where an optical system of the so-called double beam interference method (LIA method: Laser Interferometric Alignment method) is used as a position detection optical system of FIG. 29, which is disclosed in U.S. Pat. No. 5,151,750, and FIG. 33 is a drawing to illustrate a grating mark on the wafer W and conditions of incidence of the mark detection beams and reflected light thereof. The pupil filter PF in FIG. 32 is also a center shielding type pupil filter, similarly as in FIG. 30. The beams for detection in the horizontal direction in FIG. 32 are mutually coherent laser beams of ALB31, 32 as sent light and beams of ALB42–46 are reflected light from the wafer W, corresponding thereto. These reflected light beams are produced by reflection and diffraction on the grating mark AM3 on the wafer W shown in FIG. 33, and the intensity of the beams changes depending upon a relative position between interference fringes formed by the incident beams ALB31, 32 and the grating mark AM3. Accordingly, the position of the grating mark AM3 can be detected by measuring the intensity change of these reflected light beams. If a slight difference is given between frequencies of the incident beams ALB31, 32, the interference fringes move at constant speed on the grating mark AM3, thereby periodically changing the intensity of reflected light ALB42–46.

Thus, even with the wafer fixed, detection of grating mark AM3 is possible using the time change. If the frequencies of incident beams ALB31, 32 are exactly equal to each other, the grating mark AM3 (wafer W) is moved relative to the interference fringes and the grating mark AM3 is detected by a change in intensity of reflected light at that moment. A direction of the period of gratings in the grating mark AM3 is different from the direction of the period of the mark shown in FIG. 31, but is the measurement direction. Although each of the incident beams ALB31, 32 is slightly inclined to the measurement direction, there is no possibility of causing errors in mark detection with defocus, because the two beams have no inclination to the measurement direction as a whole. Also, beams for detection in the vertical direction in FIG. 32 are two mutually coherent laser beams of ALB11, 12 as sent light, and reflected light from the wafer W is beams of ALB22–26.

Although the above embodiment used the position detection optical system having the He—Ne laser light source as a light source, but the light source may be any other laser light source. Also, the light source may be a continuous spectrum light source (broad band light source) such as a halogen lamp, a light source for emitting multi-wavelength beams, etc. If wide band light (broad band light or multi-wavelength light) is used as the position detection beams, much higher position detection accuracy can be achieved, because the thin-film multiple interference is reduced in the photoresist laid on the wafer W. Although broad band light in a very wide wavelength region cannot be used because of the chromatic aberration of projection optical system, the effect to reduce the multiple interference appears even in the wavelength region (wavelength band) of about 10 nm and the effect is sufficient in about 200 nm. In order to compensate for the chromatic aberration of projection optical system, a chromatic aberration correcting optical member may be provided in the position detection optical system. Alternatively, a beam deflecting member (for example consisting of a diffraction grating or a prism) for deflecting the optical path of position detection beams may be provided on the pupil plane of projection optical system or on a plane in the vicinity thereof.

The structure of the position detection optical system is by no means limited to the above TTL type, but may be of the TTR type in which the mark detection beams are guided also through the reticle or detected through the reticle. Also in this case, by inclining for example a mirror at a substantially conjugate position with the wafer W in the light sending system by a predetermined angle to bend the position detection beams, interception of the mark detection beams by the pupil filter can be prevented.

Next described again referring to FIG. 29 are detection processing of wafer mark, the control system, and the other structure.

A main control system 225 performs the above detection processing of wafer mark, based on a light quantity signal from a photodetector 220 and the position of wafer W (wafer stage WST) measured by a laser interferometer 223. The wafer stage WST is movable in directions within the wafer W (in the X direction and in the Y direction), and the image of reticle pattern is transferred in some tens of shots over the entire wafer W, repeating exposure and movement of wafer stage (step-and-repeat). In exposure operation, the position of wafer stage WST is also measured by the laser interferometer 223 and controlled by a stage controller 222. The wafer stage WST can move the wafer W in the Z direction perpendicular to the exposure surface of wafer W. Namely, the wafer stage WST adjusts the exposure surface of wafer W into the best focus position of projected image of reticle pattern, based on detection values of an autofocus system 224.

The main control system 225 also executes other controls, for example a control to open or close σ stop 208 or reticle blind 211 through an illumination system controller 227, a control to open or close a shutter 203 through a shutter drive unit 226, etc. The main control system 225 also performs exchange of pupil filter PF through a changeover mechanism 221. In this case, selection of a pupil filter used is carried out by an operator through a console etc. not shown, but, because a type of the pupil filter is naturally determined depending upon a pattern to be transferred, i.e., depending upon a used reticle, an alternative arrangement may be constructed in such a manner that a bar code etc. provided on the reticle R is read out by a bar code reader 216 etc. upon loading of reticle R and, based on the read bar code, the type of pupil filter may be determined. Of course in this case, information on which pupil filter should be used for a reticle with which bar code (name, symbol) needs to be preliminarily put into the main control system 225 through the console etc.

In FIG. 29, it is assumed that the projection optical system PL in the projection exposure apparatus is a lens system consisting only of refracting members, but it may be constructed as a reflecting optical system or a catadioptric optical system. Further, the present invention can be applied not only to apparatus for performing exposure in such a manner that the reticle and wafer are fixed during exposure but the wafer is successively moved between exposures (step-and-repeat), but also to apparatus of the so-called scan type to scan the reticle and wafer in synchronization during exposure.

Incidentally, the projection optical system used in the projection exposure apparatus is assembled into the apparatus through advanced optical design, careful selection of glass materials, precise machining of glass materials, and precise assembling adjustment. Currently, the semiconductor fabrication process mainly uses steppers in which the reticle (mask) is irradiated with illumination light of the i-line (wavelength 365 nm) of the mercury lamp and transmitted light by circuit patterns on the reticle forms an image thereof on a photosensitive substrate (wafer etc.) through the projection optical system. Excimer steppers using the excimer laser (KrF laser of wavelength 248 nm) as illumination light are also used for evaluation or for research.

Generally, the resolving power and the depth of focus DOF of projection optical system are important factors for faithfully transferring fine reticle patterns onto the photosensitive substrate by exposure using the projection optical system. Among the currently practically available projection optical systems, there are developed those for the i-line with the image-side numerical aperture NA being about 0.6. For a same wavelength of illumination light used, the resolving power increases as the numerical aperture of projection optical system becomes larger. The depth of focus DOF, however, decreases with an increase of the numerical aperture NA. When the wavelength of illumination light is $\lambda$, the depth of focus is given approximately as $DOF=\pm\lambda/(2\times NA^2)$.

In order to enhance the resolving power, the photosensitive-substrate-side (image-side) numerical aperture NAw (or mask-side numerical aperture NAr) of projection optical system is increased, which is nothing but increasing the diameter of the pupil ep or increasing an effective diameter of a lens system or mirror system. However, because the depth of focus DOF decreases in inverse proportion to the square of numerical aperture NAw, a necessary depth of focus would not be attained even if a high-numerical-aperture projection optical system were able to be produced, which would be a big hindrance in practice.

Supposing the wavelength of illumination light is 365 nm of the i-line and the numerical aperture NAw is 0.6, the depth of focus DOF is about 1 $\mu$m ($\pm 0.5$ $\mu$m) in width, which will cause poor resolution in portions with asperities or curvature of surface outside the depth of focus DOF in one shot area (about 20 mm square to about 30 mm square) on the wafer as a photosensitive substrate.

Against such a problem, there are suggestions on the so-called super resolution technology, for example the phase shift method (Japanese Patent Publication No. 62-50811), the SHRINC method (U.S. Ser. Nos. 847,030, 791,138 etc.), etc. These techniques are very effective to an improvement in resolution and an increase in depth of focus, where the transferred circuit patterns are patterns arranged in a relatively high pattern density and in a periodic manner, but are rarely effective to discrete (isolated) patterns, for example those as called as contact hole patterns.

Then, an exposure method for expanding an apparent depth of focus for isolated patterns such as the contact hole patterns was proposed for example in U.S. Pat. No. 4,869,999, which is a method in which an exposure for one shot area on wafer is split into a plurality of exposure steps and the wafer is moved by a constant amount along the optical axis between the exposure steps. This exposure method is called as the FLEX (Focus Latitude enhancement EXposure) method, by which a sufficient effect to expand the depth of focus can be achieved for isolated patterns such as the contact hole patterns. Since it is essential in the FLEX method to perform multiple exposures of contact hole images slightly defocused, a resist image obtained after development will inevitably have decreased sharpness.

Known as an attempt to expand the depth of focus in projecting the contact hole patterns without moving the wafer along the optical axis during exposure operation as in the FLEX method is the Super-FLEX method as presented in Extended Abstracts 28a-ZC-8, 9 (The Spring Meeting, 1991); The Japan Society of Applied Physics and Related Societies. In this Super FLEX method, a filter having a distribution of concentric amplitude transmittances about the optical axis is provided on the pupil plane of projection optical system (i.e., the Fourier transform plane to the reticle) and the resolution and depth of focus are increased by the action of this filter.

It is desirable that the distribution of amplitude transmittances in this case continuously change in the radial direction of the pupil plane, but it is difficult to produce such a filter in practice. Therefore, it is studied to achieve a filter in which the amplitude transmittance (phase difference) is arranged to stepwise change from negative to positive at specific radii (hereinafter referred to as "phase difference type pupil filter").

The method to improve the depth of focus by changing the transmittance distribution or phase difference through filtering on the pupil plane of projection optical system as in the above super FLEX method is generally known as a multi-focus filter method. The multi-focus filter is described in detail on pages 44–55 in a thesis titled as "Research on imaging performance in optical system and improving method thereof," Report No. 40, Machinery Test Institute as published Jan. 23, 1961. The method to improve the image quality by filtering on the pupil plane is generally called as the pupil filter method.

Another known pupil filter of a new type is a pupil filter for shielding a circular region near the optical axis (hereinafter referred to as "light-shielding type pupil filter") (for example as described in U.S. Ser. No. 076,429).

Another known filter is a pupil filter of a type to decrease the coherence between transmitted light beams through some concentric regions in the pupil filter (hereinafter referred to as "SFINCS type pupil filter")(for example as disclosed in U.S. Ser. No. 128,685).

These filters are effective to patterns in which fine transmissible opening patterns are isolated in a light-shielding region (chromium deposit etc.) in the reticle, such as the contact hole patterns, but they conversely decrease the depth of focus and lower the resolution (to cause false resolution) for example for line-and-space patterns (repetitive and adjacent patterns arranged with a ratio of widths of bright and dark portions being about 1:1 and in a periodic manner).

As a classically known one being a kind of the above pupil filters, there are actually produced exposure apparatus in which a variable aperture is provided near the pupil plane and the available pupil size (effective pupil diameter) of projection optical system is changed thereby, whereby the numerical aperture NA is made variable.

Incidentally, because fine patterns are formed in many layers in fabricating semiconductor integrated circuits etc., high-precision positioning (alignment) between the layers is indispensable. In this alignment, an alignment mark formed (exposure-transferred and etched) at the same time with the circuit patterns on the wafer in a previous pattern forming step is position-detected using an alignment sensor (microscope, laser sheet beam, image pickup device, etc.) provided in the projection exposure apparatus; an accurate position of the circuit patterns (shot area) is obtained based on the thus detected position and a designed position of the alignment mark; and overlap exposure is performed. Of course in the exposure this time, a pattern for alignment mark to be transferred is generally formed on the reticle (mask) in order to form a new alignment mark for subsequent step on the wafer.

Often employed as the shape of alignment marks on the wafer are marks in which a lot of mark edges for position measurement are arranged, that is, repetitive marks (line-and-space marks), in order to improve the detection position accuracy by averaging. However, the repetition pitch of marks is generally set greater than the pitch of line-and-space patterns present in the circuit patterns in order to avoid flattening of the marks due to the flattening process etc. In many cases, the widths of lines and spaces are set to 3 to 6 [$\mu$m] and the pitch to about 6 to 12 [$\mu$m].

Considering from the above background, where projection exposure is made for reticles of circuit patterns having contact holes using the pupil filter for contact holes, there are cases that the resolution is degraded for the line-and-space patterns mixed on the reticle. Namely, there is a possibility that the alignment marks of the line-and-space type cannot be formed on the wafer.

In the present invention, because a light-shielding member for shielding the illumination light is set in a substantially annular region on and near the circumference of a circle being in an imaging relation with a border region of a pupil filter, on the pupil plane in the illumination optical system (which is also an optical Fourier transform plane to the reticle pattern) as conjugate (or being in the imaging relation) with the pupil plane in the projection optical system (an optical Fourier transform plane to the reticle pattern) in which the pupil (spatial) filter is set, illumination light beams which could cause false resolution or contrast reduction for the line-and-space type alignment marks can be prevented from entering the reticle. Accordingly, exposure transfer of the alignment marks of the line-and-space type can be well done even using the pupil filter for contact holes.

Embodiment 10

Figure 34:
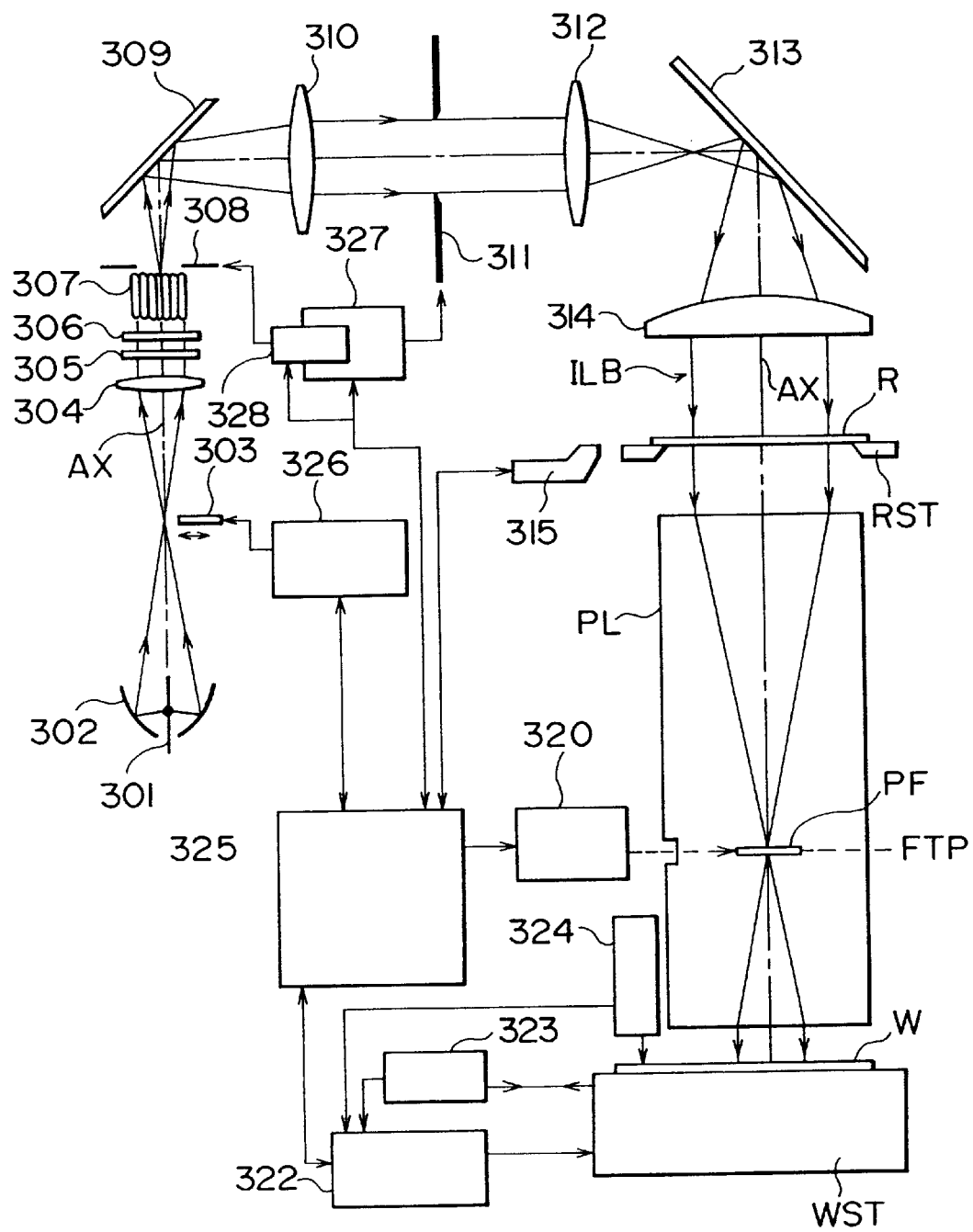
FIG. 34 is a drawing to show structure of the projection exposure apparatus according to Embodiment 10 of the present invention.

FIG. 34 shows Embodiment 10 of the present invention, in which circuit patterns to be transferred and alignment marks of line-and-space patterns are written on the bottom surface of reticle R (the surface on the side of projection optical system PL) and these patterns are projected through the projection optical system PL at least telecentric on the image side, onto an exposed substrate such as the wafer W to be exposure-transferred thereonto. Illumination beams ILB for illuminating the reticle R are emitted from the light source such as a mercury lamp 301, and for example only the i-line (wavelength 0.365 $\mu$m) is selected by an ellipsoidal mirror 302, an input lens 304, a short-wavelength cut filter 305, and an interference filter 306 then to enter a fly's eye lens 307. It is noted that the light source used in the exposure apparatus according to the present invention is by no means limited to the emission line lamps such as the mercury lamp, but may be for example a laser light source etc.

The exit plane of the fly's eye lens 307 is the Fourier transform plane in the illumination optical system to the reticle pattern, on which an image of a surface illuminant determined by an array of elements in the fly's eye lens is formed and on which a light-shielding member 308 for defining the shape of the surface illuminant image is set. The details of the light-shielding member 308 will be described later. Emerging from the fly's eye lens 307 and passing the light-shielding member 308, the illumination light travels via mirrors 309, 313 and through condenser lenses 310, 312, 314 to illuminate the reticle R with uniform illuminance distribution. In this case, an illumination field stop (reticle blind) 311 is conjugate with the pattern surface of reticle R, so that an illumination range onto the reticle R can be changed thereby.

Light beams transmitted or diffracted by the reticle R are focused by the projection optical system PL to form an image of the patterns of reticle R on the wafer W. In the present embodiment, as shown in FIG. 34, the pupil filter PF is set on the pupil plane FTP in the projection optical system PL, that is, on an optical Fourier transform plane to the reticle R or in the vicinity thereof, and detailed structure of the pupil filter will be described later.

Incidentally, the alignment sensor (microscope) 324 is provided in the vicinity of the projection optical system PL, and position detection of alignment mark on the wafer W is performed thereby prior to exposure transfer of patterns on the reticle R onto the wafer W. A stage controller 322 or a main control system 325 calculates the detection position of alignment mark, according to a change in light quantity signal from the alignment microscope 324 and a measurement position of wafer stage WST by a laser interferometer 323.

The main control system 325 determines a registration position between a shot area on the wafer W and a pattern projection image of reticle R, based on the thus calculated position of wafer mark and a design position of alignment mark preliminarily set on the wafer (a relative position to the circuit patterns on the wafer), and sends a command of moving position of the wafer stage WST to the stage controller 322 to move the wafer W (wafer stage WST) to the exposure position. The position of the wafer stage WST at this moment is of course monitored by the laser interferometer 323, and a servo control is effected so that a current position of stage WST coincides with a desired position (exposure position).

The main control system 325 sends not only the command to the stage controller 322 but also commands to a shutter controller 326, to the σ stop (not shown), to a controller 327 of the reticle blind 311, etc., so as to open or close a shutter 303, or to set the aperture of reticle blind 311. Here, the σ stop is for changing the size or shape of the surface illuminant formed on the exit side of fly's eye lens 307, or a distribution of light source images thereon.

Also, a pupil filter changeover mechanism 320 is so arranged to change over or to mount and dismount the pupil filter PF so that a mounted pupil filter becomes optimum to an exposed pattern. The main control system 325 also provides a command for the changeover etc. of pupil filter PF in this case. In accordance with the changeover etc. of pupil filter PF, the light-shielding member 308 in the present embodiment also needs to be changed over etc., and a light-shielding-member controller 328 performs the changeover operation under a command from the main control system 325.

An operator gives an input of a command about what kind or form of pupil filter should be used in exposure to the main control system 325 through a console (not shown) etc. Since the type of a suitable pupil filter PF is uniquely determined by the type of reticle pattern to be transferred, the type of pupil filter used may be determined in such a manner that the name, code, etc. of reticle R used is read out by a bar code reader 315 and based thereon, the type of used pupil filter PF is determined.

The changeover of pupil filter PF and light-shielding member 308 may be done by replacement with a load arm used in changing the reticle R in ordinary projection exposure apparatus, or by rotating a circular holding plate in which a plurality of pupil filters PF or light-shielding members 308 are preliminarily set in a turret structure. The exit plane of the fly's eye lens 307 on which the light-shielding member 308 is placed is a place where the σ stop was placed in the conventional arrangements, and, therefore, a turret including various types (various diameters) of σ stops as well as the light-shielding member 308 may be set at this position so as to make them exchangeable.

If the projection exposure apparatus according to the present embodiment is exclusively used only for exposure steps of contact hole patterns, the variety of pupil filters PF used all can be for contact holes. However, since the projection exposure apparatus is generally used also for transfer of various patterns (including fine line-and-space patterns) in order to increase productivity, it is preferable to prepare a pupil filter for line-and-space patterns (for example pure glass or a hole for disuse of pupil filter). Also, as for the light-shielding member 308, it is desirable that a turret be provided with a σ stop for making a normal circular aperture, an annular aperture stop for annular illumination, or two or four aperture stop for modified illumination, whereby the stop and light-shielding member 308 can be immediately exchanged with each other.

Figure 35A:
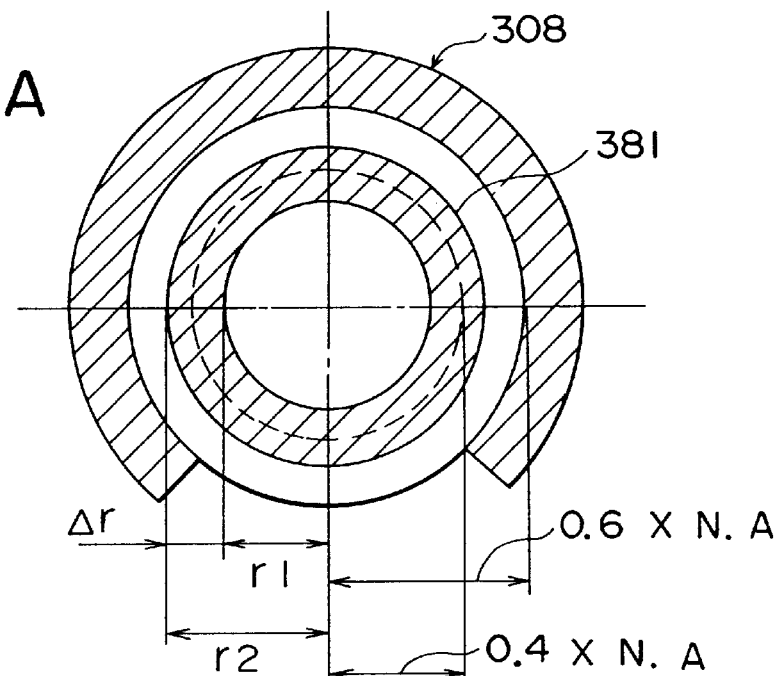
FIG. 35A is a drawing to show an example of structure of a light-shielding member in an illumination optical system.
Figure 35B:
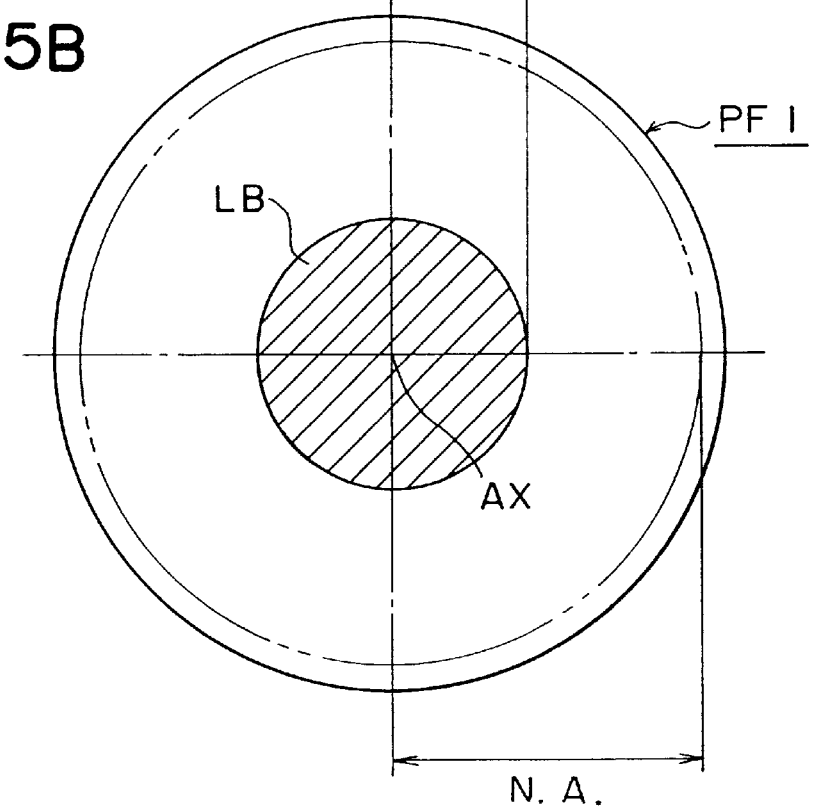
FIG. 35B is a drawing to show an example of structure of a light-shielding pupil filter in a projection optical system.

Next described using FIGS. 35A and 35B are the pupil filter PF and light-shielding member 308. FIGS. 35A and 35B show the light-shielding member 308 and the light-shielding type pupil filter PF1, respectively. The two members are located on respective, optical Fourier transform planes (pupil planes) to the reticle pattern. Accordingly, they are in an imaging relation with each other. An image magnification between the two members is completely arbitrary in real scale depending upon design of projection optical system and illumination optical system. FIG. 35A shows a projection image of an annular shielding portion 381 of the light-shielding member 308 as projected onto the pupil plane of projection optical system, i.e., on the pupil filter PF1, wherein the magnification between them is 1:1 for convenience' sake. In FIGS. 35A and 35B various values of radii are lengths (for example mm) in fact, but they are expressed herein by sines of incident angles of rays on the wafer side (thus having the maximum of NA), which are in proportion to a position in the radial direction on the pupil plane (naturally, the surface of wafer W at the best focus position is optically in the relation of Fourier transform with the pupil plane).

Now, the pupil filter PF1 of FIG. 35B is a light-shielding type pupil filter having a circular shielding portion LB for shielding light beams passing within a region of 0.4 times radius NA, where 0.6 times the pupil plane radius NA corresponds to the image-side numerical aperture NAw of projection lens PL. Then, the light-shielding portion 381 in FIG. 35A is formed on a same scale as a light-shielding ring in width Δr with a circle of radius 0.4×NA at the center. The light-shielding member 308 also serves as a normal σ stop, which interrupts illumination beams outside the radius 0.6× NA. Namely, the illumination system without the light-shielding portion 381 functions as a normal illumination system with σ value of 0.6. Generally, the σ value is a ratio between the numerical aperture of illumination light on the reticle (sine of maximum incident angle) and the reticle-side numerical aperture NAr of projection optical system. It is, however, well known that it is represented by a ratio of radii on the Fourier transform plane to the reticle, as shown in FIGS. 35A and 35B.

Figure 36:
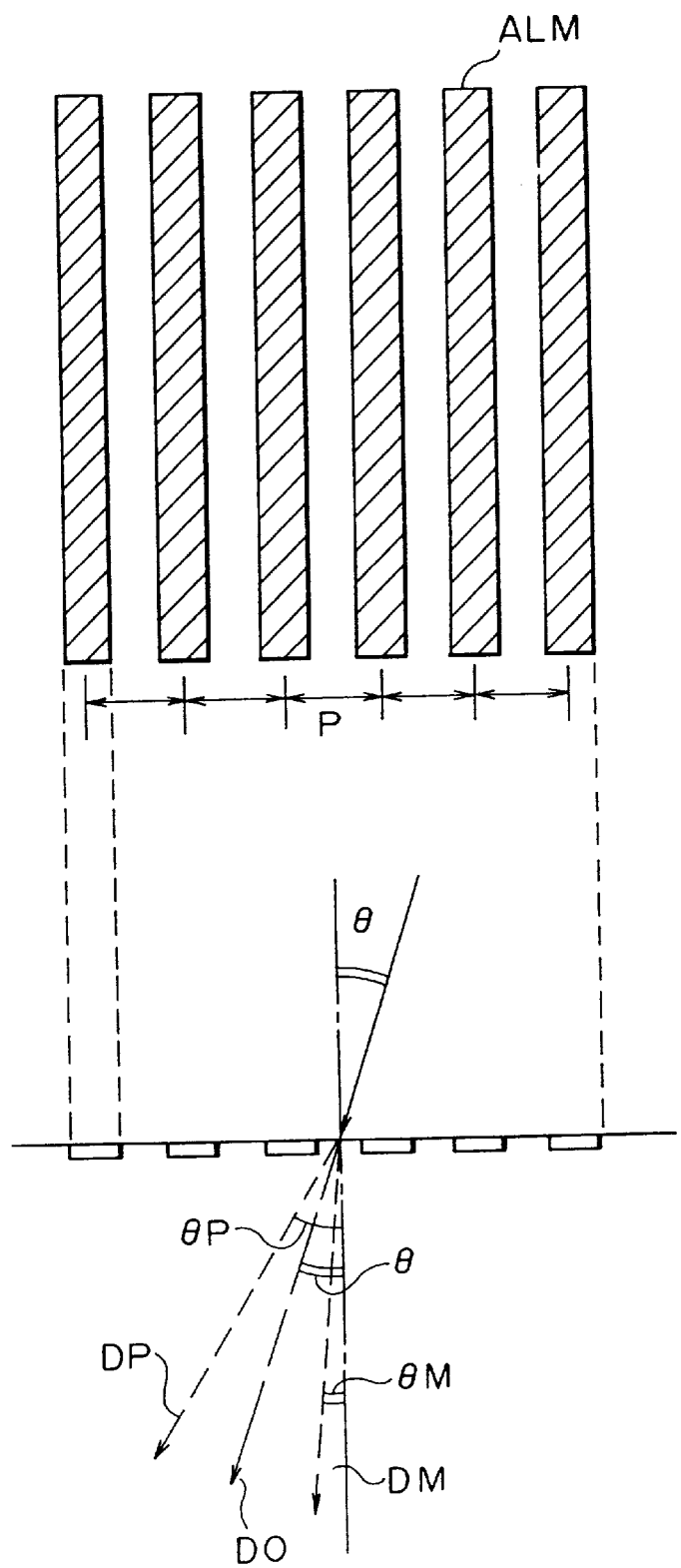
FIG. 36 is a plan view to show an alignment mark on the reticle to be transferred onto the wafer, and a cross-sectional view to diagrammatically show a state of emergence of zeroth-order diffracted light and ±first-order diffracted light where illumination light is incident at an angle of incidence θ to the alignment mark.
Figure 37:
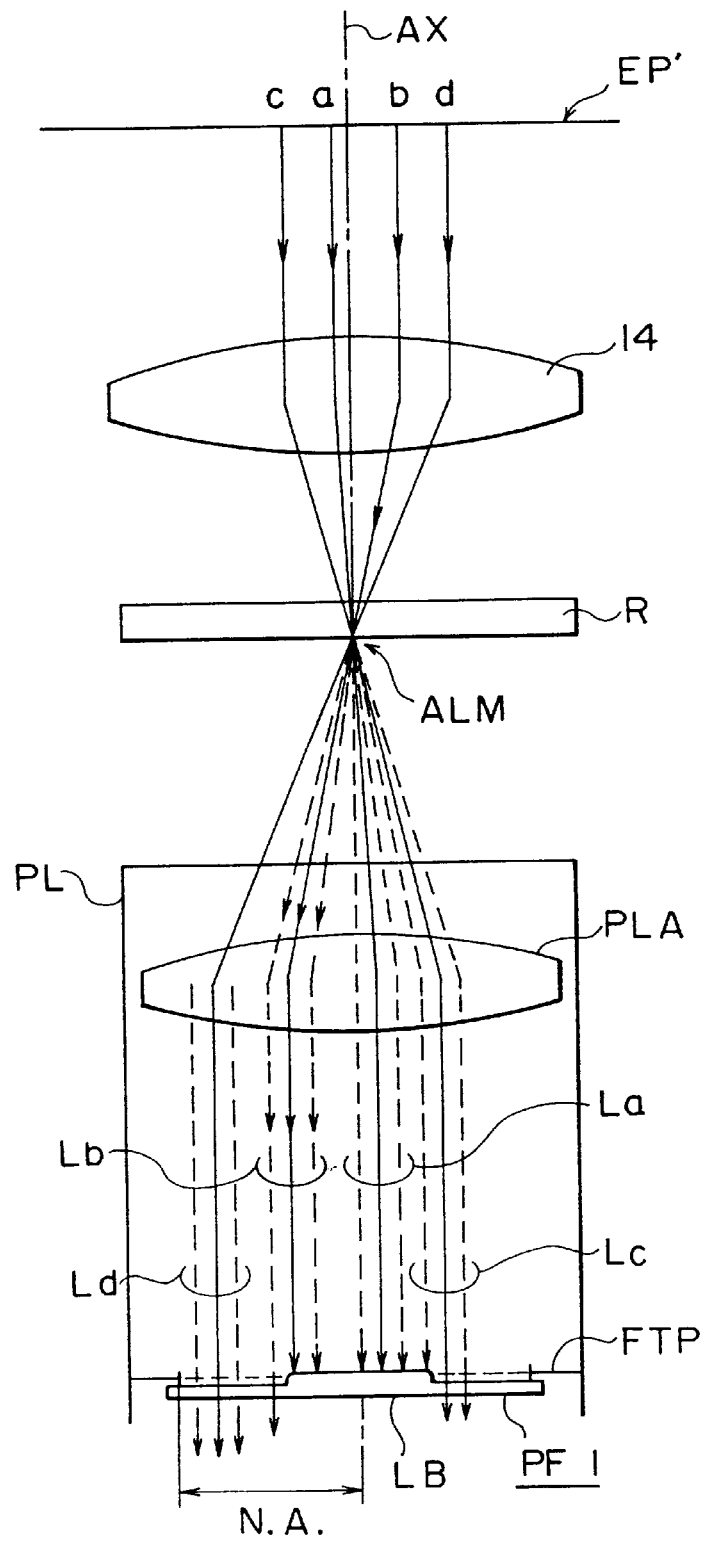
FIG. 37 is a drawing to diagrammatically show illumination light paths between the pupil plane of the illumination optical system and the pupil plane of the projection optical system.
Figure 38:
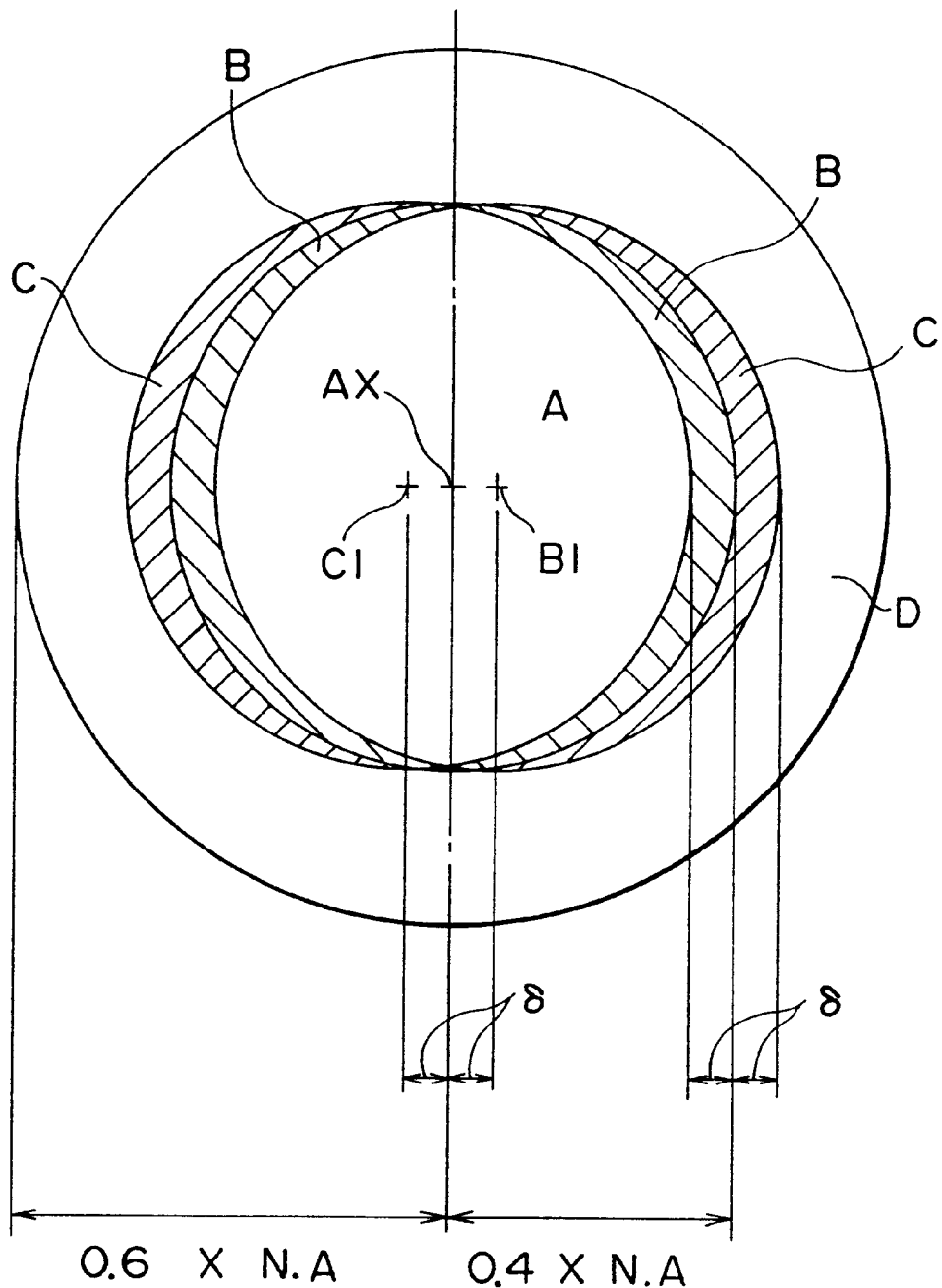
FIG. 38 is a drawing to show an effective light source plane on the pupil plane of the illumination optical system.

A value of the width Δr (values of $r_1$ and $r_2$) is next described using FIGS. 36, 37, and 38. The upper figure in FIG. 36 is a plan view of the alignment mark ALM on the reticle R to be transferred in the present embodiment, which shows a line-and-space mark in which grating shielding line patterns (hatched lines) are repetitively arranged at period P [μm]. The period P of mark ALM is a converted value as one on wafer, and, therefore, a value on the reticle is a demagnification ratio of projection optical system M times greater (for example M=5).

The bottom figure in FIG. 36 is a cross section to diagrammatically show a state of generation of zeroth-order diffracted light DO and ±first-order diffracted light DP, DM where the illumination light is incident at incident angle θ onto the mark. The zeroth-order light DO is emergent at the same exit angle θ as the incident light, but, letting the wavelength of illumination light (exposure light) be λ[μm], the +first-order light DP is emergent at an exit angle $\theta_P$ determined by $\sin\theta_P - \sin\theta = \lambda/P$, and the −first-order light DM at an exit angle $\theta_M$ determined by $\sin\theta - \sin\theta_M = \lambda/P$.

In actual apparatus, the incident angle to the reticle pattern (alignment mark ALM) takes various values. For example, illumination light emerging from point a near the optical axis AX on the pupil plane EP' (Fourier transform plane) in the illumination optical system, as shown in FIG. 37, is incident at an incident angle close to the normal line to the alignment mark ALM (where the sine of the incident angle is proportional to a distance of point a from the optical axis AX) also to produce the zeroth-order light and ±first-order diffracted light La. However, because these diffracted light has exit angles close to the vertical line, it is entirely interrupted by the circular shielding portion LB in the light-shielding type pupil filter PF1 when it reaches the pupil plane FTP through a lens group PLA having a Fourier transform effect in the projection optical system PL, thus never reaching the wafer W. Namely, it cannot form an image of alignment mark ALM on the wafer.

Where illumination light rays are emerging from point b a little more apart from the optical axis AX on the pupil plane, three beams of diffracted light (zeroth-order light and ±first-order light) Lb emerging from the mark ALM are outgoing as slightly inclined, among which only the first-order diffracted light on the left side in the figure passes the pupil filter PF1 on the pupil plane FTP of projection optical system. However, because only one first-order diffracted light reaches the wafer W, it cannot form a line-and-space image of alignment mark ALM, but simply forms only a ghost with uniform brightness. Accordingly, the illumination beams from the point b are undesirable beams that lower the contrast in respect of transfer of alignment mark. Therefore, it is seen that the light source portion located at point b should better be absent.

As for diffracted light Lc generated by illumination beams emerging from point c further apart from the optical axis AX than point b, one first-order diffracted light on the right side in the figure and the zeroth-order diffracted light passes the pupil plane FTP, whereby a mark image can be formed by double beam interference on the wafer. As a result, the illumination beams from point c contribute to formation of alignment mark image, but this image has a low finesse because it is a double beam interference image. There are cases that the profile of edges of alignment mark formed is degraded.

As for the illumination light from point d further away from the optical axis AX, the zeroth-order light and ±first-order diffracted light contained in emergent diffracted light Ld passes the pupil plane FTP without being interrupted by the circular shielding portion LB, enabling extremely superior transfer of alignment mark image.

Incidentally, the first illumination beams from point a near the optical axis do not affect the transfer of alignment mark good or bad at all, but of course contribute to transfer of contact hole patterns.

FIG. 38 two-dimensionally shows contributions of respective points as to the alignment mark transfer as described above referring to FIG. 37. FIG. 38 is a drawing to show an effective illuminant surface on the pupil plane of illumination optical system, similar to FIG. 35A, wherein the outer radius (σ stop value) is the radius 0.6×NA and there are three circles with a radius of 0.4×NA and with the center on the optical axis AX, point $B_1$ or point $C_1$ shifted $\pm\delta$ from the optical axis AX, respectively, inside the effective illuminant surface. The shift amount δ is equal to λ/P, where P [μm] is the pitch of alignment mark and λ [μm] is the exposure wavelength. Namely, it corresponds to the sine of an angle of diffraction of the first-order diffracted light to the zeroth-order light (a distance between the two diffracted light beams on the pupil plane). The pitch direction of alignment mark coincides with the decentering direction of points $C_1$ and $B_1$ from the optical axis AX.

In FIG. 38, the center area A is an illuminant portion (point a in FIG. 37) irrelevant to the formation of alignment mark image; region B an illuminant portion (point b in FIG. 37) which gives an offset to the alignment mark image and is, therefore, very unfavorable; region C an illuminant portion (point c in FIG. 37) which forms a low-finesse image and which is not so preferable. Further, peripheral region D represents an illuminant portion (point d in FIG. 37) which is preferable for transfer of alignment mark.

Accordingly, in order to accurately transfer an alignment mark of line-and-space patterns, using the pupil filter as shown in FIG. 35A, it is preferable that at least region B be shielded and if possible, region C also be shielded together.

The above description concerned the alignment mark ALM that is the periodic patterns only in the one-dimensional direction, but in practical use, alignment marks with periods in mutually orthogonal X direction and Y direction are formed on the reticle R. Therefore, regions of surface illuminant to be shielded or attenuated are superposition of regions B, C in FIG. 38 and regions B', C' when FIG. 38 is rotated 90° about the optical axis AX, which corresponds to the light-shielding portion 381 shown in FIG. 35A, as a result.

Accordingly, the width $\Delta r$ ($=r_2-r_1$) in FIG. 35A is given as follows:

for shielding both regions B, C (B', C');

from $r_1=0.4\times NA-\lambda/P$, and;

$r_2=0.4\times NA+\lambda/P$, $\Delta r=2\lambda/P$:

for shielding only regions B, B';

from $r_1=0.4\times NA-\lambda/P$, and;

$r_2=0.4\times NA$, $\Delta r=\lambda/P$.

The above values are expressed with the wafer-side numerical aperture NAw as reference on the pupil plane FTP of projection optical system PL, but they can be expressed as follows using the sine of incident angle θ of illumination light passing the light-shielding member 308 onto the reticle (ψ=sinθ). For shielding regions B, C (B', C'), from the relation of projection magnification M=NAw/NAr, $\psi_1=0.4\times NAr-\lambda/MP$;

$\psi_2=0.4\times NAr+\lambda/MP$;

Thus, the extent of the angle of incidence of the illumination light into the reticle $\Delta\psi(=\psi_2-\psi_1)=2\lambda/MP$.
For shielding only regions B (B'), $\psi_1=0.4\times NAr-\lambda/MP$;

$\psi_2=0.4\times NAr$.

Thus, $\Delta\psi=\lambda/MP$.

Here, NAr is the reticle-side numerical aperture of projection optical system PL as described previously, and M a demagnification ratio (for example 5) of projection optical system.

In the case of use of the light-shielding type pupil filter as in the above embodiment, region B (B') must be perfectly shielded, but, because region C (C') does not affect the alignment mark image too much, it does not have to be perfectly shielded but may be partly shielded or reduced in passing light. In this case, the value of $r_2$ (or $\psi_2$) should be defined as follows for example in the above equations.

$0.4\times NA \leq r_2 \leq 0.4\times NA+\lambda/P$ $(0.4\times NAr \leq \psi_2 \leq 0.4\times NAr+\lambda/MP)$ Although the ratio 0.4 of the light-shielding portion LB in the above light-shielding type pupil filter PF1 relative to the pupil plane radius (NA) is not limited to it but may be an arbitrary value, it is found from simulation results that the ratio is most preferably determined in the range of about 0.3 to about 0.45. Below 0.3 the effect to increase DOF of contact hole image is not enough; above 0.45 there occurs a problem that subpeaks are formed on the light intensity distribution around the contact hole image.

Although the above embodiment used the light-shielding type pupil filter as a pupil filter, the present invention can be applied, of course, to the other pupil filters (phase difference type (Super FLEX type) filters, SFINCS type filters, etc.). However, because these pupil filters have a transparent portion inside the pupil filter PF1 (light-shielding portion LB) in FIG. 37, the formation of alignment mark image is strongly negatively affected by images formed by the illumination light and diffracted light Lc from point c in FIG. 37 as described previously (region C in FIG. 38). The reason is as follows. In the case of the phase difference type filters, because a phase difference of π is added to the left first-order diffracted light of the diffracted light Lc in FIG. 37, the alignment mark image is subjected to false resolution and brightness inversion. In the case of SFINCS type filters, because the left first-order diffracted light of the diffracted light Lc in FIG. 37 becomes likely to interfere with the zeroth-order light and the right first-order diffracted light, it does not contribute to formation of image, but becomes offset light to lower the image contrast.

Accordingly, in order to use the phase difference type pupil filters or SFINCS type pupil filters, all regions B, C (B', C') in FIG. 38 must be shielded.

For the phase difference type filters, it is found from simulation results that in the case of a type wherein the amplitude transmittance in the vicinity of the optical axis (at the center) is −1 and the amplitude transmittance is changed stepwise to +1 toward the periphery, a ratio of the radius of the amplitude transmittance change and the pupil plane radius is preferably in the range of about 0.2 to about 0.25.

Further, the present invention can also be applied similarly to a pupil filter that is a combination of various pupil filters of light-shielding type, the phase difference type, and the SFINCS type (for example, in such a manner that a center region near the center is shielded, and an annular region in the intermediate portion and an annular region in the peripheral portion are of a phase change), in which an appropriate region should be shielded according to the above method on and near circles in the imaging relation with the respective border portions, on the pupil plane in the illumination system.

Incidentally, although the mark pitch P of alignment mark to be transferred onto the wafer differs depending upon employed process, it is generally given on the wafer as $6 \leq P \leq 12$ [μm]. Thus, the width Δr of the annular portion of the light-shielding member 308 should be determined as follows as to the width Δψ defined by numerical aperture.

$$\lambda/12\ M \leq \Delta\psi \leq 2\times\lambda/6\ M$$

Or, including an adjustment margin in assembling adjustment of apparatus, the width of the shielding annular region may be increased about 10% from those given by the above equations.

It should be noted that the present invention permits combined use of the method for continuously changing the distance between the projection optical system and the wafer, more precisely the distance between the best focus plane of projected image and the wafer surface along the optical axis in the exposure operation, or the multi exposure method, such as the FLEX method, for performing exposure while positioning the wafer stepwise at two or three discrete positions along the optical axis. In that case, it is desirable that a relative movement range along the optical axis or steps be determined over $\lambda/NA^2$ (where λ is the exposure wavelength and NA the wafer-side numerical aperture of projection optical system). Most simply, it is preferable to utilize a Z stage for finely moving the wafer holder for holding the wafer along the optical axis. The Z stage originally functions as a drive unit for autofocusing mechanism to align the wafer surface with the best focus plane of projected image, which may be given an offset region according to $\lambda/NA^2$ in autofocusing.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 6-032224 (032224/1994) filed on Mar. 2, 1994; 6-084476 (084476/1994) filed on Apr. 22, 1994; 6-112431 (112431/1994) filed on May 26, 1994; and 6-132896 (132896/1994) filed on Jun. 15, 1994 are hereby incorporated by reference.

What is claimed is:

1. A projection exposure apparatus in which a pattern of a mask is projected on a substrate with an exposure light comprising:

a projection optical system arranged between said mask and said substrate and arranged to project an image of the pattern of said mask onto said substrate; and an optical correction plate arranged in said projection optical system and having a light shielding portion, which shields a part of said exposure light, wherein an optical path of at least part of an illumination light emerging from a mark placed on an object plane side or on an image plane side of said projection optical system and passing through said projection optical system is arranged to run avoiding said light shielding portion of said optical correction plate.

2. An apparatus according to claim 1, wherein said optical correction plate is placed substantially on a pupil plane of said projection optical system, and wherein said light shielding portion is a circular light-shielding member about an optical axis of said projection optical system.

3. An apparatus according to claim 2, wherein said mark has such a scale factor according to a diameter of said circular light-shielding member that said optical path of part is set outside said circular light-shielding member.

4. An apparatus according to claim 2, further comprising an illumination system for projecting said illumination light obliquely to said mark, whereby the illumination light emerging from said mark passes outside said circular light-shielding member, and a light-receiving system for receiving the illumination light passing said projection optical system.

5. An apparatus according to claim 4, wherein said illumination system comprises an optical system placed on the opposite side to said projection optical system with respect to said mark and making said mark be in a relation of Fourier transform with a predetermined plane, and an optical member for confining the illumination light passing said predetermined plane in an annular region or at least one local region decentered from an optical axis of said optical system.

6. An apparatus according to claim 2, further comprising a system for detecting a position of said mark in a predetermined measurement direction, said detecting system comprising an illumination system for irradiating said mark with said illumination light through outside said circular light-shielding member, whereby the illumination light emerging from said mark passes outside said circular light-shielding member, and a light-receiving system for receiving the illumination light emerging from said mark and then passing said projection optical system.

7. An apparatus according to claim 6, wherein said illumination system has an optical member for letting said illumination light enter said projection optical system, said illumination light being on a path passing outside said circular light-shielding member and with a distance between each point on the path of said illumination light and each point on the optical axis of said projection optical system having a component in a direction perpendicular to said measurement direction being larger than zero.

8. An apparatus according to claim 1, wherein said mark is a diffraction grating and a pitch thereof is determined approximately to be (1 to 1.4)×λ/NA, where λ is a wavelength of said illumination light and NA is a numerical aperture of said projection optical system.

9. An apparatus according to claim 1, further comprising:

a stage movable in a direction substantially perpendicular to an optical axis of said projection optical system while holding said substrate;

wherein said mark is provided on said mask, on said substrate, or on said stage;

said apparatus further comprising an illumination system for irradiating said mark with said illumination light and a light-receiving system for receiving the illumination light emerging from said mark and then passing said projection optical system.

10. An apparatus according to claim 9, wherein said illumination system comprises a light source for emitting illumination light having a wavelength band of approximately 10 to 200 nm.

11. A projection exposure apparatus in which a pattern of a mask is projected on a substrate with an exposure light comprising:

a projection optical system arranged between said mask and said substrate and arranged to project an image of the pattern of said mask onto said substrate;

an optical filter placed in said projection optical system and arranged to change optical characteristics of said exposure light every concentric circle regions or ring regions which have a center identical to an optical axis of said projection optical system, wherein said optical characteristics comprises at least one of an amplitude transmittance of said exposure light, a phase of transmitted light, and a coherence state of transmitted light; and a detection system arranged to let an illumination light emerge from a mark placed on an object plane side or on an image plane side of the projection optical system so that the illumination light passes in a region where said optical characteristics are substantially constant and passes a position apart from the optical axis of said projection optical system in a predetermined direction, on said optical filter, said detection system photoelectrically detecting the illumination light emerging from the mark and passing the projection optical system.

12. An apparatus according to claim 11, wherein said detection system comprises an illumination system for projecting said illumination light obliquely onto said mark, whereby the illumination light emerging from said mark passes said position, and a photoelectric detector for receiving the illumination light passing said projection optical system.

13. An apparatus according to claim 12, wherein said illumination system comprises an optical system placed on the opposite side to said projection optical system with respect to said mark and making said mark be in a relation of Fourier transform with a predetermined plane, and an optical member for confining the illumination light passing said predetermined plane in an annular region or at least one local region decentered from an optical axis of said optical system.

14. An apparatus according to claim 11, wherein said detection system comprises an illumination system for irradiating said mark with said illumination light through said position of said optical filter, whereby the illumination light emerging from said mark passes said position, and a photoelectric detector for receiving the illumination light passing said projection optical system.

15. An apparatus according to claim 14 wherein said mark is provided on said substrate and said detection system comprises an alignment sensor for detecting a position of the mark on said substrate in a direction perpendicular to said predetermined direction.

16. An apparatus according to claim 11, further comprising:

a stage movable in a direction substantially perpendicular to an optical axis of said projection optical system while holding said substrate;

wherein said mark is provided on said mask, on said substrate, or on said stage.

17. An apparatus according to claim 11, wherein said detection system comprises a light source for emitting illumination light having a wavelength band of approximately 10 to 200 nm.

18. A projection exposure apparatus in which a pattern of a mask is projected on a substrate with an exposure light comprising:

a projection optical system arranged between said mask and said substrate and arranged to project an image of the pattern of said mask onto the substrate;

an optical filter placed in the vicinity of a pupil plane in the projection optical system and having a light shielding portion for substantially interrupting said exposure light passing the vicinity of the optical axis of said projection optical system; and a detection system arranged to detect a mark arranged on at least one of said mask and said substrate through said projection optical system by using an illumination light having the substantially same wavelength as said exposure light, said detection system including a member for letting said illumination light pass through said projection optical system avoiding said light shielding portion.

19. An apparatus according to claim 18, wherein said optical filter is placed substantially on a pupil plane of said projection optical system and has a member for interrupting the exposure light distributed in a circular region about the optical axis of said projection optical system.

20. A projection exposure apparatus in which a pattern of a mask is projected on a substrate with an exposure light comprising:

an illumination system arranged between a light source which irradiates said exposure light and said mask and arranged to irradiate said mask with said exposure light;

a projection optical system arranged to receive light emerging from said pattern on the mask and projecting an image of the pattern onto the substrate;

a spatial filter placed on a plane in said projection optical system, being substantially an optical Fourier transform plane to said mask, for changing optical characteristics of said exposure light in a concentric and stepwise manner about an optical axis of said projection optical system, wherein said optical characteristics comprise at least one of a transmittance, a phase of transmitted light, and a coherence state of transmitted light; and a member placed on a plane in said illumination system, being substantially an optical Fourier transform plane to said mask and being substantially conjugate with said spatial filter, said member shielding a part of said exposure light with a region which has a predetermined width around a region corresponding to a border region of a stepwise change of said optical characteristics in said spatial filter.

21. A projection exposure apparatus according to claim 20, wherein said member has an annular portion for interrupting the exposure light distributed in said annular region, and wherein a width of said annular portion is set to satisfy substantially a relation of $\lambda/6\,M \leq \Delta\psi \leq \lambda/3\,M$, where $\lambda$ is a wavelength of said exposure light, M a magnification of said projection optical system, and $\Delta\psi$ a region of sine of an incident angle on said mask, corresponding to a width of said annular portion.

22. A projection exposure apparatus according to claim 20, wherein said member has an annular portion for interrupting the exposure light distributed in said annular region, and wherein a width of said annular portion is set to satisfy substantially a relation of $\lambda/PM \leq \Delta\psi \leq 2\lambda/PM$, where $\lambda$ is a wavelength of said exposure light, M a magnification of said projection optical system, Δψ a region of sine of an incident angle on said mask, corresponding to a width of said annular portion, and P a pitch of images of periodic structure patterns projected on said substrate.

23. A projection exposure apparatus according to claim 22, wherein said periodic structure patterns are an alignment mark of line-and-space patterns to be transferred onto said substrate, and wherein said patterns of the alignment mark are partially formed around a region of contact hole patterns formed as circuit elements on said mask.

24. A projection exposure apparatus according to claim 20, further comprising a changeover mechanism for enabling mounting or dismounting and exchange of said spatial filter and said member.

25. A projection exposure apparatus according to claim 20, wherein said spatial filter is a light-shielding type pupil filter for shielding a circular region inside a radius of 0.3 to 0.45 times an effective radius of a pupil plane corresponding to the Fourier transform plane in said projection optical system.

26. A projection exposure apparatus according to claim 20, wherein said spatial filter is a phase difference type pupil filter having a phase shift portion for shifting a phase of light passing a circular region inside a radius of 0.2 to 0.25 times an effective radius of a pupil plane corresponding to the Fourier transform plane in said projection optical system, by π (rad) with respect to a phase of light passing regions other than said circular region.

27. A projection exposure apparatus according to claim 20, further comprising a movable stage for making said substrate movable at least by $\lambda/NA^2$, where $\lambda$ is a wavelength of said illumination light and NA a substrate-side numerical aperture of said projection optical system in a continuous or stepwise manner in a direction of said optical axis of said projection optical system during a projection exposure operation on said substrate.

28. A method for producing circuit patterns on a photosensitive substrate by irradiating a mask for fabrication of circuit patterns in which discrete patterns and periodic patterns are mixed, with an illumination light beam from an illumination optical system to form images of said patterns through a projection optical system on the photosensitive substrate, comprising:

placing a spatial filter for stepwise changing an optical property or an intensity distribution in a radial direction, of said illumination light beam passing a pupil plan in said projection optical system, substantially on said pupil plane, and, in a state where said spatial filter is placed substantially on said pupil plane, performing such an adjustment that said illumination light beam passing a conjugate plane in said illumination optical system, substantially conjugate with said spatial filter, is distributed so as to become substantially minimum within a range corresponding to a border portion of a stepwise change on said spatial filter; and projecting said adjusted illumination light beam on said mask, whereby a resolution of said periodic patterns is improved while expanding a depth of focus as to be projected images of said discrete patterns.

29. A method according to claim 28, wherein in order to adjust a distribution of said illumination light beam, a light-shielding member for shielding only a region corresponding to the border portion of the stepwise change of said spatial filter is provided as capable of being mounted or dismounted on the conjugate plane in said illumination optical system.

30. A method according to claim 29, wherein said spatial filter is placed in a central portion of a circular pupil of said projection optical system and comprises a circular light-shielding portion having a radius of 0.3 to 0.45 times an effective radius of said pupil, and wherein said light-shielding portion has a shape to shield a region corresponding to a peripheral border portion thereof in a predetermined width and an annular form.

31. An exposure method for illuminating a pattern of a mask with exposure light and effecting an exposure of the pattern image of said mask on a substrate through a projection optical system, comprising:

a step of arranging an optical member in the vicinity of a pupil plane of said projection optical system, said optical member having a light shielding portion for interrupting a part of said exposure light; and a step of emitting or receiving a detection light with avoiding said light shielding portion so that the detection light contributing to the detection of said mask is prevented from being shielded by said light shielding portion, when a mark arranged on at least one of said mask and said substrate is detected through said projection optical system.

32. A method for projecting a pattern on a mask on a photosensitive substrate by using a projection optical system, said method comprising the steps of:

arranging an optical filter at a substantial pupil position of said projection optical system, said optical filter changing optical characteristics of said exposure light every concentric circle regions or ring regions which have a center identical to an optical axis of said projection optical system;

causing an illumination light to emerge from a mark placed on an object plane side or on an image plane side of the projection optical system to guide said illumination light to a region where said optical characteristics on said optical filter are substantially constant and apart from the optical axis of said projection optical system in a predetermined direction to cause said illumination light to pass through said optical filter; and detecting said illumination light passing through said projection optical system.

33. A method according to claim 32, further comprising the step of adjusting a position of at least one of said mask and said photosensitive substrate on the basis of said detected illumination light.

34. A method for making an exposure apparatus which exposes a pattern of a mask on a substrate, comprising:

providing an illumination optical system which irradiates said mask with an exposure light;

providing a projection optical system between said mask and said substrate, said projection optical system projecting an image of the pattern of said mask onto said substrate;

providing an optical filter with said projection optical system, said optical filter changing optical characteristics of said exposure light every concentric circle regions which have a center identical to an optical axis of said projection optical system, wherein said optical characteristics comprises at least one of an amplitude transmittance of said exposure light, a phase of transmitted light, and a coherence state transmitted light; and providing a detection system which lets an illumination light emerge from a mark placed on an object plane side or on an image plane side of the projection optical system so that the illumination light passes in a region where said optical characteristics are substantially constant and apart from the optical axis of said projection optical system in a predetermined direction, on said optical filter, said detection system photoelectrically detecting the illumination light emerging from the mark and passing through the projection optical system.

35. A method according to claim 34, wherein said mark is a diffraction grating and a pitch thereof is determined approximately to be (1 to 1.4)×$\lambda$/NA, where $\lambda$ is a wavelength of said exposure light and NA is a numerical aperture of said projection optical system.

* * * * *